US007119805B2

(12) United States Patent
Batori et al.

(10) Patent No.: US 7,119,805 B2
(45) Date of Patent: Oct. 10, 2006

(54) THREE-DIMENSIONAL CAD ATTRIBUTE INFORMATION PRESENTATION

(75) Inventors: Yoshiyuki Batori, Shizuoka (JP); Ryozo Yanagisawa, Shizuoka (JP); Kazuma Shimizu, Ibaraki (JP); Yoshikazu Sasago, Shizuoka (JP); Masanari Morioka, Shizuoka (JP); Hiroshi Takarada, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 834 days.

(21) Appl. No.: 10/077,315

(22) Filed: Feb. 14, 2002

(65) Prior Publication Data

US 2002/0118229 A1    Aug. 29, 2002

(30) Foreign Application Priority Data

| Feb. 20, 2001 | (JP) | ............................. 2001-044145 |
| Jun. 15, 2001 | (JP) | ............................. 2001-182344 |
| Jun. 15, 2001 | (JP) | ............................. 2001-182345 |
| Jun. 21, 2001 | (JP) | ............................. 2001-188134 |

(51) Int. Cl.
*G06T 15/00* (2006.01)
*G06T 15/10* (2006.01)
*G06T 15/20* (2006.01)
*G06F 3/00* (2006.01)
*G06F 9/00* (2006.01)
*G06F 17/00* (2006.01)

(52) U.S. Cl. .................. 345/419; 715/848; 345/427

(58) Field of Classification Search ........ 345/419–428, 345/620–628, 653–654, 664–665, 679–680
See application file for complete search history.

(56) References Cited

U.S. PATENT DOCUMENTS

| 4,991,224 A | * | 2/1991 | Takahashi et al. .......... 382/180 |
| 5,222,499 A | * | 6/1993 | Allen et al. ................. 600/426 |
| 5,701,403 A | * | 12/1997 | Watanabe et al. ........... 345/419 |
| 5,803,914 A | * | 9/1998 | Ryals et al. ................ 600/407 |
| 5,808,616 A | * | 9/1998 | Shimizu ..................... 345/419 |

(Continued)

FOREIGN PATENT DOCUMENTS

JP    A08-314985    11/1996

(Continued)

*Primary Examiner*—Ulka Chauhan
*Assistant Examiner*—Eric Woods
(74) *Attorney, Agent, or Firm*—Morgan & Finnegan, LLP

(57) ABSTRACT

The present invention relates to information processing apparatus and methods and, more particularly, to information processing apparatus and methods making use of a 3D model (3D shape) prepared by 3D-CAD. For adding attribute information (distances, angles, hole diameters, dimensional tolerances, etc.) to the 3D model, it becomes harder to recognize the shape of the 3D model and the attribute information on a display screen with increase in the added information. Thus each visual axis direction (attribute arrangement plane) is set for the 3D model prepared and attribute information is inputted so as to be opposed to the attribute arrangement plane thus set. When the set attribute arrangement plane is then specified, the opposed attribute information, together with the shape of the 3D model set, is displayed on the display screen. Names of attribute arrangement planes are arranged so as to avoid overlap thereof on the display screen, thereby suppressing deterioration of visibility. Each attribute arrangement plane has a frame and the attribute information is placed within the frame.

3 Claims, 50 Drawing Sheets

U.S. PATENT DOCUMENTS

| | | |
|---|---|---|
| 5,815,150 A | 9/1998 | Shimizu |
| 6,249,594 B1* | 6/2001 | Hibbard .................... 382/128 |
| 6,704,439 B1* | 3/2004 | Lee et al. .................. 382/131 |
| 6,754,374 B1* | 6/2004 | Miller et al. ................ 382/128 |
| 2001/0028697 A1* | 10/2001 | Nahaliel et al. ............. 378/19 |
| 2002/0118187 A1 | 8/2002 | Batori et al. |
| 2003/0210244 A1 | 11/2003 | Sasasgo et al. |
| 2005/0093860 A1 | 5/2005 | Yanagisawa et al. |

FOREIGN PATENT DOCUMENTS

JP    A11-143926    5/1999

\* cited by examiner

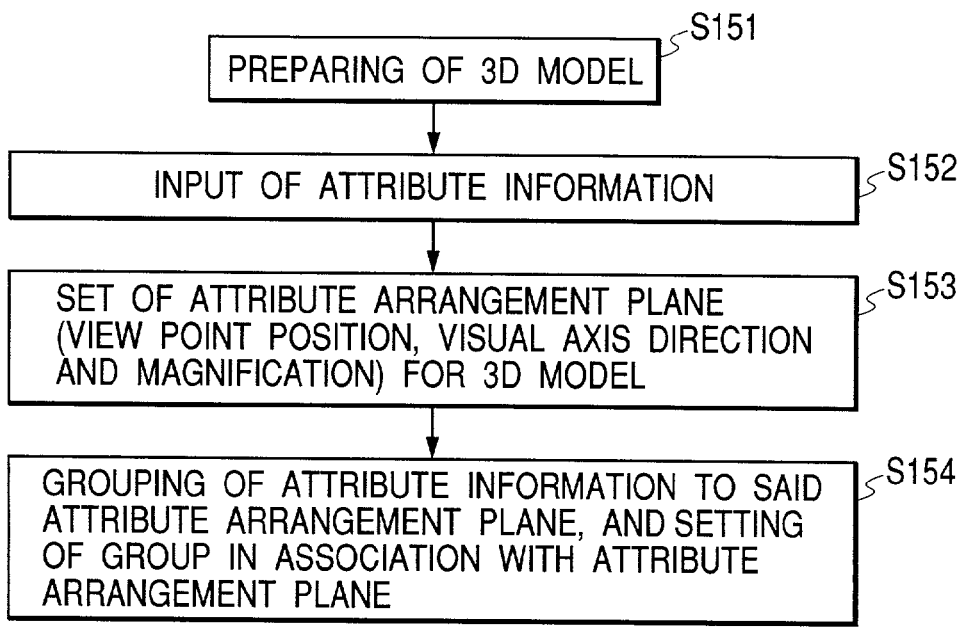
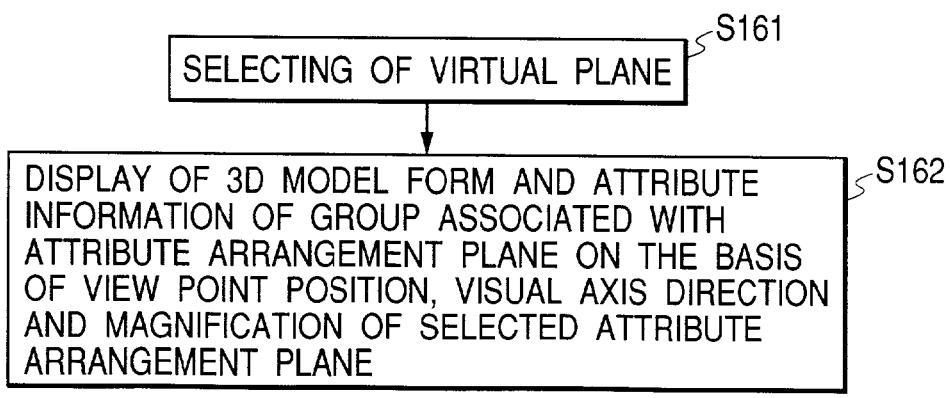

PLANE    FRONT    SIDE

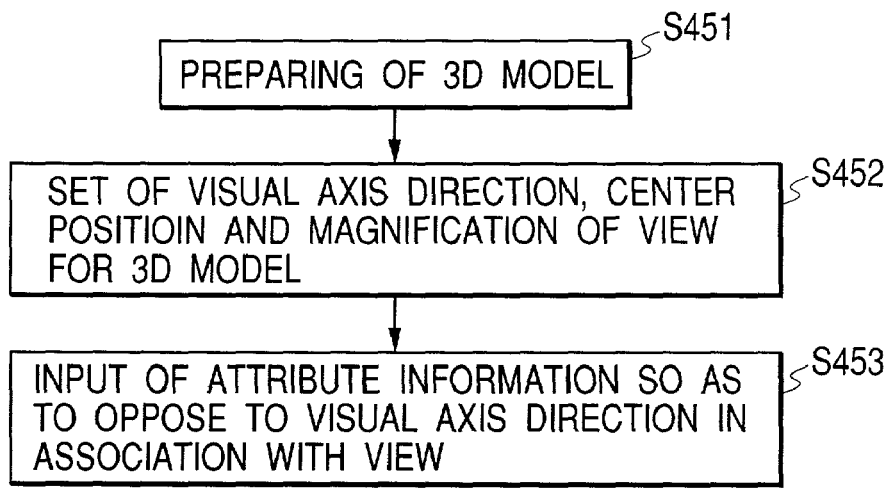
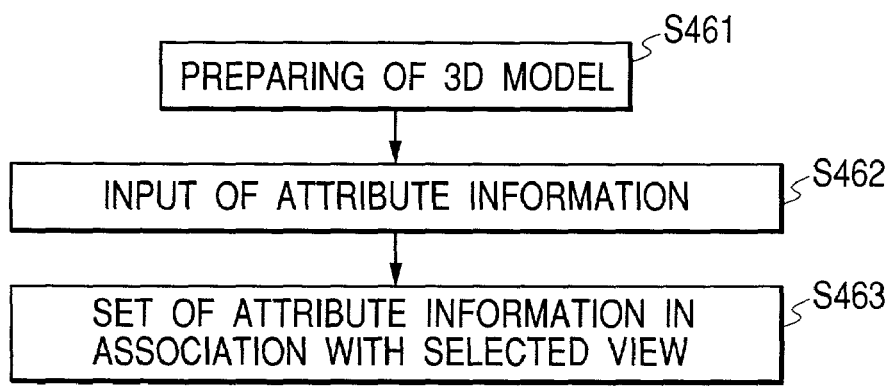
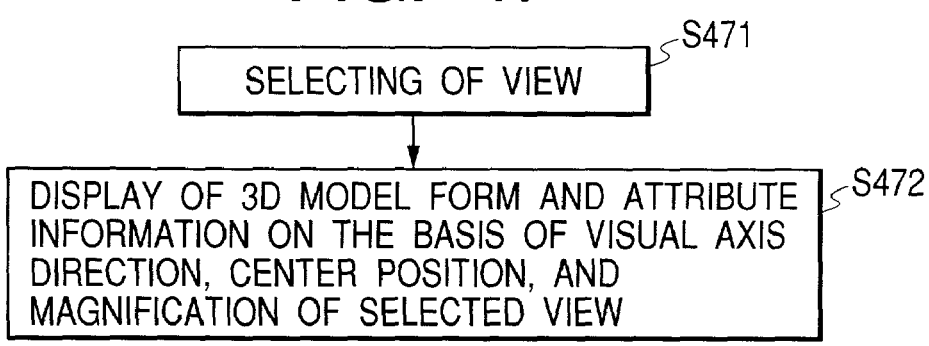

THREE-DIMENSIONAL CAD ATTRIBUTE INFORMATION PRESENTATION

BACKGROUND OF THE INVENTION

1. Field of the Invention

The present invention relates to information processing apparatus and methods and, more particularly, to information processing apparatus and methods making use of a 3D model (3D shape) prepared by use of 3D-CAD.

2. Related Background Art

Conventionally, articles of three-dimensional shape such as parts constituting goods and products or the like (hereinafter referred to simply as parts) have been designed heretofore using CAD apparatus (particularly, 3D-CAD apparatus).

Molds for producing the parts were prepared on the basis of the design.

For making use of the design information prepared by the CAD apparatus, attribute information of dimensions, dimensional tolerances, geometrical tolerances, notes, symbols, etc. was inputted into the 3D model (3D shape).

The attribute information is inputted into the 3D model by indicating and selecting each of surfaces, edges, center lines, vertexes, or the like of the 3D model. For example, in the case of the 3D model as shown in FIG. 24 (a front view, a plan view, and a side view of which are presented in FIG. 25), the attribute information is inputted, for example, as shown in FIG. 26. Here the attribute information includes:

(A) dimensions such as distances (lengths, widths, thicknesses, etc.), angles, hole diameters, radii, chamfering, etc.; and dimensional tolerances following the dimensions;

(B) geometrical tolerances and dimensional tolerances attached to surfaces, edges, etc. without input of dimensions;

(C) notes which are information to be informed of or instructed for machining or manufacturing of parts, units, or products;

(D) symbols preliminarily determined as rules, such as surface roughness or the like; and so on.

Methods of adding the attribute information to the 3D model are generally classified under two kinds below.

(1) For adding the dimensions, dimensional tolerances, geometrical tolerances, notes, and symbols,
   - it is necessary to use dimension lines and projection lines for writing the dimensions and dimensional tolerances, and
   - it is necessary to use leader lines for writing the geometrical tolerances, notes, and symbols.

(2) For adding the dimensional tolerances, geometrical tolerances, notes, and symbols without dimensions,
   - it is unnecessary to use the dimension lines and projection lines, and
   - it is necessary to use the leader lines for writing the dimensional tolerances, geometrical tolerances, notes, and symbols.

The molds heretofore were manufactured by making use of the 3D model. In this case, it was necessary to perform inspection to check whether a fabricated mold, and molded products made by the mold were obtained as designed.

The methods of adding the attribute information to the 3D model, as in the above conventional example, had the following problems.

In the case of (1) above, the dimensions and dimensional tolerances, and the dimension lines and projection lines for writing of those became complicated to make it hard to identify the shape and the attribute information of the 3D model.

If the model is of relatively simple shape, as shown in FIG. 24, and if the number of attribute information pieces is about several ten, the model can be identified somehow or other. However, if the model is of complicated shape or large shape, several hundred to several thousand attribute information pieces are added to the 3D model according to necessity and it will be extremely difficult to read the attribute information because of "overlapping of attribute information pieces with each other," "overlapping of the attribute information with the dimension lines, projection lines, or leader lines," "difficulties in identifying start positions of the dimension lines, projection lines, or leader lines," and so on (e.g., even the step shape at a corner of FIG. 26 is a little hard to identify).

In such cases as described above, it is hard for the operator himself or herself inputting the attribute information to identify the input information, and it becomes difficult for the operator to check the input contents, i.e., to input the attribute information itself.

It also becomes extremely hard to read associated attribute information. The attribute information becomes occupying a great space relative to the 3D model and it becomes impossible to view the shape of the 3D model and the attribute information simultaneously on a display screen of limited size.

Concerning the attribute information to be indicated on a so-called sectional view or the like (for example, the depth of a counterbore of 12±0.1 in FIG. 26), it is hard to view and identify its indicating place in the 3D model.

Concerning the attribute information to be indicated on a so-called sectional view or the like (for example, internal surface shapes of walls with structures on the both sides of FIG. 38), it is hard to view and identify its indicating place in the 3D model.

A fine, complicated, local shape of the 3D model is largely enlarged into a display state large enough to recognize the shape, and in this display state the dimensions and others are set in appropriate size. However, when the dimensions and others set in this way are wholly displayed at a low display magnification, they are displayed in a small display state, which poses a problem that it is necessary to search carefully for those dimensions in order to view them. In the worst case, there will arise a problem that incorrect machining or the like is done without noting the dimensions and others attached to the model. Further, on the occasion of viewing the fine, complicated, local shape and dimensions of the 3D model, the dimensions and others attached to the entire shape are displayed in an extremely large size, so as to cause a problem of difficulty in viewing.

In the case of (2) above, the dimension lines and projection lines do not have to be written, but the use of the leader lines makes the leader lines complicated and makes it hard to view the shape of the 3D model and the attribute information, as in the case of above (1). In the case of the complicated shape or the large shape, the number of attribute information pieces provided for the 3D model can be several hundred to several thousand according to necessity, and it becomes extremely hard to read the attribute information.

On the occasion of fabricating a mold and inspecting the complete mold, and molded products by the mold, for example, it becomes necessary to measure the dimensions and others. For that reason, the 3D model shape must be subjected to a measurement operation by a measurement function in order to read dimensional values.

In this case, it is necessary to indicate and select a portion becoming a reference of dimensions, for each portion of a surface, an edge, or the like to be read. Reading of dimensions of plural portions would require a number of operation times and a long operation of time. It is impossible to nullify the possibility of incorrect reading due to operation errors. Further, the operator is required to expend enormous efforts to read the dimensions of all the portions.

In the first place, the 3D model and the attribute information pieces are the information for machining and manufacturing of a part, a unit, or a product, and the information should be efficiently transmitted in a readily discernible manner and without misunderstanding from an inputting operator as a designing person to viewing operators as engineers for machining, manufacturing, inspection, and so on. The prior art described above failed to satisfy these and was apart from a form of industrially effective use.

It is, therefore, an object of the present invention to add the attribute information to 3D data prepared by the CAD apparatus or the like so as to enable efficient and secure transmission of information in a discernible form. Another object is to enhance operability on the occasion of adding the attribute information.

Still another object is to implement efficient utilization of the attribute information added.

Still another object of the present invention is to implement efficient production of a part by making use of data prepared by the CAD apparatus or the like.

Still another object is to implement efficient execution of an inspection step, using data prepared by the CAD apparatus or the like.

SUMMARY OF THE INVENTION

Accordingly, an object of the present invention is to provide an information processing apparatus comprising:

attribute input means for inputting attribute information for a 3D model;

attribute arrangement plane setting means for setting an attribute arrangement plane being a virtual plane with which the attribute information is associated;

storage means for storing the attribute information in association with the attribute arrangement plane;

frame setting means for setting a frame indicating existence of the attribute arrangement plane;

frame name setting means for placing a name of the attribute arrangement plane on the frame; and arranging means for, when there exist a plurality of the attribute arrangement planes on the occasion of displaying the attribute information on display means, arranging names of the attribute arrangement planes so as to avoid overlap of the names on the display means.

Another object of the present invention is to provide an information processing method comprising:

an attribute input step of inputting attribute information for a 3D model;

an attribute arrangement plane setting step of setting an attribute arrangement plane being a virtual plane with which the attribute information is associated;

a storage step of storing the attribute information in association with the attribute arrangement plane;

a frame setting step of setting a frame indicating existence of the attribute arrangement plane;

a frame name setting step of placing a name of the attribute arrangement plane on the frame; and an arranging step of, when there exist a plurality of the attribute arrangement planes on the occasion of displaying the attribute information on display means, arranging names of the attribute arrangement planes so as to avoid overlap of the names on the display means.

Another object of the present invention is to provide a computer executable program product comprising:

code for inputting attribute information for a 3D model;

code for setting an attribute arrangement plane being a virtual plane with which the attribute information is associated;

code for storing the attribute information in association with the attribute arrangement plane;

code for setting a frame indicating existence of the attribute arrangement plane;

code for placing a name of the attribute arrangement plane on the frame; and code for, when there exist a plurality of the attribute arrangement planes on the occasion of displaying the attribute information on display means, arranging names of the attribute arrangement planes so as to avoid overlap of the names on the display means.

Another object of the present invention is to provide an information processing apparatus comprising:

attribute input means for inputting attribute information for a 3D model;

attribute arrangement plane setting means for setting an attribute arrangement plane being a virtual plane with which the attribute information is associated;

storage means for storing the attribute information in association with the attribute arrangement plane; and first frame setting means for setting a first frame so as to surround a range of the attribute information associated with the attribute arrangement plane.

Another object of the present invention is to provide an information processing method comprising:

an attribute input step of inputting attribute information for a 3D model;

an attribute arrangement plane setting step of setting an attribute arrangement plane being a virtual plane with which the attribute information is associated;

a storage step of storing the attribute information in association with the attribute arrangement plane; and a first frame setting step of setting a first frame so as to surround a range of the attribute information associated with the attribute arrangement plane.

Another object of the present invention is to provide a computer executable program product comprising:

code for inputting attribute information for a 3D model;

code for setting an attribute arrangement plane being a virtual plane with which the attribute information is associated;

code for storing the attribute information in association with the attribute arrangement plane; and code for setting a first frame so as to surround a range of the attribute information associated with the attribute arrangement plane.

Another object of the present invention is to provide an information processing apparatus comprising:

visual axis setting means for defining an arbitrary visual axis direction and view point for a 3D model;

attribute input means for inputting attribute information corresponding to the visual axis direction set by the setting means;

storage means for storing the visual axis direction and the attribute information in association with each other;

specifying means for specifying the set visual axis direction;

display means for displaying the attribute information corresponding to the visual axis direction specified by the specifying means; and display control means for switching a display method of an arbitrary range.

Another object of the present invention is to provide an information processing apparatus comprising:

visual axis setting means for defining an arbitrary visual axis direction and view point for a 3D model;

attribute input means for inputting attribute information corresponding to the visual axis direction set by the setting means;

storage means for storing the visual axis direction and the attribute information in association with each other;

specifying means for specifying the set visual axis direction;

display means for displaying the attribute information corresponding to the visual axis direction specified by the specifying means; and cross section position display means for, when a position set by the visual axis setting means is located at a position indicating a cross section of the 3D model, explicitly showing the position.

Another object of the present invention is to provide an information processing apparatus comprising:

visual axis setting means for defining an arbitrary visual axis direction and view point for a 3D model;

attribute input means for inputting attribute information corresponding to the visual axis direction set by the setting means;

storage means for storing the visual axis direction and the attribute information in association with each other;

specifying means for specifying the set visual axis direction;

display means for displaying the attribute information corresponding to the visual axis direction specified by the specifying means; and visual axis display means for, when a position set by the visual axis setting means is located at a position indicating a cross section of the 3D model, explicitly showing the visual axis direction.

Another object of the present invention is to provide an information processing method comprising:

a three-dimensional data preparing step of preparing data of an article having a three-dimensional shape;

a visual axis setting step of defining an arbitrary visual axis direction and view point for a 3D model;

an attribute input step of inputting attribute information corresponding to the visual axis direction set in the setting step;

a storage step of storing the visual axis direction and the attribute information in association with each other;

an specifying step of specifying the set visual axis direction;

a display step of displaying the attribute information corresponding to the visual axis direction specified in the specifying step; and a display control step of switching a display method of an arbitrary range.

Another object of the present invention is to provide an information processing method comprising:

a visual axis setting step of defining an arbitrary visual axis direction and view point for a 3D model;

an attribute input step of inputting attribute information corresponding to the visual axis direction set in the setting step;

a storage step of storing the visual axis direction and the attribute information in association with each other;

a specifying step of specifying the set visual axis direction;

a display step of displaying the attribute information corresponding to the visual axis direction specified in the specifying step; and a cross section position display step of, when a position set in the visual axis setting step is located at a position indicating a cross section of the 3D model, explicitly showing the position.

Another object of the present invention is to provide an information processing method comprising:

a visual axis setting step of defining an arbitrary visual axis direction and view point for a 3D model;

an attribute input step of inputting attribute information corresponding to the visual axis direction set in the setting step;

a storage step of storing the visual axis direction and the attribute information in association with each other;

a specifying step of specifying the set visual axis direction;

a display step of displaying the attribute information corresponding to the visual axis direction specified in the specifying step; and a visual axis display step of, when a position set in the visual axis setting step is located at a position indicating a cross section of the 3D model, explicitly showing the visual axis direction.

Another object of the present invention is to provide a computer executable program product comprising:

code for preparing data of an article having a three-dimensional shape;

code for defining an arbitrary visual axis direction and view point for a 3D model;

code for inputting attribute information corresponding to the defined visual axis direction;

code for storing the visual axis direction and the attribute information in association with each other;

code for specifying the defined visual axis direction;

code for displaying the attribute information corresponding to the specified visual axis direction; and code for switching a display method of an arbitrary range.

Another object of the present invention is to provide a computer executable program product comprising:

code for defining an arbitrary visual axis direction and view point for a 3D model;

code for inputting attribute information corresponding to the defined visual axis direction;

code for storing the visual axis direction and the attribute information in association with each other;

code for specifying the defined visual axis direction;

code for displaying the attribute information corresponding to the specified visual axis direction; and code for, when a position defined in the code for defining the arbitrary visual axis direction and view point for the 3D model is located at a position indicating a cross section of the 3D model, explicitly showing the position.

Another object of the present invention is to provide a computer executable program product comprising:

code for defining an arbitrary visual axis direction and view point for a 3D model;

code for inputting attribute information corresponding to the defined visual axis direction;

code for storing the visual axis direction and the attribute information in association with each other;

code for specifying the defined visual axis direction;

code for displaying the attribute information corresponding to the specified visual axis direction; and code for, when a position defined in the code for defining the arbitrary visual axis direction and view point for the 3D model is located at a position indicating a cross section of the 3D model, explicitly showing the visual axis direction.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 15 is a flowchart showing a processing operation carried out when the attribute information is added to the 3D model;

FIG. 16 is a flowchart of processing carried out when the 3D model provided with the attribute information is displayed;

FIG. 45 is a flowchart showing a processing operation carried out when the attribute information is added to the 3D model;

FIG. 46 is a flowchart showing a processing operation carried out when the attribute information is added to the 3D model;

FIG. 47 is a flowchart showing a processing operation carried out when the attribute information is added to the 3D model;

DESCRIPTION OF THE PREFERRED EMBODIMENTS

An embodiment of the present invention will be described below in detail with reference to the drawings.

1. Overall Flow of Production of Mold for Molded Articles

Figure 1:
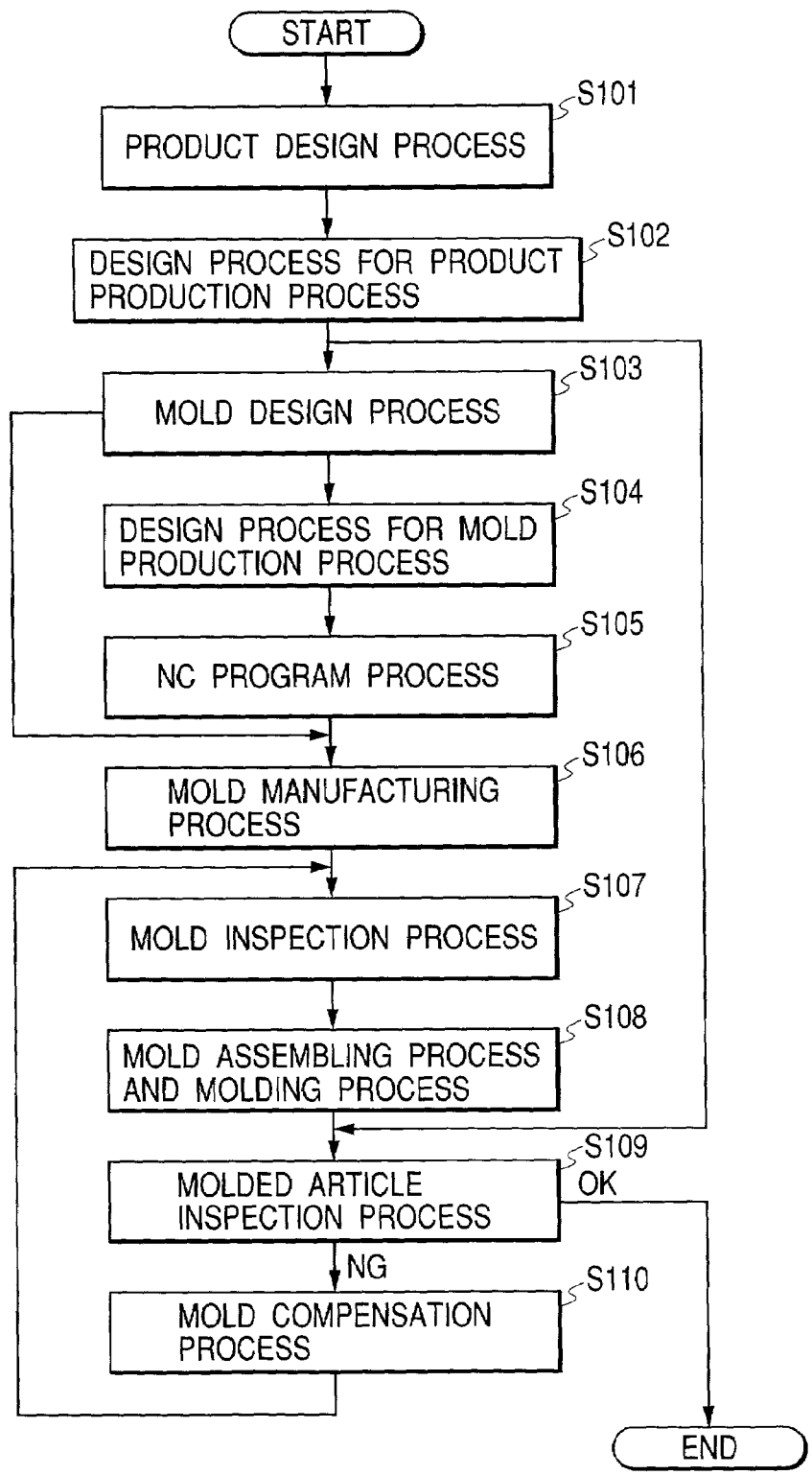
FIG. 1 is a chart showing the overall flow of production of a mold for molded parts.

FIG. 1 is a chart showing the overall flow of processes carried out in application of the present invention to production of a mold for molded articles.

In the drawing, step S101 is to design a product and prepare design drawings of individual parts. The design drawings of the parts include information necessary for production of the parts, constraint information, and so on. The design drawings of the parts are prepared by 2D-CAD or 3D-CAD and the drawings (3D drawings) prepared by 3D-CAD consist of the shape and the attribute information such as dimensional tolerances and the like. The dimensional tolerances can be associated with the shape (surfaces, edges, points), and the dimensional tolerances are utilized to specify instructions for inspection of molded products, instructions for precision of the mold, and so on.

Step S102 is to study producibility including assembly of the product, molding, etc. and prepare process drawings for the respective parts. The process drawings of the parts include detailed instructions for inspection, in addition to the information necessary for the production of the parts. The process drawings of the parts are prepared by 2D-CAD or 3D-CAD.

Here the detailed inspection instructions are, for example, as follows:

(1) numbering of measurement items (dimensions or dimensional tolerances), (2) instructions for measurement points and measuring methods for the measurement items, and so on.

The detailed inspection instruction information can be associated with the dimensional tolerances on the CAD.

Step S103 is to design the mold on the basis of the process drawings (process figures and mold specifications) of the parts prepared at step S102 and prepare mold drawings. The mold drawings include information necessary for the production of the mold, and constraints. The mold drawings are prepared by 2D-CAD or 3D-CAD, and the mold drawings prepared by 3D-CAD (3D drawings) consist of the shape and the attribute information such as the dimensional tolerances and others.

Step S104 is to study the mold production process on the basis of the mold drawings prepared at step S103, and prepare mold process drawings. A mold machining process consists of NC machining and generic machining. Instructions for preparation of an NC program are given to a process of carrying out the NC machining (automatic machining by numerical control). Instructions for execution of the generic machining are given to a process of carrying out the generic machining (machining by hand).

Step S105 is to prepare the NC program on the basis of the mold drawings.

Step S106 is to produce the mold parts by machine tools and others.

Step S107 is to inspect the mold parts thus produced, on the basis of the information prepared at step S103.

Step S108 is to assemble the mold parts and mold articles.

Step S109 is to inspect the thus molded articles on the basis of the information prepared at step S101 and at step S102, and to end the process if there is no problem.

Step S110 is to correct the mold at portions where the precision of molded articles is insufficient, on the basis of the result of the inspection at step S109.

2. Design of Product

The design of the product and the preparation of the design drawings of the individual parts will be described below. The design drawings of the parts are prepared by the 2D-CAD apparatus or 3D-CAD apparatus.

The design of the parts will be described below using an information processing apparatus shown in FIG. 2, e.g., a CAD apparatus.

Figure 2:
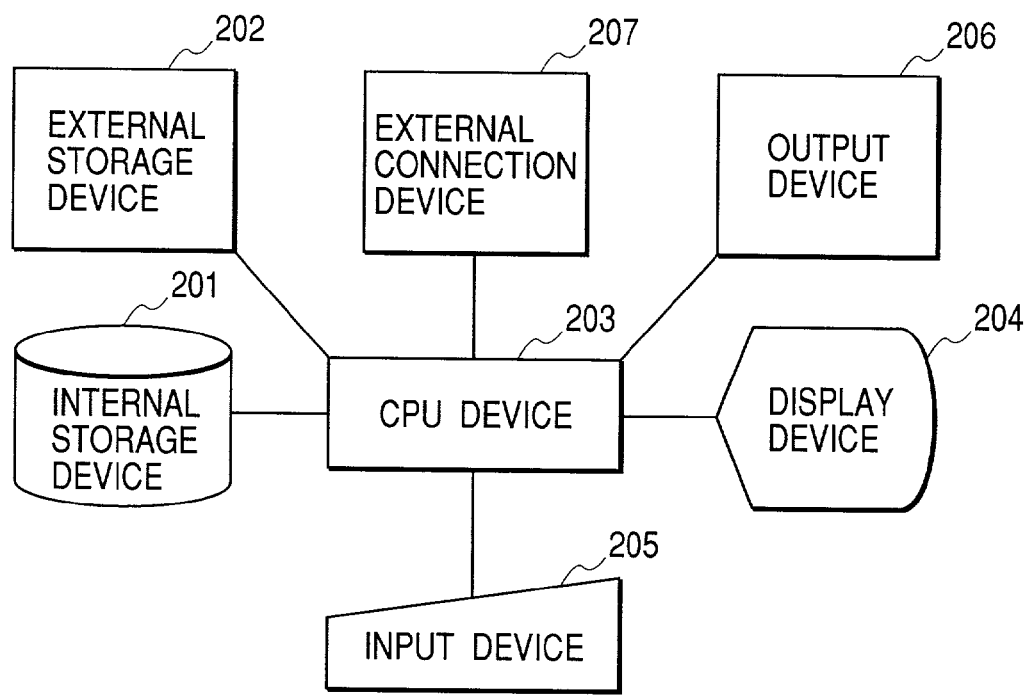
FIG. 2 is a block diagram of a CAD apparatus.

FIG. 2 is a block diagram of the CAD apparatus. In FIG. 2, numeral 201 designates an internal storage device and 202 an external storage device, each of which is comprised of a semiconductor storage device such as a RAM or the like, a magnetic storage device, or the like for storing the CAD data and CAD program.

Numeral 203 designates a CPU device, which executes processing along commands of the CAD program.

Numeral 204 denotes a display device, which displays the shape and others along commands from the CPU device 203.

Numeral 205 represents an input device such as a mouse, a keyboard, etc. for providing instructions and others to the CAD program.

Numeral 206 indicates an output device such as a printer or the like for outputting a paper drawing or the like along commands from the CPU device 203.

Numeral 207 stands for an external connection device, which connects the present CAD device with an external device, which supplies data from the present apparatus to an external device, and which controls the present apparatus from an external device.

Figure 3:
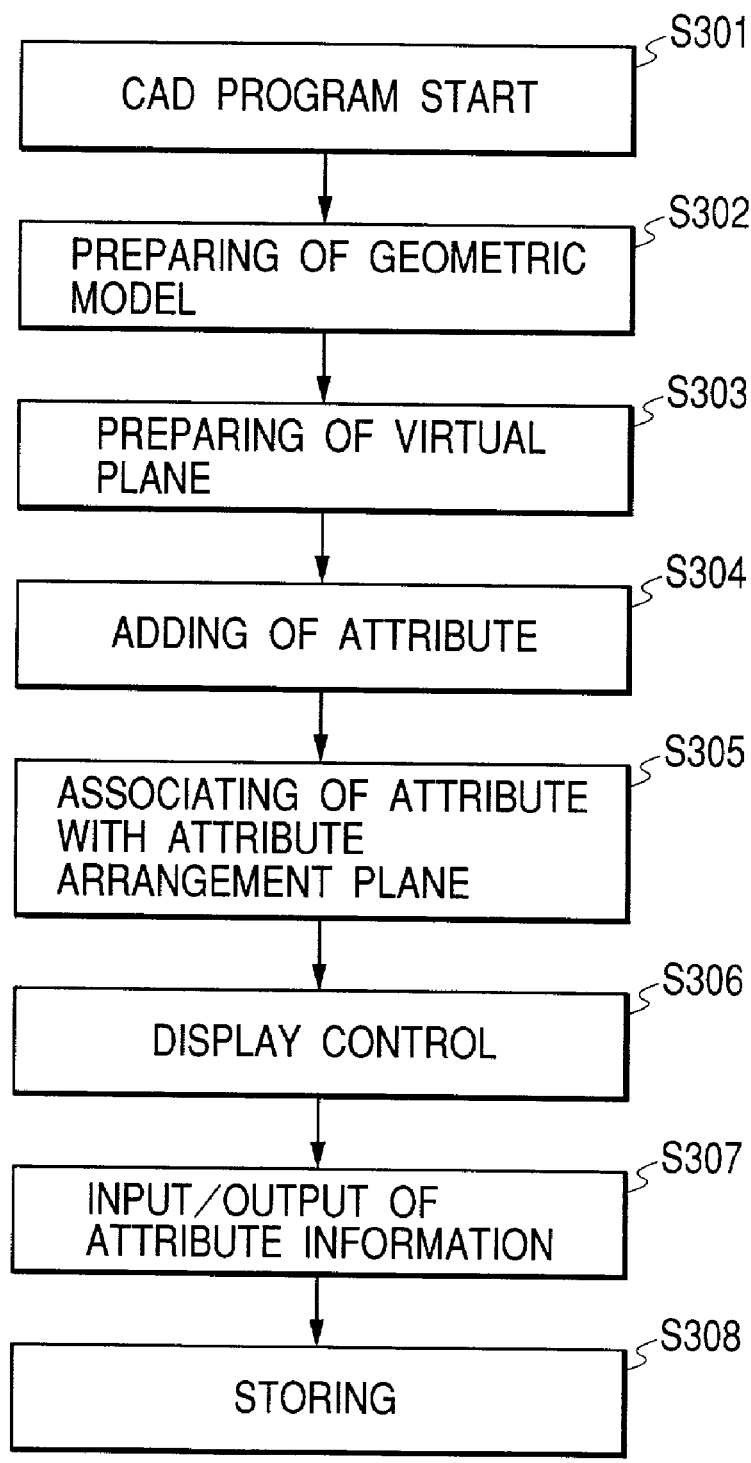
FIG. 3 is a flowchart showing a processing operation of the CAD apparatus shown in FIG. 2.

FIG. 3 is a flowchart showing a processing operation of the CAD apparatus shown in FIG. 2.

First, the operator gives an instruction for startup of the CAD program through the input device 205 whereupon the CAD program stored in the external storage device 202 is taken into the internal storage device 201 and executed on the CPU device 203 (step S301).

As the operator gives instructions in an interactive manner through the input device 205, a geometric model is generated on the internal storage device 201 and displayed as an image on the display device 204 (step S302). This geometric model will be described hereinafter. It is also possible for the operator to designate a file name through the input device 205 to take a geometric model having already been prepared on the external storage device 202, into the internal storage device 201 so as to handle it on the CAD program.

In the three-dimensional space in which the geometric model was prepared through the input device 205 by the operator, an attribute arrangement plane, which is a virtual plane for attribute information to be placed and associated therewith, is prepared (step S303).

In order to facilitate discrimination of the position of the attribute arrangement plane, the attribute arrangement plane is displayed in the form of image information of a frame (double boxes and solid filled frame interior) or the like on the display device. The information about the setting of the attribute arrangement plane is stored in association with the geometric model in the internal storage device 201.

It is desirable to give a name to the attribute arrangement plane thus prepared, as occasion may demand. The name given to the attribute arrangement plane can be displayed as a name label at a predetermined position on the frame of the attribute arrangement plane. Setting of the name label will be described later.

The operator adds the attribute information of dimensional tolerances and others to the geometric model through the input device 205 (step S304). The attribute information thus added can be displayed as image information of a label or the like on the display device. The added attribute information is stored in association with the geometric model in the internal storage device 201.

The operator associates the attribute information with the attribute arrangement plane through the input device 205 (step S305).

The information about the association between the attribute information and the attribute arrangement plane is stored in the internal storage device 201.

Another potential method is such that the operator preliminarily specifies an attribute arrangement plane and adds the attribute information while associating it with the attribute arrangement plane. The operator is also allowed to set or cancel the association of the attribute information with the attribute arrangement plane through the input device 205.

Then the operator specifies an attribute arrangement plane through the input device 205 to implement display control, either display or non-display of the attribute arrangement plane and the attribute information of dimensional tolerances and others associated with the attribute arrangement plane, or coloring and others (step S306).

When the operator prepares each attribute arrangement plane through the input device 205, the operator sets a position of a view point, a visual axis direction, and a magnification being display information concerning the attribute arrangement plane. Details of these will be described later. By setting this display information of the attribute arrangement plane and specifying this attribute arrangement plane, it becomes feasible to display the geometric model according to the position of the view point, the visual axis direction, and the magnification thus set, irrespective of a display state immediately before. Since this attribute arrangement plane and the attribute information are associated with each other, it is feasible to selectively display the attribute information associated with the attribute arrangement plane thus specified. The display information of the attribute arrangement plane is stored in the internal storage device 201.

With operator's instructions, the attribute information can be stored in the external storage device 202 or the like (step S307).

An identifier can be added to each attribute information and the attribute information, together with this identifier, can be stored in the external storage device 202. It is also possible to utilize this identifier so as to associate the attribute information with other data.

The attribute information can be updated by adding information to the attribute information on the external storage device 202 and taking the information into the internal storage device 201.

The operator adds the position information of attribute arrangement plane, the display information of attribute arrangement plane, and the attribute information to the geometric model through the input device 205 to obtain a CAD attribute model, and stores the CAD attribute model in the external storage device 202 (step S308).

Now the geometric model and the CAD attribute model will be described below.

Figure 4:
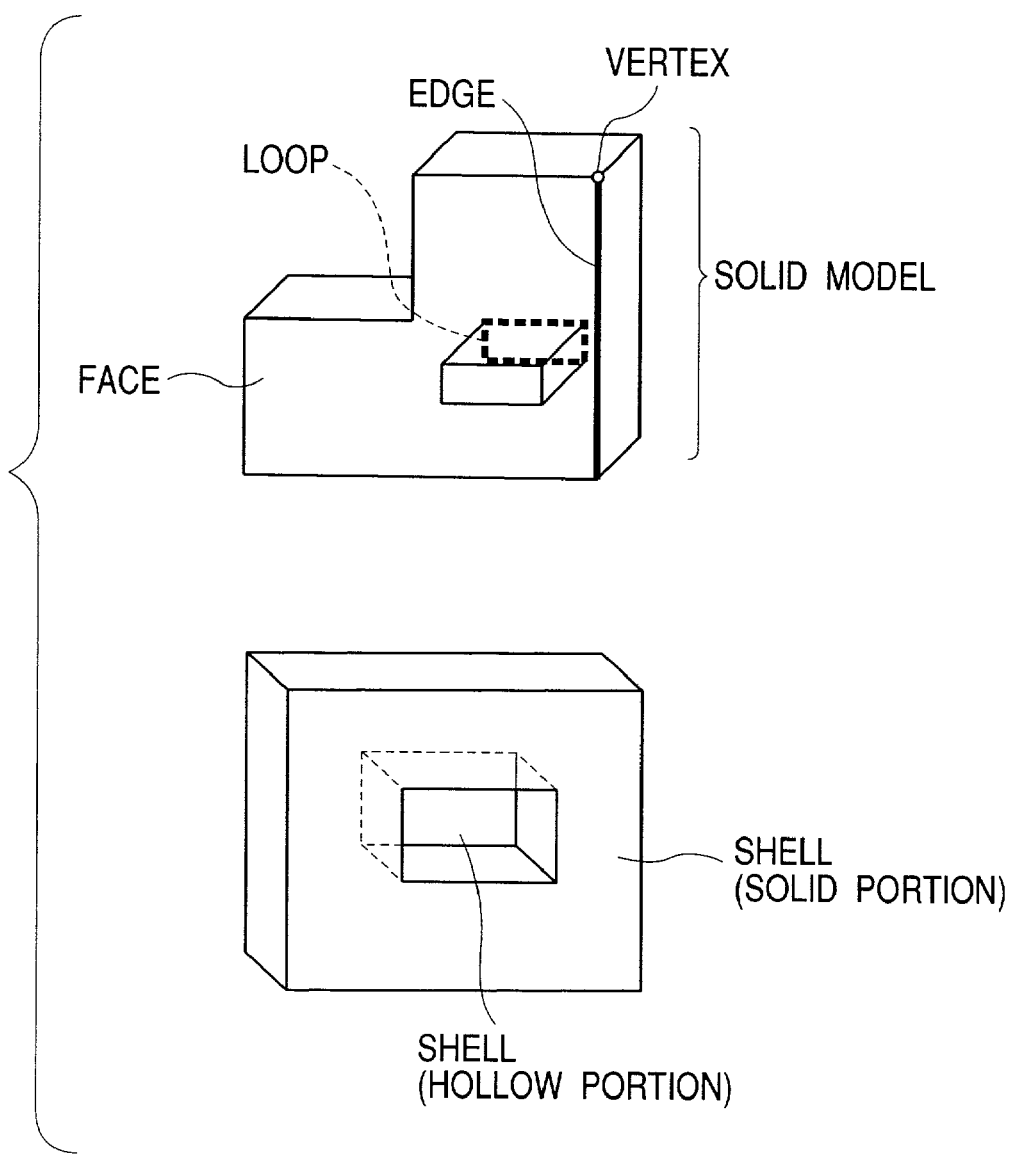
FIG. 4 is views showing an example of geometric model.
Figure 5:
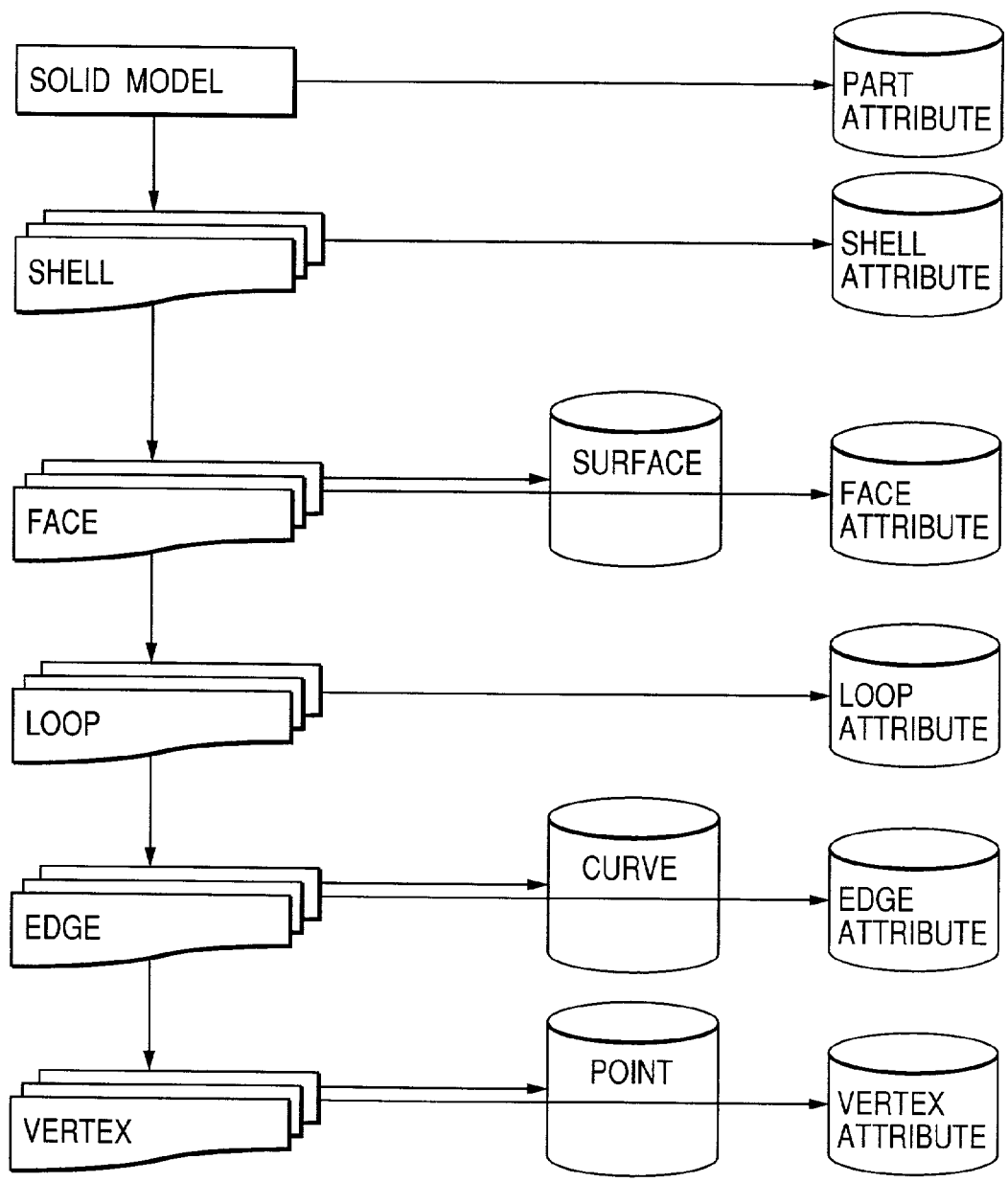
FIG. 5 is a conceptual diagram showing relations among portions constituting the geometric model.

FIG. 4 is drawing showing an example of the geometric model and FIG. 5 is a conceptual diagram showing relations among respective portions constituting the geometric model.

FIG. 4 shows Solid Model as a typical example of the geometric model. As illustrated, the Solid Model is a representation method of defining a shape of an article or the like on a three-dimensional space on CAD and is comprised of phase information (Topology) and geometric information (Geometry). The topology of Solid Model is stored in hierarchical structure on the internal storage device 201, as shown in FIG. 5, and consists of one or more Shells, one or more Faces per Shell, one or more Loops per Face, one or more Edges per Loop, and two Vertexes per Edge.

Surface information expressing the shape of each Face such as a plane, a cylindrical surface, or the like is stored in association with the Face on the internal storage device 201. Curve information expressing the shape of the Edge such as a straight line or an arc is stored in association with the Edge on the internal storage device 201. Coordinate values on the three-dimensional space are stored in association with each Vertex on the internal storage device 201.

Each topological element of Shell, Face, Loop, and Vertex is associated with corresponding attribute information to be stored on the internal storage device 201.

An example of a storage method on the internal storage device 201 will be described below using an example of Face information.

Figure 6:
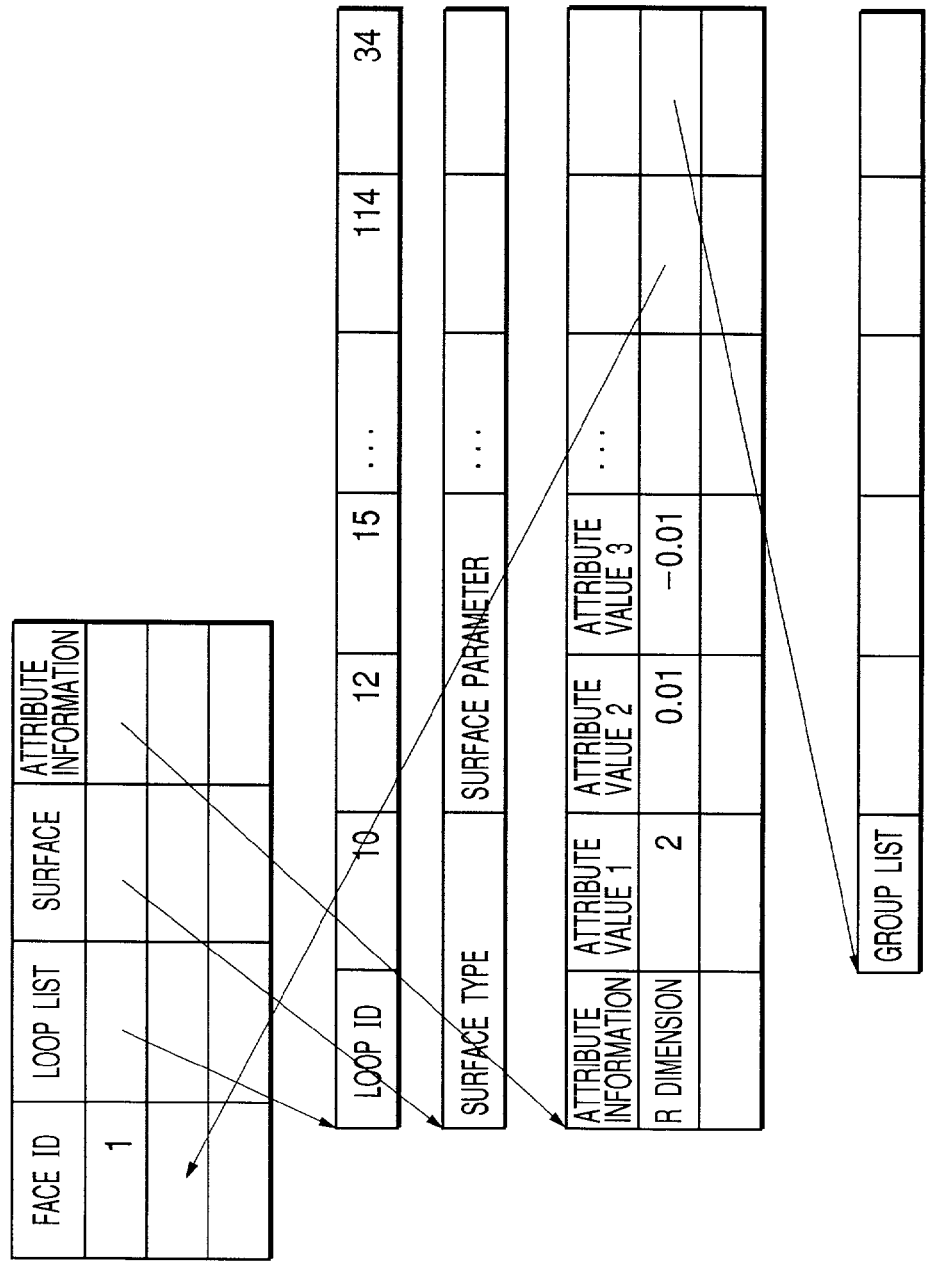
FIG. 6 is a conceptual diagram showing a storage method of Face information on an internal storage device 201.

FIG. 6 is a conceptual diagram showing the storage method of Face information on the internal storage device 201.

As illustrated, the Face information consists of Face ID, a pointer to Loop List constituting the Face, a pointer to Surface data indicating the shape of the Face, and a pointer to the attribute information.

The Loop List is a list in which IDs of all Loops constituting the Face are stored in a list form. The Surface information is comprised of Surface Type and Surface Parameter according to the Surface Type. The attribute information is comprised of attribute types and attribute values according to the attribute types. Some attribute values include a pointer to a Face, a pointer to an attribute arrangement plane to which the attribute belongs, and so on.

3. Input of Attribute Information into 3D model, and Display 1

Described next in detail are how to input the attribute information into the 3D model and prepare the attribute arrangement plane, and the display of the 3D model provided with the attribute information.

Figure 10A:
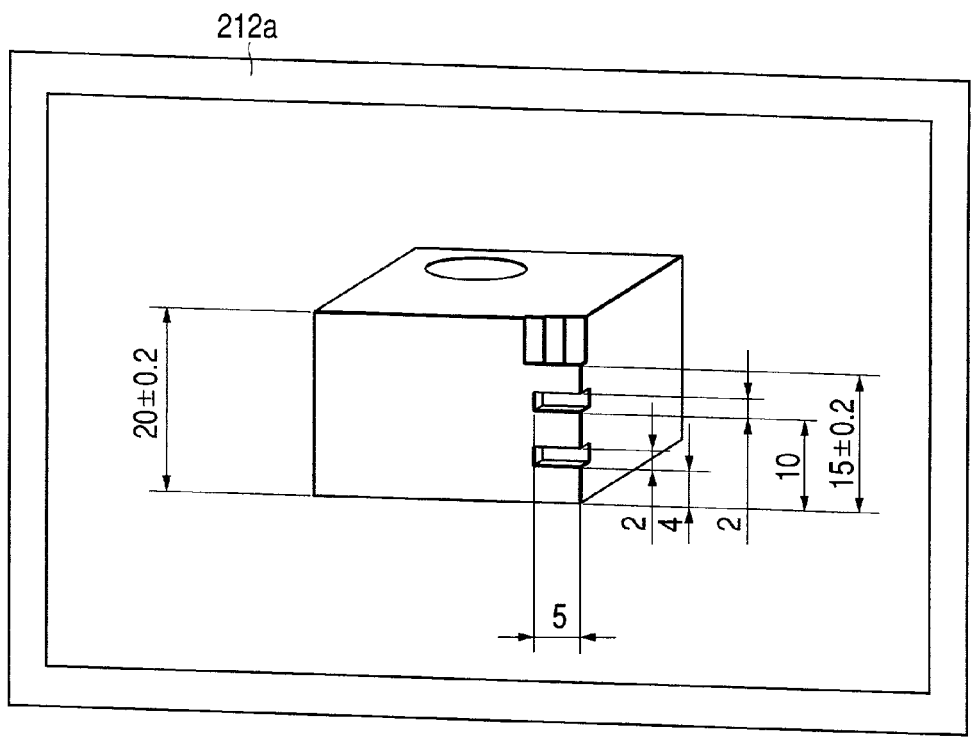
FIGS. 10A and 10B are drawings showing the 3D model and attribute information.
Figure 10B:
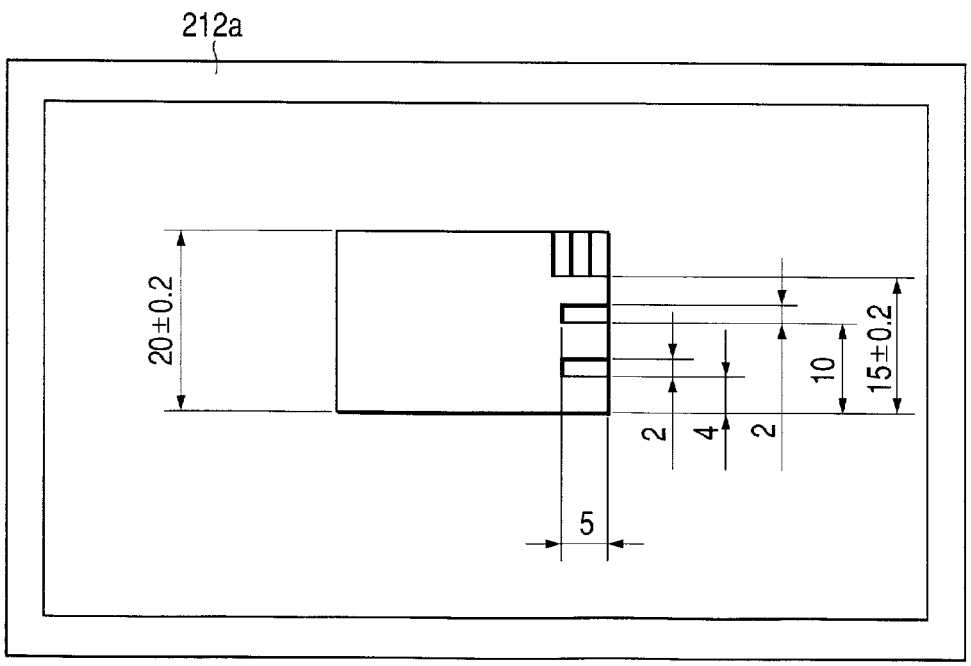
Figure 11A:
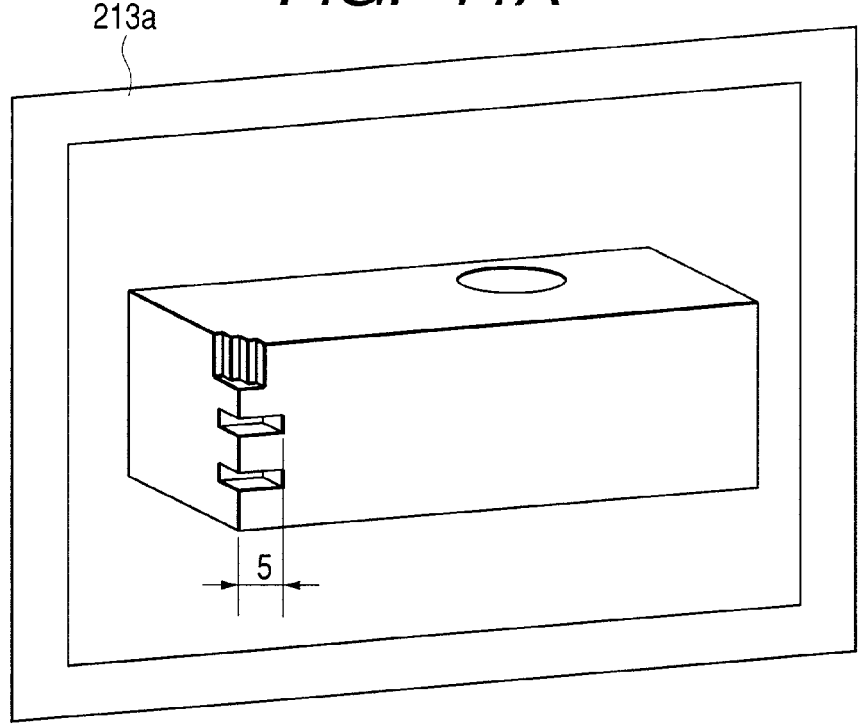
FIGS. 11A and 11B are drawings showing the 3D model and attribute information.
Figure 11B:
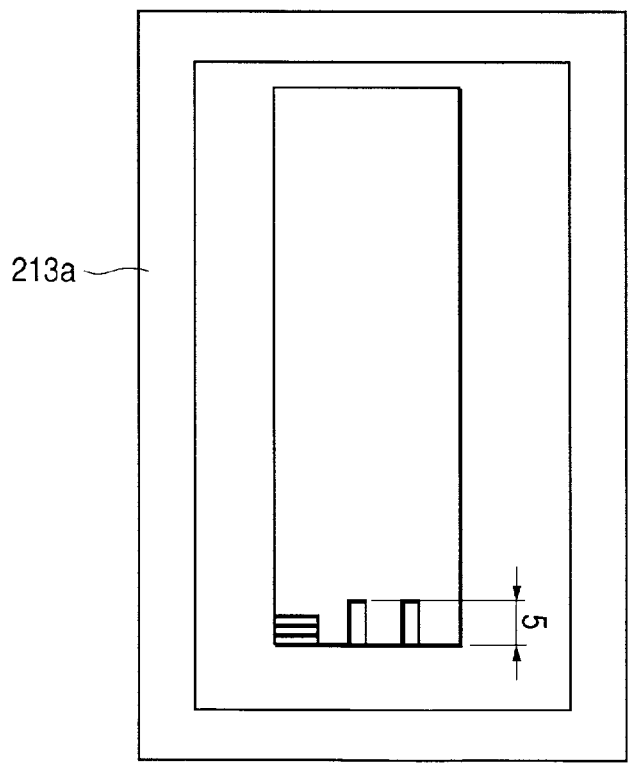
Figure 12:
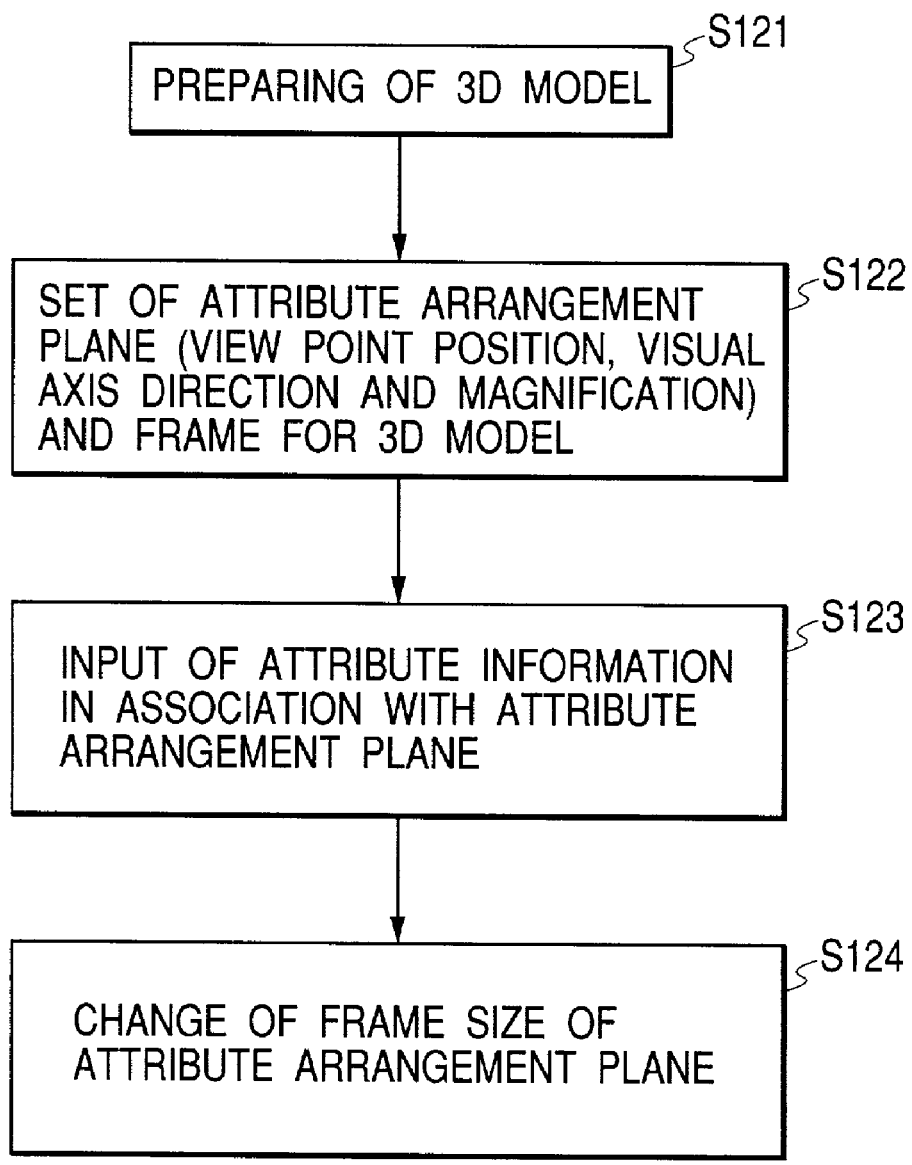
FIG. 12 is a flowchart showing a processing operation carried out when the attribute information is added to the 3D model.
Figure 13:
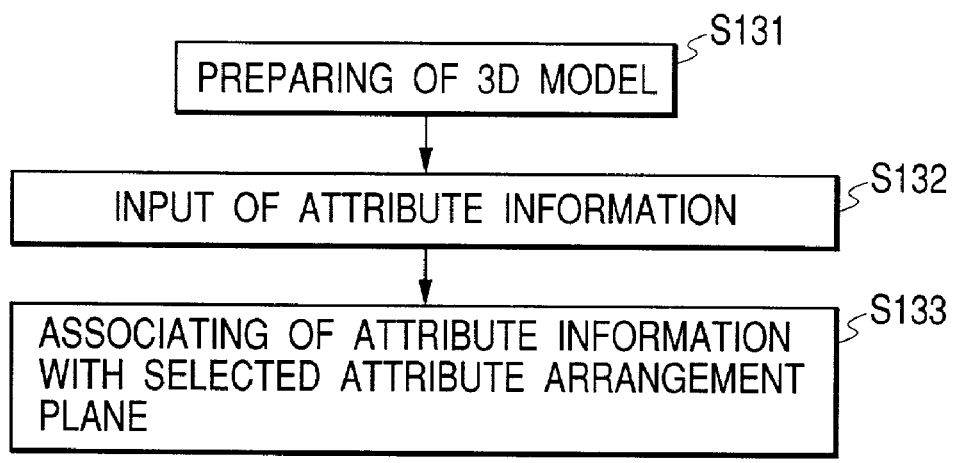
FIG. 13 is a flowchart showing a processing operation carried out when the attribute information is added to the 3D model.
Figure 14:
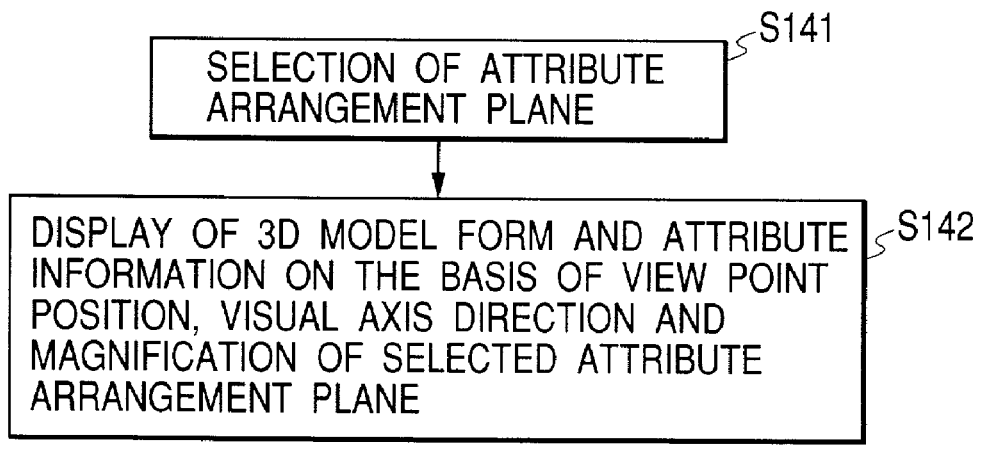
FIG. 14 is a flowchart showing a processing operation carried out when the attribute information is added to the 3D model.

FIGS. 7, 8, 9, 10A, 10B, 11A and 11B are drawings showing the 3D model, attribute information, and attribute arrangement planes, and FIGS. 12 to 14 flowcharts showing processing operations carried out when the attribute arrangement planes and attribute information are added to the 3D model.

Figure 7:
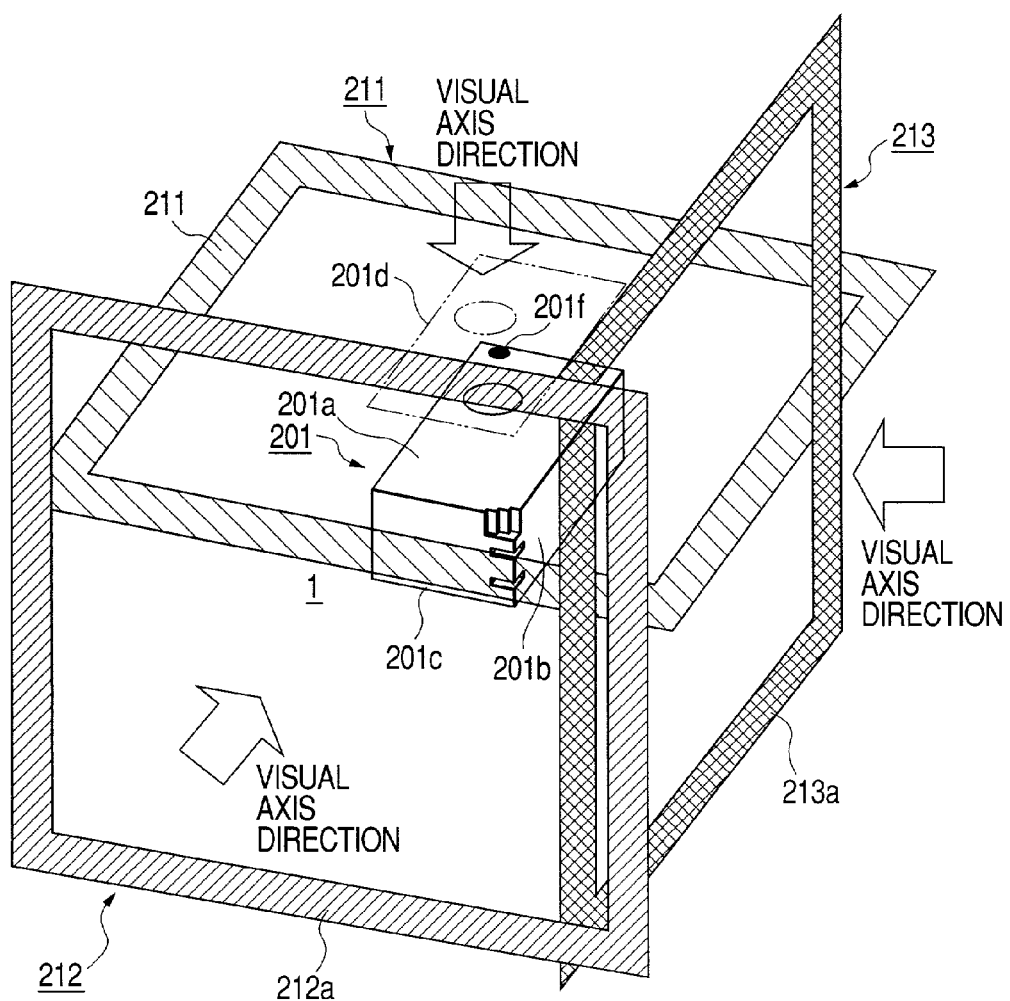
FIG. 7 is a drawing showing a 3D model and attribute arrangement planes.

At step S121 of FIG. 12, the 3D model 1 shown in FIG. 7 is prepared and every necessary attribute arrangement plane is set at step S122.

3.1 Attribute Arrangement Plane

Here each attribute arrangement plane is a plane specifying the requirements for the display of the 3D model 1, and the attribute information added to the 3D model 1.

In the present invention, an attribute arrangement plane is defined by a position of one point (which will be referred to hereinafter as a view point) on a (virtual) 3D space, and a normal direction to the generated plane (a visual axis direction) and is also assumed to include information on a display magnification (which will be referred to hereinafter simply as a magnification) of the 3D model 1, and the attribute information added to the 3D model 1.

Here the position of the view point defines a position from which the 3D model 1 can be viewed in the visual axis direction, i.e., a displayed position of the model. For example, the attribute arrangement plane 212 is set at the position 60 mm apart from the contour of a front surface 201 on the front view of the 3D model 1. (FIG. 7)

However, as to projection drawings by the so-called third angle projection method (front view, top view, left and right side views, bottom view, and back view), the display contents are not affected by where the view point is located, as long as the view point is located outside the 3D model 1.

The view point position is a point agreeing with a center of display of the display device 204 to display the 3D model 1, and the attribute information added to the 3D model 1, regardless of a display state immediately before.

Next, a normal direction of each attribute arrangement plane is matched with a visual axis direction in the display of the 3D model 1, and the attribute information added to the 3D model 1, from the view point position.

The magnification is a magnification rate to enlarge the display of the 3D model shape on the (virtual) 3D space on the display device 204.

The position of the view point, the visual axis direction, and the magnification, which are parameters of the attribute arrangement plane, can be changed at any time.

Figure 25:
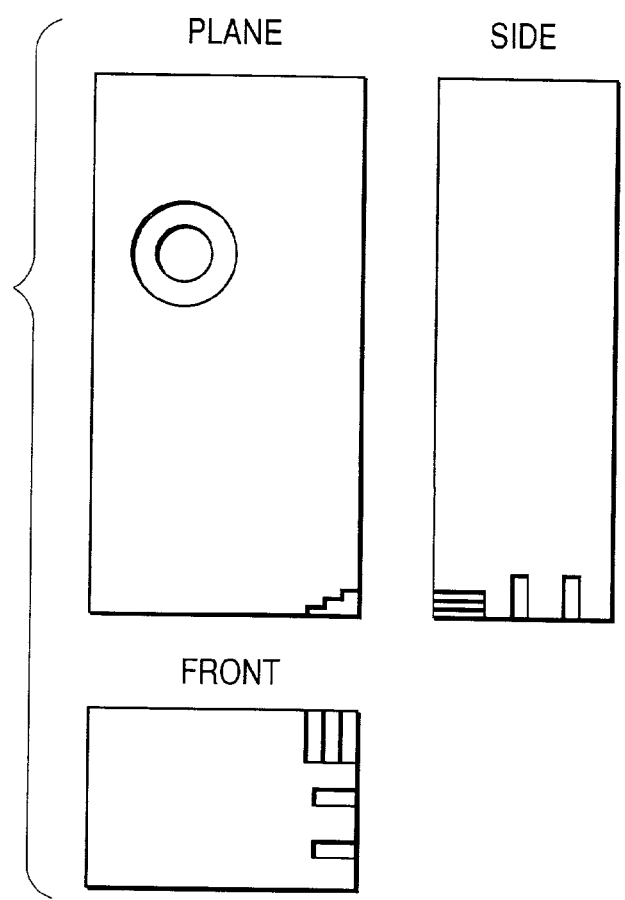
FIG. 25 is a front view, a plan view, and a side view of the 3D model shown in FIG. 24.
Figure 26:
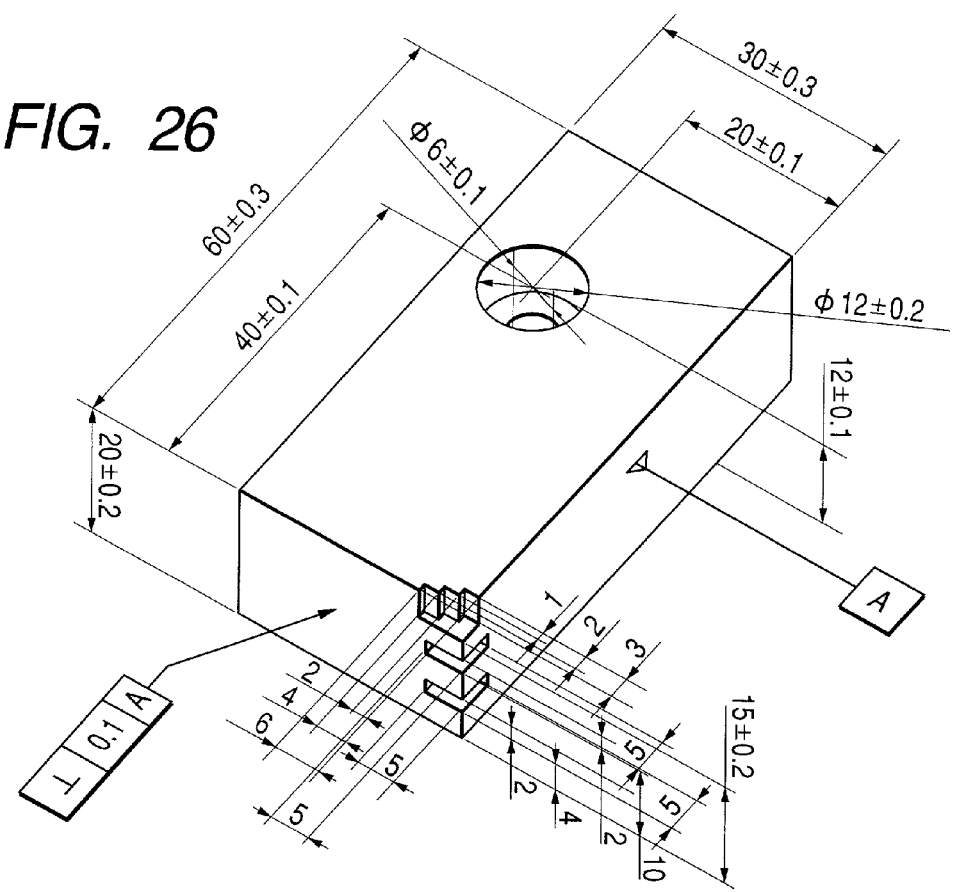
FIG. 26 is a drawing of a state in which the attribute information is added to the 3D model shown in FIG. 24.

For example, in FIG. 7, the attribute arrangement plane 211 is defined so that the visual axis direction matches with a direction perpendicular to a surface 201a on the plan view shown in FIG. 25 and is directed from the exterior to the interior of the 3D model. The view point position and magnification are preliminarily determined so that almost all of the shape of the 3D model 1 and the added attribute information can be displayed on the display screen of the display device 204. For example, in the present embodiment the magnification is set at 1× and the view point position 201f is set at almost the center of the surface 201a on the plan view (in FIG. 7 a chain double-dashed line 201d indicates a state in which approximate border lines of the plan view are projected onto the attribute arrangement plane 211). Likewise, the attribute arrangement plane 212 and the attribute arrangement plane 213 are also set to the visual axis direction perpendicular to the surface 201c on the front view and to the visual axis direction perpendicular to the surface 201b on the side view, respectively.

For clearly showing the position of each attribute arrangement plane, the attribute arrangement plane is represented by rectangular double boxes (frame) enclosing the plane. The means for clearly showing the position of the attribute arrangement plane was the representation using the frame in the present embodiment, but, without having to be limited to this, the shape may be any polygon other than rectangles, or a circle. (The positional relations of the attribute arrangement planes are such that the attribute arrangement plane 211 is parallel to the top surface 201a of the 3D model 1, the attribute arrangement plane 212 is parallel to the front surface 201b of the 3D model 1, and the attribute arrangement plane 213 is parallel to the side surface 201c of the 3D model 1.) As described previously, it is possible to set and display a name label indicating a name of an attribute arrangement plane, for a frame of each attribute arrangement plane. An example of a setting, changing, and displaying method of the name label will be described below.

Figure 33:
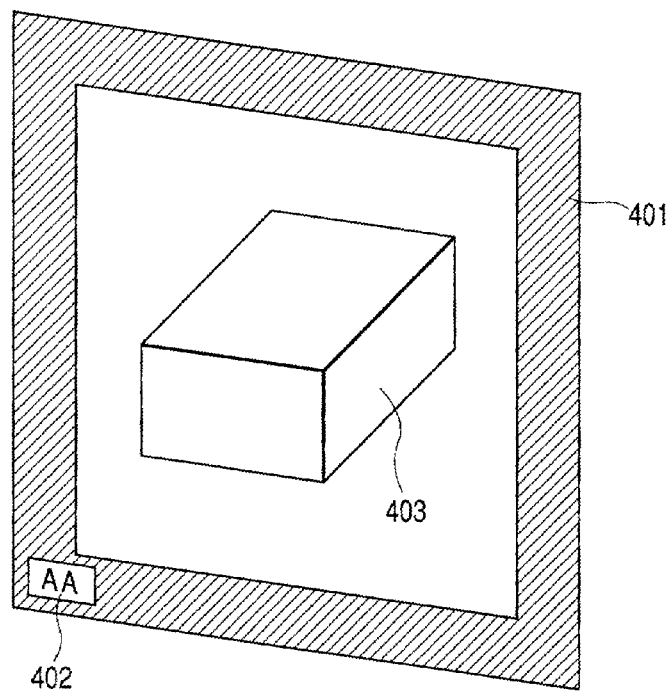
FIG. 33 is an explanatory diagram showing a state in which a name label is displayed in a frame set on an attribute arrangement plane.

FIG. 33 is an explanatory drawing showing a state in which a name label is displayed on a frame set for an attribute arrangement plane. The name label 402 indicating a name of the frame 401 is set and displayed on the frame 401 of the attribute arrangement plane. Numeral 403 designates a 3D model. Although the name label 402 is displayed at the preset position on the attribute arrangement plane, the display position, and settings of size, color, font, etc. of the display of the name label can be freely changed. When the display position is preliminarily determined, it becomes feasible to attain the effect of permitting the operator to visually perceive a coordinate system in which the attribute arrangement plane is placed, from the display position of the display label.

The nomenclature of name labels can be a front view, a plan view, etc., similar to the projection drawings by the so-called third angle projection method, or simply symbols of A, B, C, etc., but it is more preferable to determine the nomenclature of name labels for respective types of projection drawings, sectional views, partial detail drawings, and so on by the so-called third angle projection method.

If a sectional view, a partial detail drawing, or the like is automatically named according to the predetermined nomenclature on the occasion of preparation of each attribute arrangement plane, there will occur no trouble such as redundancy of names, which will further decrease the load on the operator.

Figure 8:
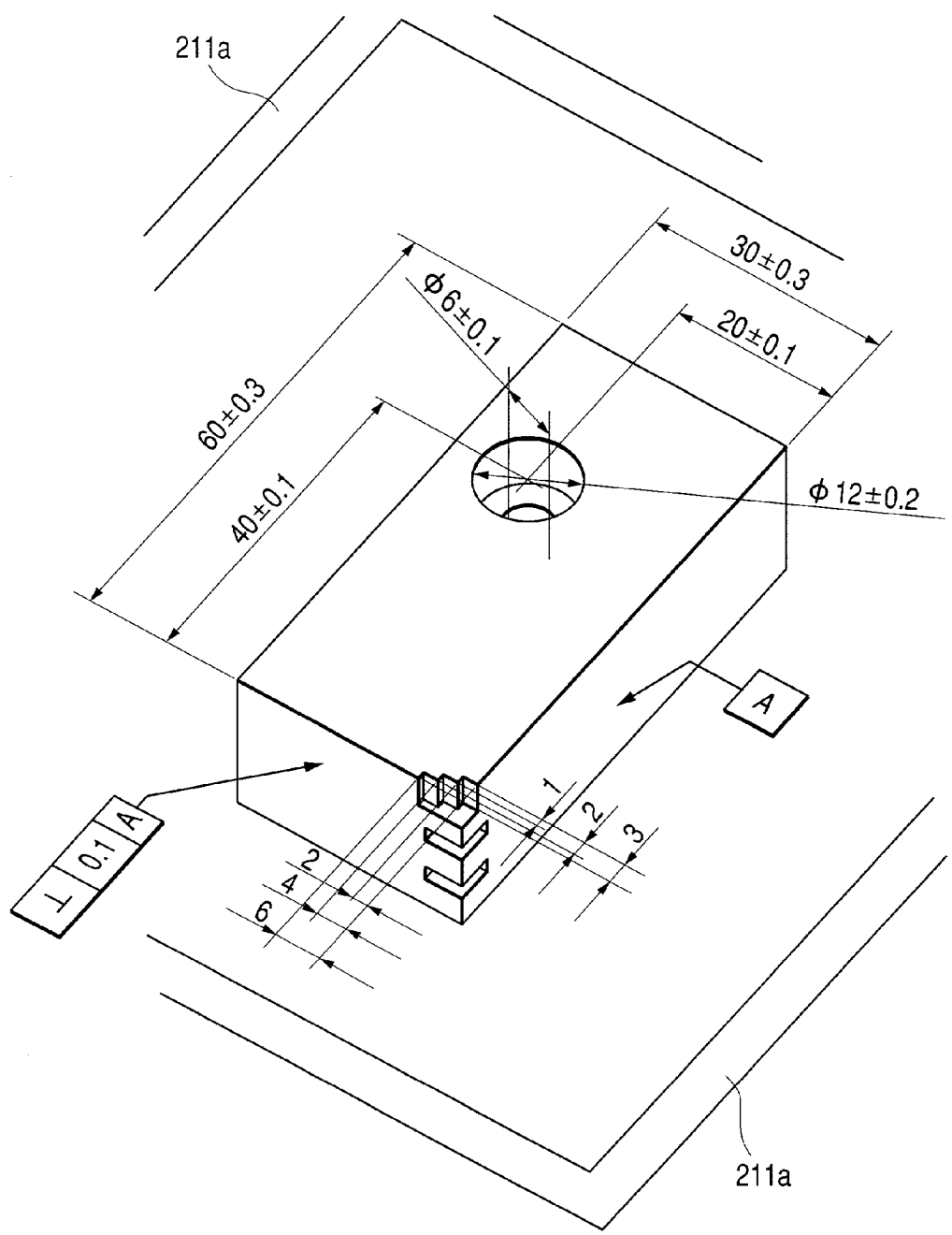
FIG. 8 is a drawing showing the 3D model and attribute information.
Figure 9:
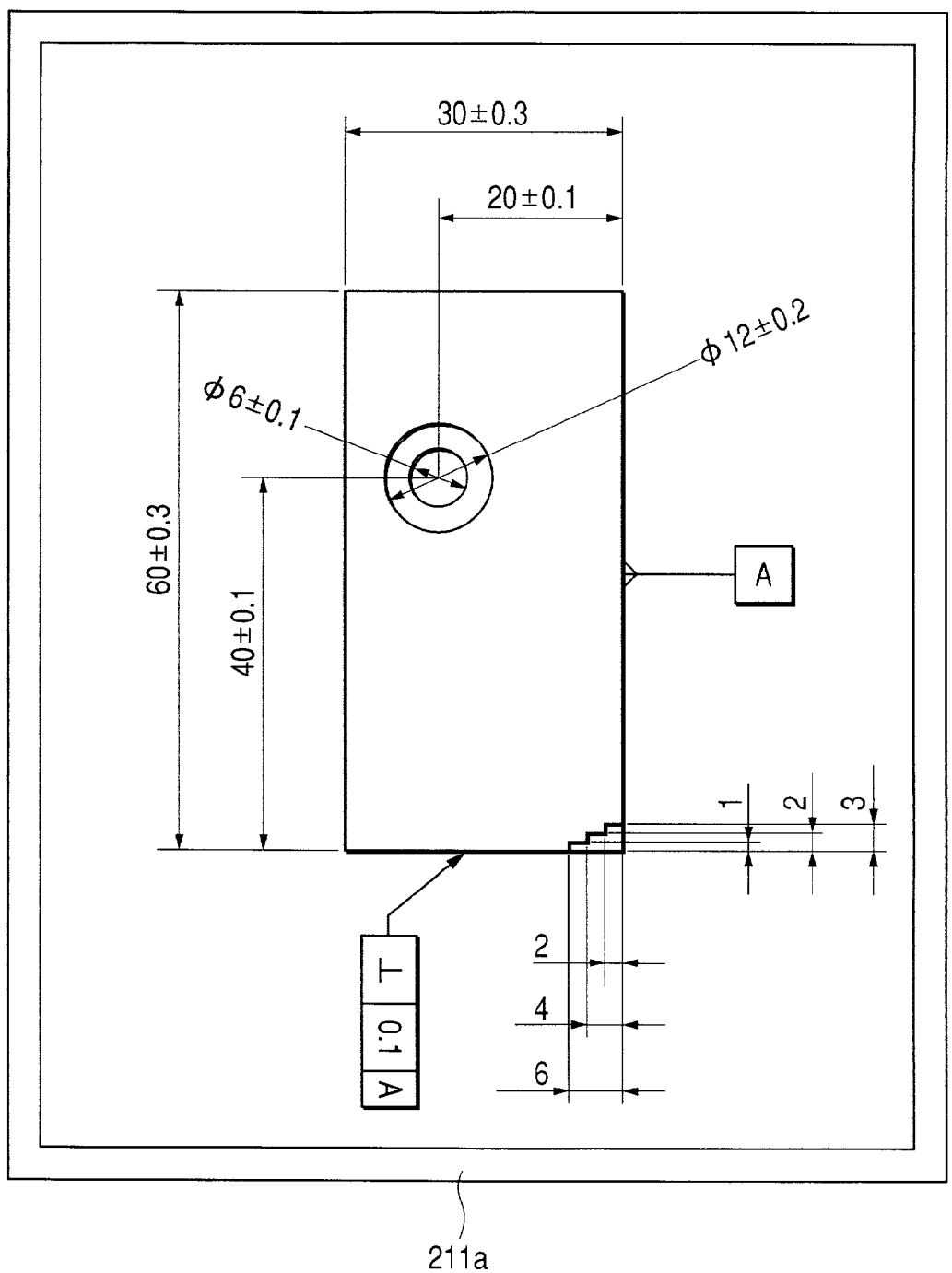
FIG. 9 is a drawing showing the 3D model and attribute information.

Next, at step S123 the attribute information is inputted in association with each of the attribute arrangement planes thus set. At this time, the attribute information is placed in an opposed manner on each attribute arrangement plane. FIG. 8, FIG. 10A, and FIG. 11A are drawings showing states in which the attribute information is added to the 3D model in association with the respective attribute arrangement planes 211, 212, and 213. FIG. 9, FIG. 10B, and FIG. 11B show the 3D model 1 and the attribute information displayed according to the view point position, the visual axis direction, and the magnification of the respective attribute arrangement planes 211, 212, and 213.

The size (the height of letters and symbols) of the attribute information associated with each attribute arrangement plane is changed according to the magnification of the attribute arrangement plane. The size (mm) of the attribute information is defined as a size in the virtual 3D space in which the 3D model exists (which is not the size in the display on the display device 204).

The association between each attribute arrangement plane and attribute information may be done after the input of the attribute information. For example, as in the flowchart shown in FIG. 13, the 3D model is first prepared (step S131), then the attribute is inputted at step S132, and thereafter the attribute information is associated with a desired attribute arrangement plane at step S133. The attribute information associated with each attribute arrangement plane is subjected to correction such as addition, deletion, or the like as occasion may demand.

When the attribute information is associated with another attribute arrangement plane, the size of the attribute information is changed according to the magnification of the attribute arrangement plane after the change of association.

The attribute information may be inputted in a two-dimensional display state of the 3D model 1 on a view from the visual axis direction defined on each attribute arrangement plane. The input can be implemented in the same manner as the process of preparing a two-dimensional drawing by the so-called 2D-CAD. The attribute information may be inputted on the three-dimensional display as occasion may demand. The input can be implemented more efficiently and without errors in that case, because the operator can input the attribute information while viewing the 3D model 1 on the three-dimensional display.

3.2 Frame

Here will be described the frame setting means for setting the frame so as to surround the arrangement range of the attribute information associated with the attribute arrangement plane.

Figure 39:
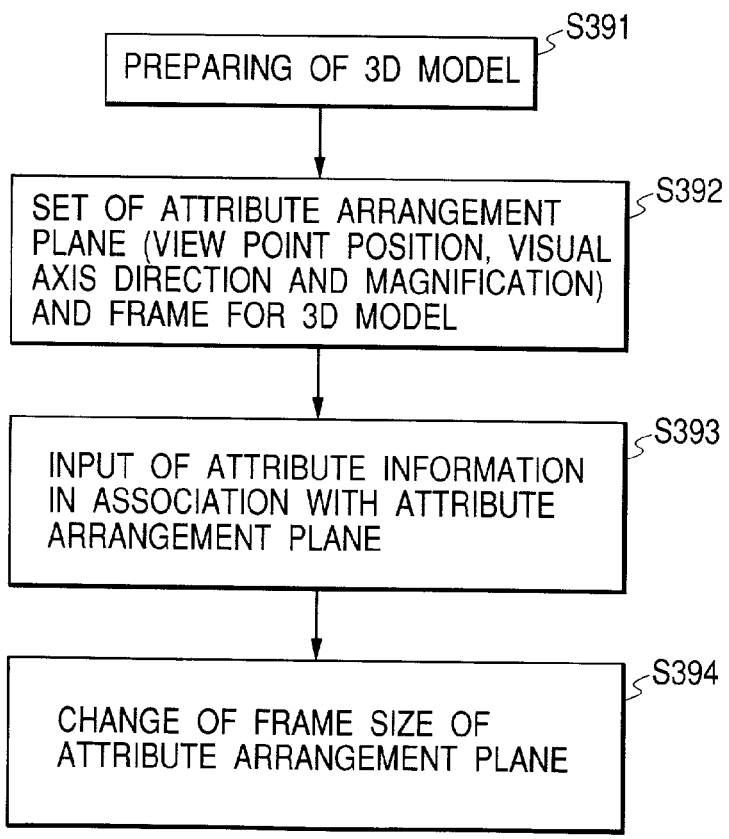
FIG. 39 is a flowchart showing a processing operation carried out when the attribute information is added to the 3D model.

A 3D model is prepared (S391 of FIG. 39). As described above, when an attribute arrangement plane equivalent to a projection drawing by the third angle projection method is set in FIG. 7, a rectangular frame 211*a* is set so as to surround the contour of the projected 3D model (S392 in FIG. 39). When the attribute information is then inputted (S393 in FIG. 39) and when the attribute information is located outside the foregoing frame 211*a*, the size and shape of the frame 211*a* are changed so as to locate all the attribute information inside the frame 211*a* (S394 in FIG. 39). This change is to detect coordinate positions of the arranged attribute information in the 3D space and automatically change the size of the frame so as to set the frame 211*a* in the outside range of the foregoing coordinate positions around the center located at the position of the view point of the attribute arrangement plane. In this case, it is needless to mention that the change is executed by the CPU device or the like. Alternatively, the operator may perform the change by so-called manual operation so as to locate all the attribute information within the frame 211*a*.

3.3 Display

Described below is a case of viewing the attribute information of the 3D model 1. When a desired attribute arrangement plane is selected at step S141 of FIG. 14, the shape of the 3D model 1 and the attribute information added in association with the attribute arrangement plane are displayed on the basis of the view point position, the visual axis direction, and the magnification of the selected attribute arrangement plane at step S142. For example, supposing the attribute arrangement plane 211, or the attribute arrangement plane 212, or the attribute arrangement plane 213 is selected, FIG. 9, or FIG. 10B, or FIG. 11B, respectively, is displayed so that the attribute arrangement plane is regularly opposed to the screen, regardless of the display state immediately before. At this time, the attribute information is arranged and displayed in an opposed state to the visual axis direction of each attribute arrangement plane, i.e., to the screen. Further, all the attribute information associated with each attribute arrangement plane is placed within each frame. This permits the operator to view the attribute information on a two-dimensional and extremely readily discernible basis on the display screen.

The engineers and others except for the operator having inputted the attribute information do not have to view the areas other than the interior of each frame in order to view the attribute information, as described hereinafter. This obviates the necessity for a check work of checking whether any attribute information is present outside the frame, and thus realizes efficient works, where a three-dimensional space extremely wider than the 3D model is set on the 3D-CAD.

3.4 Selection of Attribute Arrangement Plane

Next introduced are examples of methods for facilitating the selection of an attribute arrangement plane. A first conceivable method is to display frames of selectable attribute arrangement planes of the 3D model and allow the operator to select an attribute arrangement plane through the use of the input device of a pointing device or the like such as a mouse or the like. (FIG. 7)

A second conceivable method is to display names of selectable attribute arrangement planes in a list form and allow the operator to select one out of them (not shown).

Figure 27:
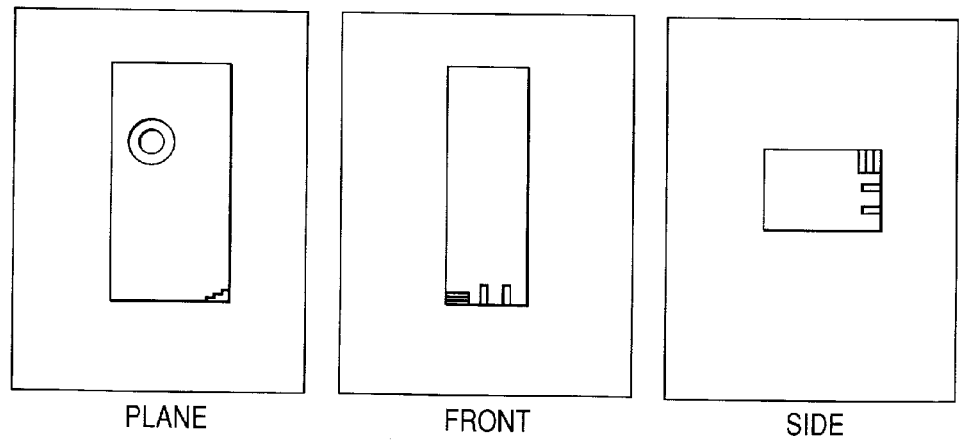
FIG. 27 is a drawing for explaining a state in which the display contents from the respective attribute arrangement planes are indicated by icons.

A further conceivable method is to display icons of thumbnail images corresponding to images showing views of attribute arrangement planes in their respective visual axis directions (FIG. 9, FIG. 10B, or FIG. 11B) and allow the operator to select one. (FIG. 27)

4. Input of Attribute Information into 3D model, and Display 2

In the aforementioned input of attribute information described with reference to FIGS. 11A, 11B, 12, 13 and 14, the attribute information was associated with each attribute arrangement plane, but the associating means does not have to be limited to the above; for example, another possible means is one of grouping attribute information to form a group and associating the group with the attribute arrangement plane.

This will be described below on the basis of the flowcharts shown in FIGS. 15 and 16.

4.1 Grouping

The preliminarily inputted attribute information is grouped selectively or based on the result of a search to make a group and the group is associated with an arbitrary attribute arrangement plane, thereby achieving the result and effect similar to those as described above. The attribute information associated with the attribute arrangement plane can be manipulated by making correction such as addition, deletion, etc. to the group of attribute information.

Namely, the 3D model is prepared (step S151), the attribute information is inputted (step S152), and the view point position, visual axis direction, and magnification of an attribute arrangement plane are set for the 3D model (step S153). Then the attribute information inputted at step S152 is grouped to set a group with the grouped attribute information being associated with the set attribute arrangement plane (step S154).

For implementing the display, as shown in FIG. 16, an attribute arrangement plane is selected (step S161), and the attribute information associated with the selected attribute arrangement plane is displayed on the display device 204 in accordance with the information of the view point position, visual axis direction, and magnification of the attribute arrangement plane (step S162).

4.2 Setting of Plural Attribute Arrangement Planes

Described below is a case where a plurality of attribute arrangement planes are set for an identical visual axis direction (the plurality of attribute arrangement planes are parallel to each other).

Figure 17:
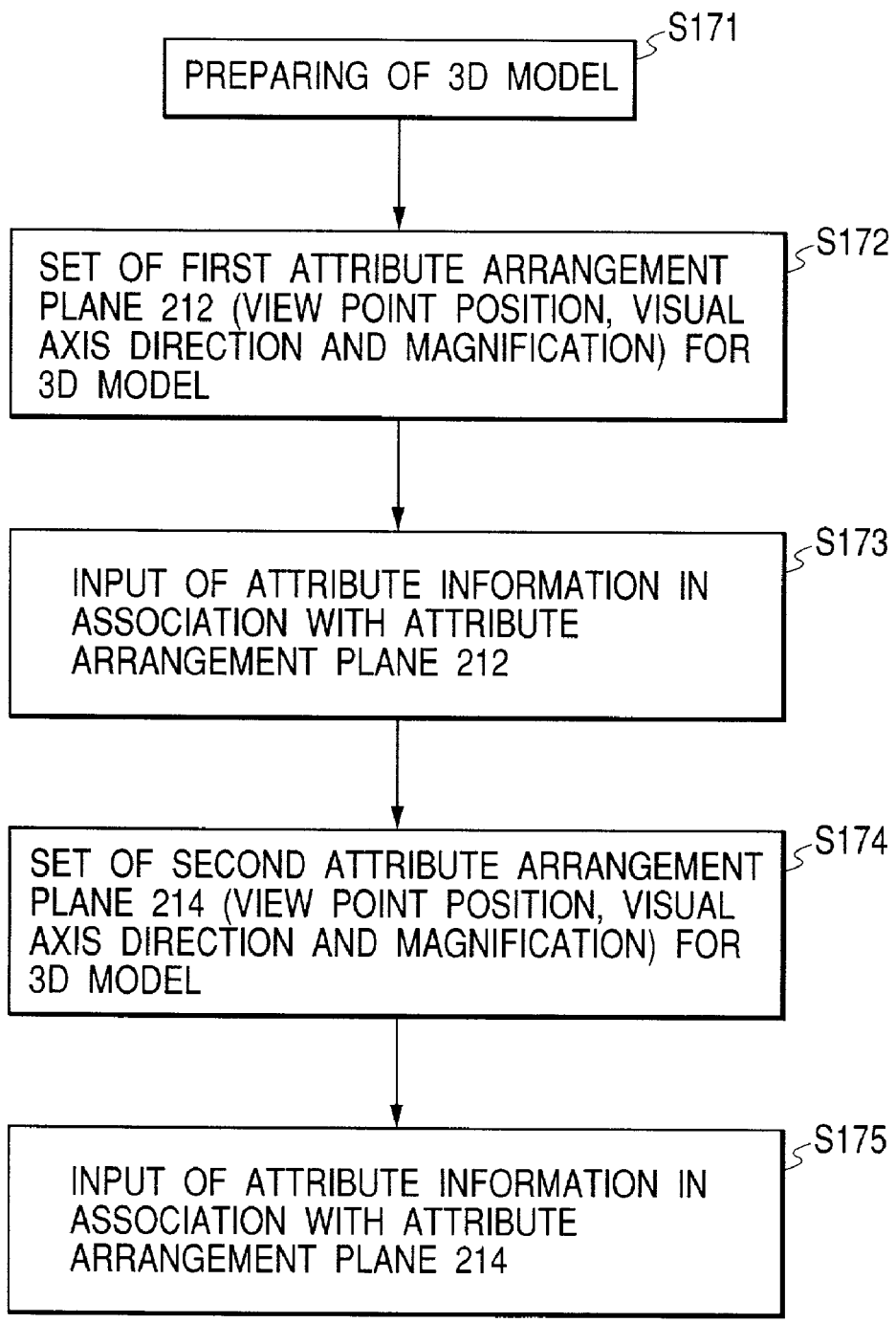
FIG. 17 is a flowchart showing a processing operation carried out when a plurality of attribute arrangement planes are set for a 3D model.
Figure 18A:
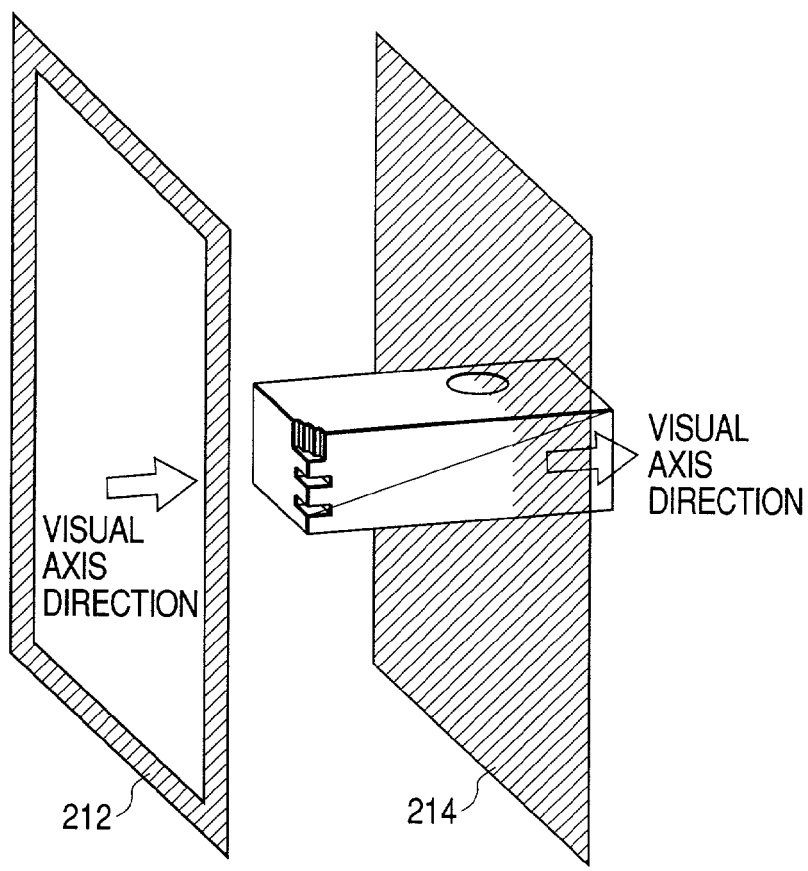
FIGS. 18A and 18B are drawings of a state in which a plurality of attribute arrangement planes are set for a 3D model.

FIG. 17 is a flowchart showing a processing operation carried out when a plurality of attribute arrangement planes are set for an identical visual axis direction, and FIG. 18A is a drawing showing a 3D model for which a plurality of attribute arrangement planes are set for an identical visual axis direction.

In the 3D model 1 shown in FIG. 7, let us explain a case where a plurality of attribute arrangement planes are set so that the projection direction of the front view matches the visual axis direction.

The 3D model 1 is prepared as described previously (step S171), and at step S172 the attribute arrangement plane 212 (view point position, visual axis direction, and magnification) being a first attribute arrangement plane is set. The visual axis direction of this attribute arrangement plane 212 is parallel to the plane 201b of the front view, the magnification is, for example, 1×, and the view point position is the position 30 mm apart from the contour of the front view and is approximately the center of the plane 201b of the front view.

At step S173 thereafter, the attribute information as shown in FIG. 10A is inputted in association with the attribute arrangement plane 212, which permits the attribute information to be viewed on a two-dimensional and extremely easily discernible basis, as in FIG. 10B, on the view from the visual axis direction of the attribute arrangement plane 212.

At step S174 thereafter the attribute arrangement plane 214 (view point position, visual axis direction, and magnification) being a second attribute arrangement plane is set. It is set so that the visual axis direction of the attribute arrangement plane 214 is parallel to the plane 201b of the front view, the magnification is, for example, 1×, and the view point position includes the center axis of the hole of the 3D model on the attribute arrangement plane.

The attribute arrangement plane 214 is expressed in a rectangular, solid filled form. At this time, the 3D model 1 viewed from the attribute arrangement plane 214 is a sectional shape of the 3D model 1 cut by the virtual plane 214, as shown in FIG. 19B. The attribute information (e.g., the dimension of the hole of 12±0.1 in FIG. 19B) is inputted in association with the attribute arrangement plane 214. When the attribute arrangement plane 214 is selected, the sectional shape of the 3D model 1 and, the attribute information piece associated with this attribute arrangement plane are displayed (FIG. 19B). In this case, the attribute information is also placed within the frame 214a of the attribute arrangement plane 214.

Figure 19A:
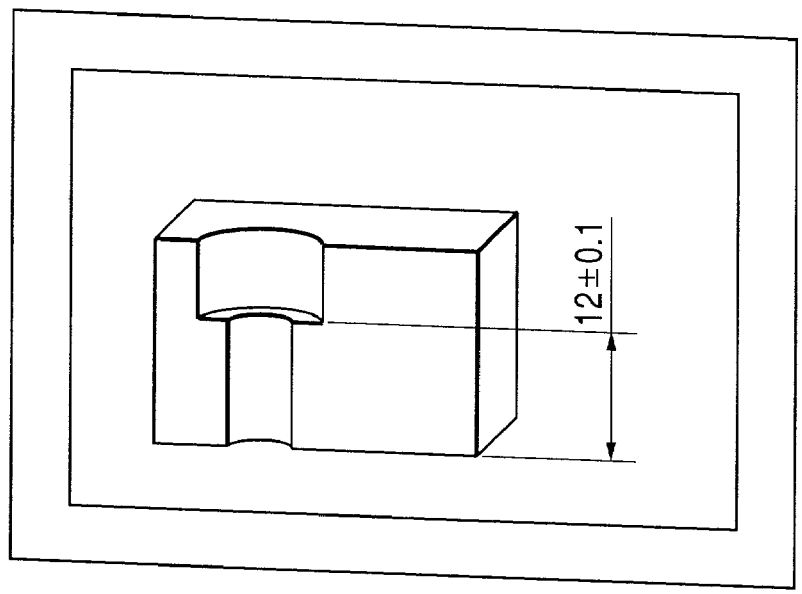
FIGS. 19A and 19B are drawings showing the 3D model viewed from the attribute arrangement plane 214 of FIGS. 18A and 18B.
Figure 19B:
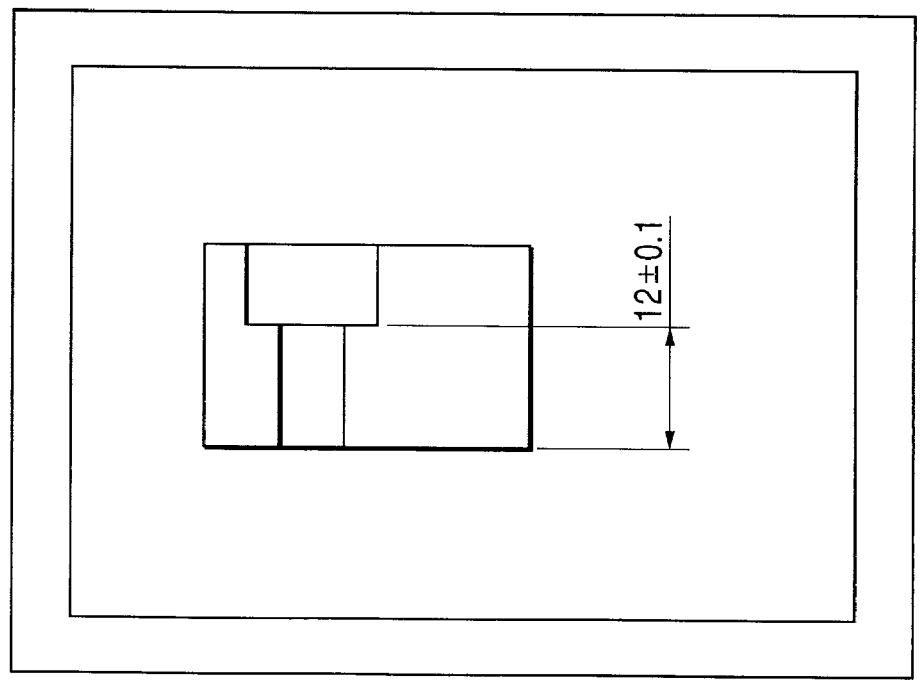

The apparatus is also configured to be able to provide three-dimensional display, as shown in FIG. 19A, by movement, rotation, or the like of the 3D model 1.

Figure 18B:
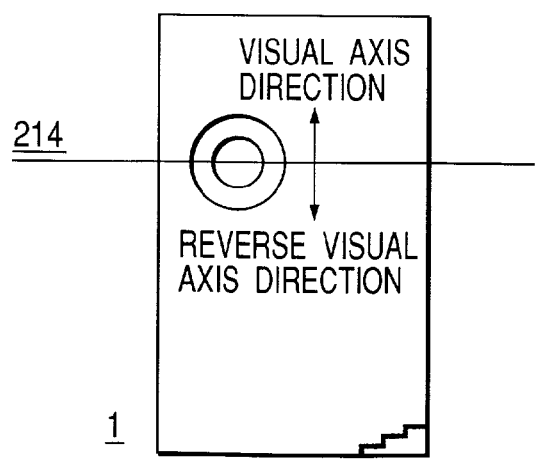

Namely, with selection of the attribute arrangement plane 214, the 3D model existing in the visual axis direction of the attribute arrangement plane 214 and the attribute information associated with the attribute arrangement plane existing in the region in the same visual axis direction are displayed, but the 3D model shape and attribute information in the region in the reverse visual axis direction (cf. FIG. 18B) are not displayed.

According to the present embodiment, it becomes feasible to handle the attribute information related to the sectional shape in the same visual axis direction, in addition to the attribute information related to the contour shape. Since it permits the operator to input and display the attribute information while viewing the sectional shape, a designated portion of the attribute information can be identified readily and instantaneously.

Figure 20:
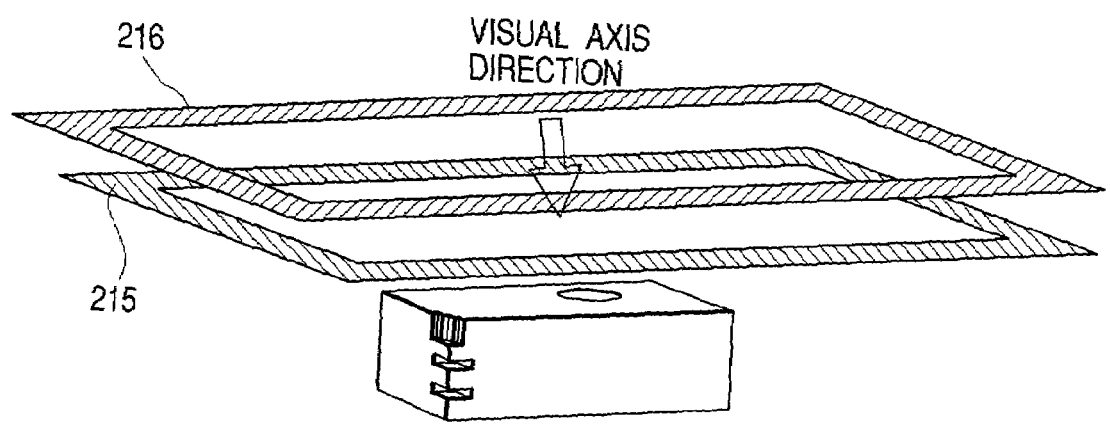
FIG. 20 is a drawing of a state in which a 3D model and a plurality of attribute arrangement planes are set.
Figure 21:
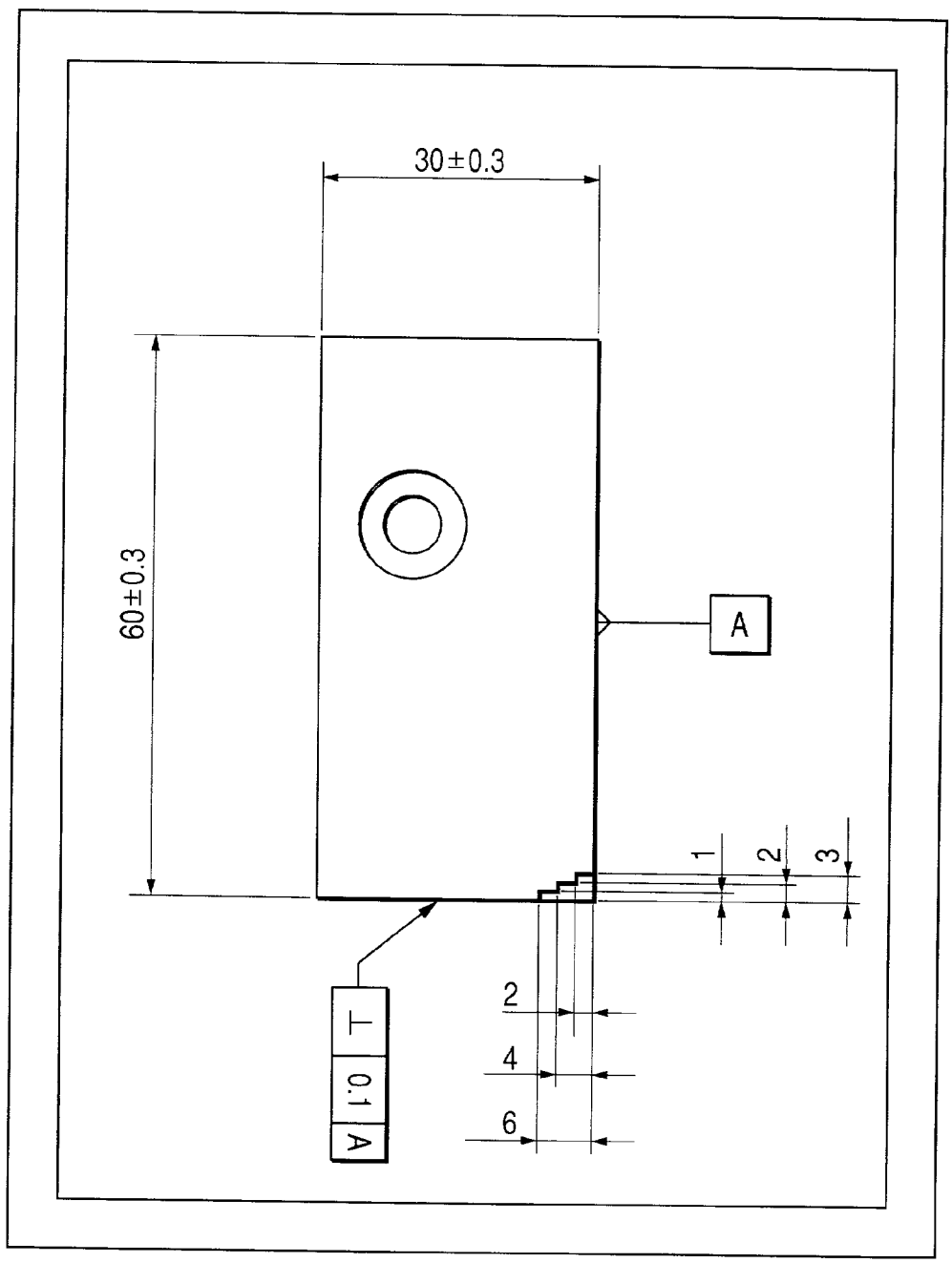
FIG. 21 is a drawing showing the 3D model viewed from the attribute arrangement plane 215 shown in FIG. 20.

Another possible configuration is such that a plurality of attribute arrangement planes are set so as to view the same shape of the 3D model 1. FIG. 20 shows attribute arrangement plane 215 and attribute arrangement plane 216 having the same visual axis direction. In this example the attribute arrangement plane 215 and attribute arrangement plane 216 are directed to the plan view of the 3D model 1. When the attribute information is, for example, grouped and associated with each of the attribute arrangement planes, better discernible attribute information can be substantiated. For example, FIG. 21 is a plan view of the 3D model 1 in which the attribute information concerning the contour dimensions is grouped.

Figure 22:
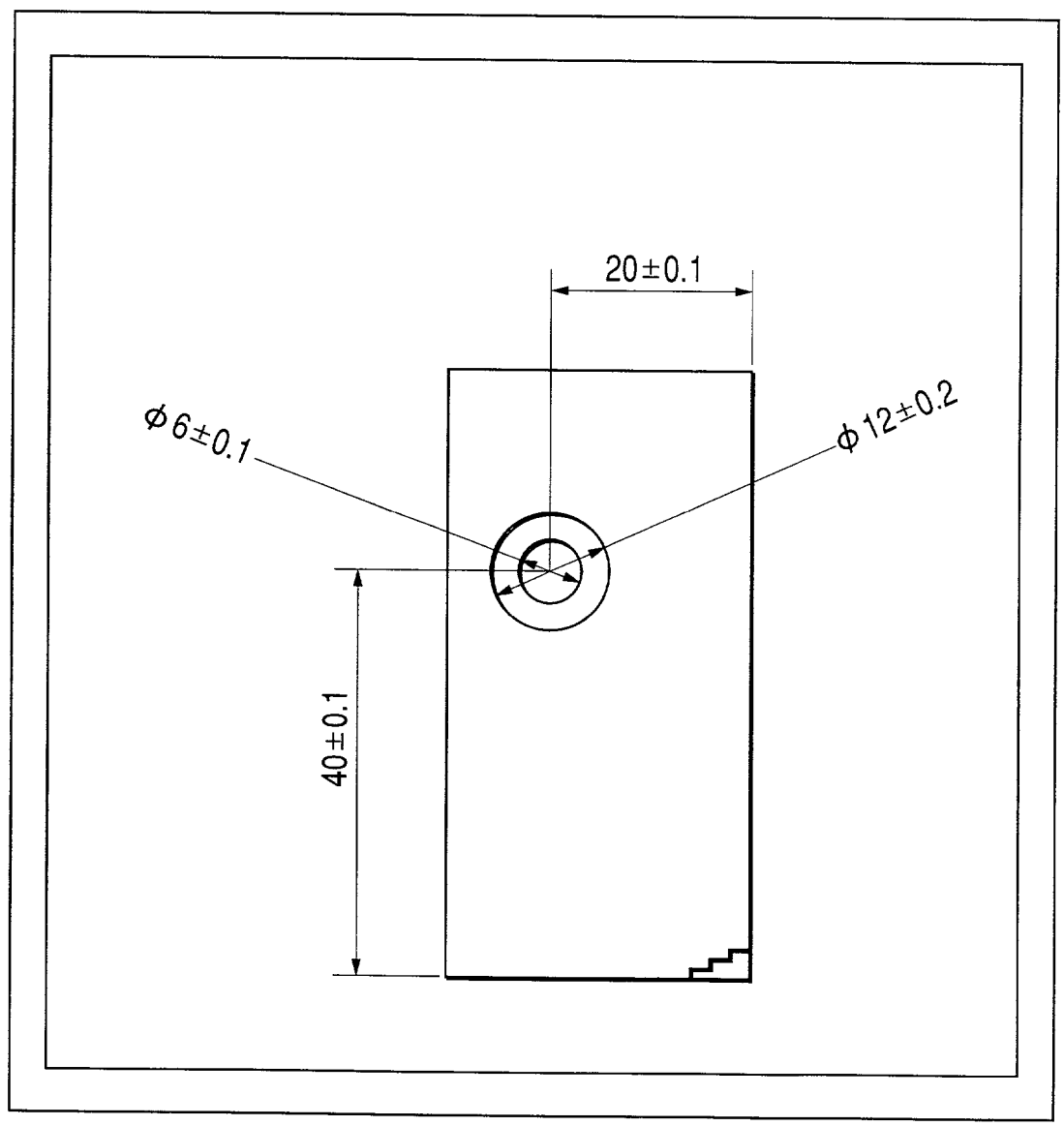
FIG. 22 is a drawing showing the 3D model viewed from the attribute arrangement plane 216 shown in FIG. 20.

FIG. 22 is a plan view in which the attribute information concerning the hole position and hole shape in the above model is grouped. The attribute information groups are associated with the attribute arrangement plane 215 and with the attribute arrangement plane 216, respectively. By grouping the related attribute information and allocating the groups to the attribute arrangement planes in this way, the related attribute information becomes better discernible.

5. Input of Attribute Information into 3D model, and Display 3

The following will detail input of attribute information into another 3D model and display of the 3D model provided with the attribute information.

FIGS. 40, 41, 43A, 43B, 44A and 44B are drawings showing the 3D model and the attribute information, and FIGS. 45 to 47 flowcharts showing processing operations carried out when the attribute information is added to the 3D model.

Figure 40:
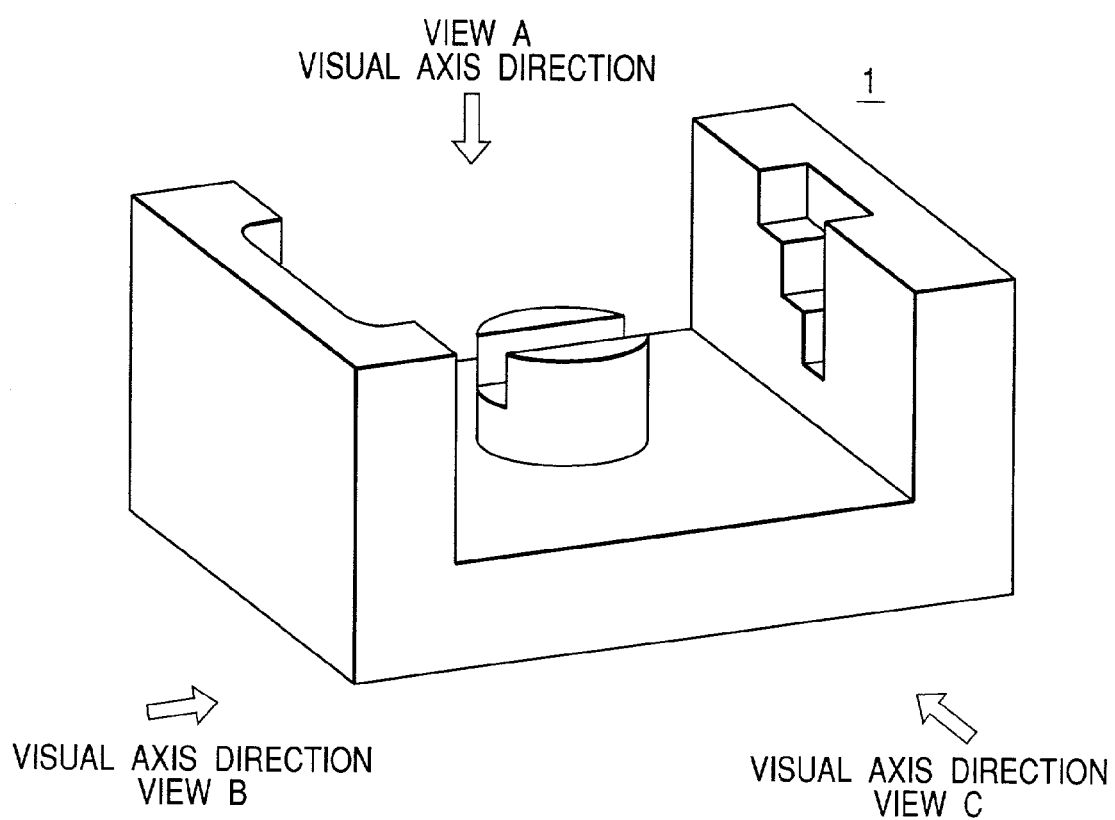
FIG. 40 is a drawing showing the 3D model and attribute arrangement plane.

At step S451 of FIG. 45, the 3D model 1 shown in FIG. 40 is prepared, and at step S452 a necessary view is set in order to add the attribute information to the 3D model 1 thus prepared.

Figure 48:
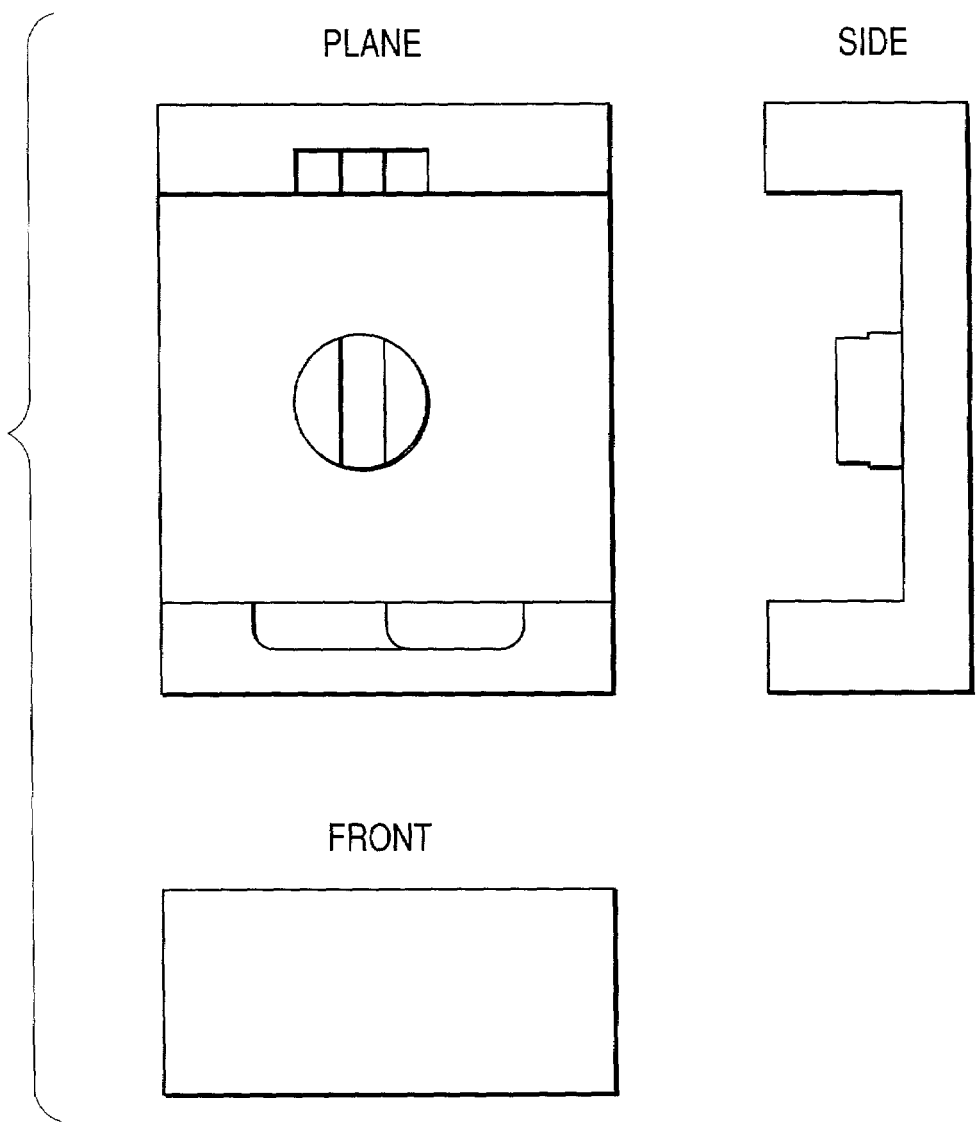
FIG. 48 is a front view, a plan view, and a side view of the 3D model shown in FIG. 38.

Here the view specifies the requirements concerning the display of the 3D model 1, determined by the direction of the visual axis, the magnification, and the center of the visual axis, for viewing the 3D model 1 on the (virtual) 3D space. For example, in FIG. 40, a view A is determined by the visual axis direction perpendicular to the plan view shown in FIG. 48. The magnification and the center of the visual axis are determined so that almost all of the shape of the 3D model 1 and the added attribute information can be displayed on the display screen of the display device. For example, in the present embodiment the magnification is set at 2× and the visual axis center is located nearly at the center of the plan view. Likewise, a view B and a view C are also set along the visual axis direction perpendicular to the front view and along the visual axis direction perpendicular to the side view, respectively.

Figure 41:
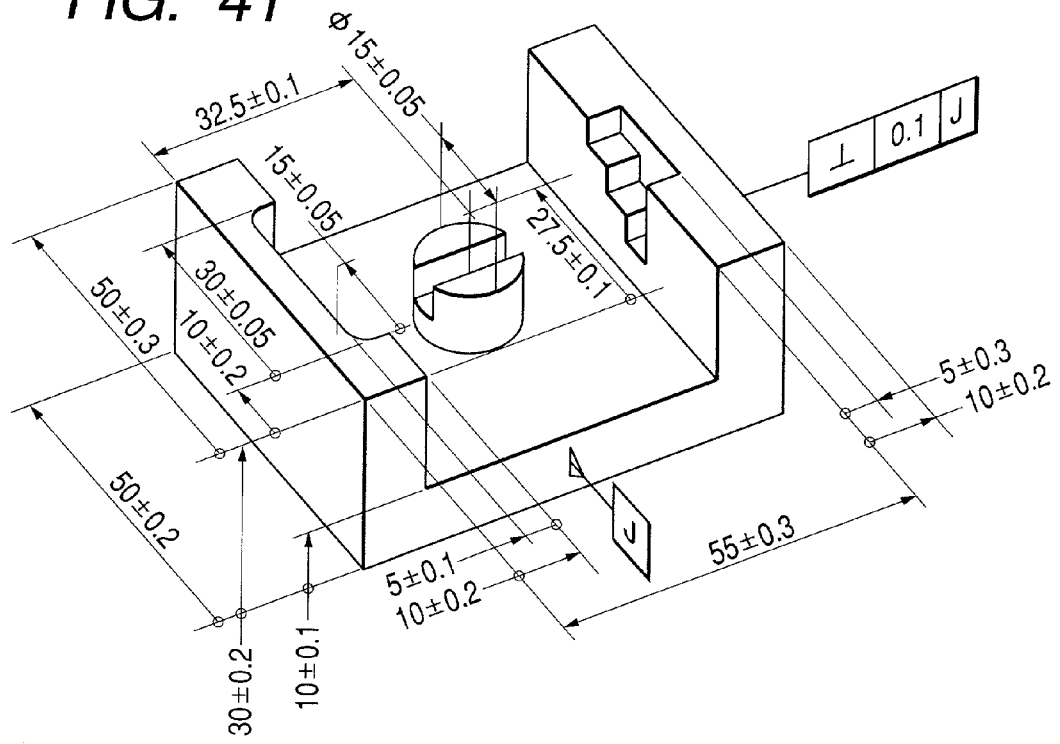
FIG. 41 is a drawing showing the 3D model and attribute information.
Figure 42:
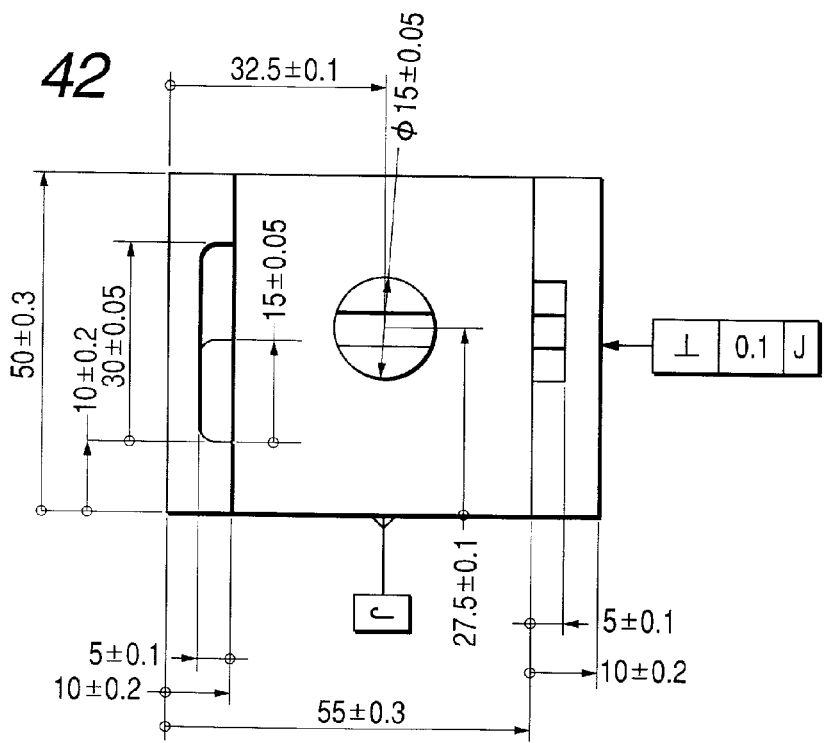
FIG. 42 is a drawing showing the 3D model and attribute information.
Figure 43A:
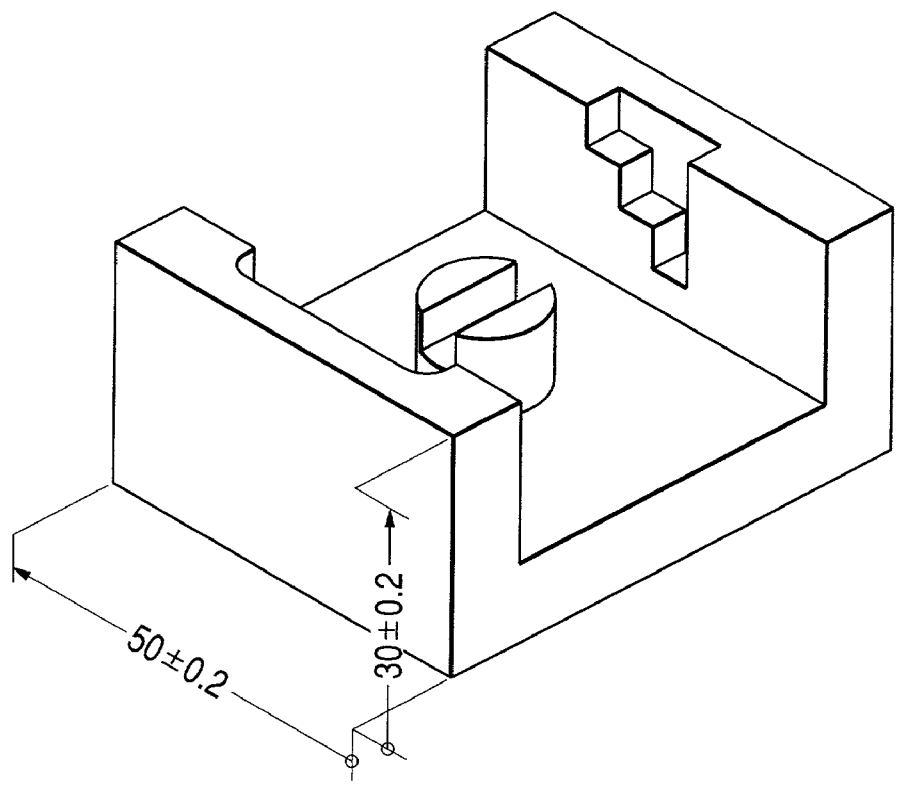
FIGS. 43A and 43B are drawings showing the 3D model and attribute information.
Figure 43B:
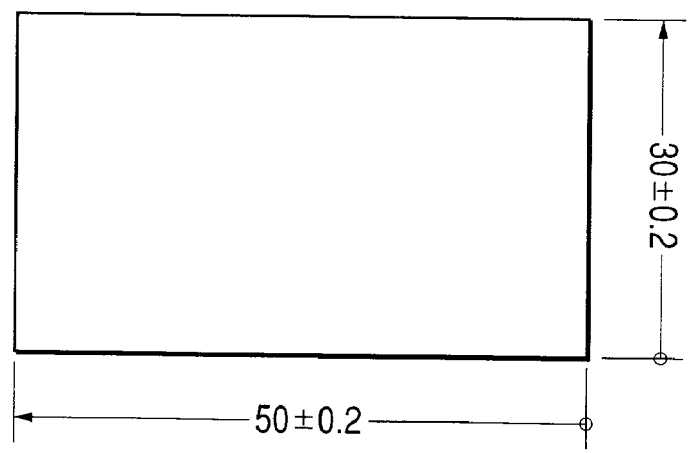
Figure 44A:
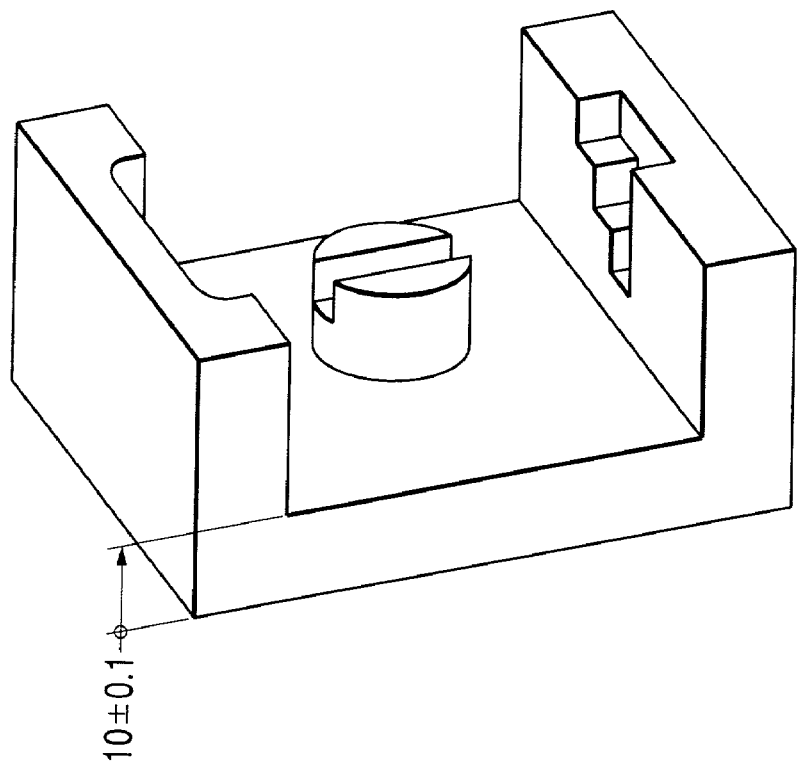
FIGS. 44A and 44B are drawings showing the 3D model and attribute information.
Figure 44B:
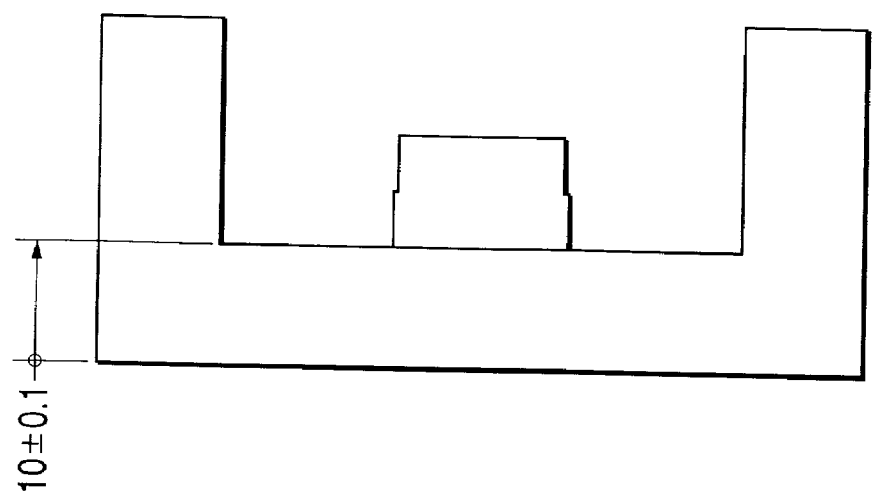

Next, at step S453 the attribute information is inputted in association with each view thus set and so as to be regularly opposed to the visual axis direction of each view. FIG. 41, FIG. 43A, and FIG. 44A are drawings showing respective states provided with the attribute information of the views A, B, and C, respectively. FIG. 42, FIG. 43B, and FIG. 44B show the 3D model 1 and the attribute information from the views A, B, and C, respectively.

The associating operation of each view with the attribute information may be done after the input of attribute information. For example, as in the flowchart shown in FIG. 46, the 3D model is prepared (step S461), the attribute information is inputted at step S462, and at step S463 thereafter the attribute information is associated with a desired view. Correction such as addition, deletion, etc. is made to the attribute information associated with the views according to necessity.

The input of the attribute information may be conducted in a state in which the 3D model 1 is displayed in the two-dimensional manner as a display image from each view. The input can be implemented just like the step of preparing a two-dimensional drawing by the so-called 2D-CAD. The attribute information may also be inputted while displaying the model in the three-dimensional manner as occasion may demand. Since the attribute information can be inputted while viewing the 3D model 1 in the three-dimensional manner, the input can be implemented more efficiently and without errors.

For viewing the attribute information of the 3D model 1, a desired view is selected at step S471 of FIG. 47 whereby the shape of the 3D model 1 and the attribute information added in association with the view are displayed on the basis of the visual axis direction, magnification, and visual axis center of the selected view at step S472. For facilitating the selection of view, selectable views of the 3D model 1 are properly stored and displayed in the form of icons or the like on the screen. For example, when the view A, or the view B, or the view C is selected, FIG. 42, or FIG. 43B, or FIG. 44B, respectively, is displayed. At this time, since the attribute information is arranged in an opposed state to each view, it can be viewed on a two-dimensional and extremely easily discernible basis on the display screen.

5.1 Another Input Method of Attribute Information

In the foregoing attribute information input described with reference to FIGS. 44 to 47, the attribute information was associated with each view, but the associating means does not have to be limited to the above; for example, another possible method is to group the attribute information to set a group and associate the group with the view.

Figure 49:
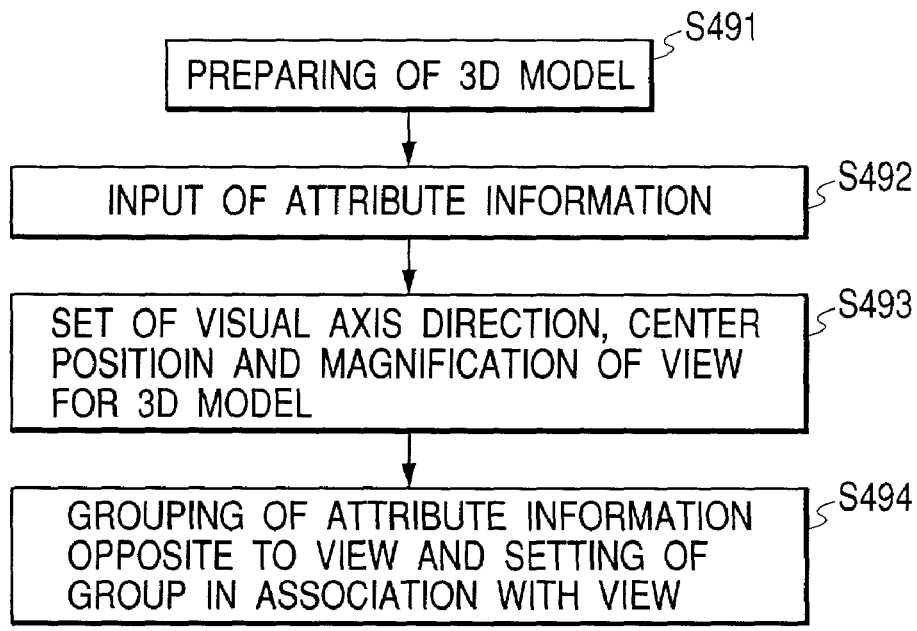
FIG. 49 is a flowchart showing a processing operation carried out when the attribute information is added to the 3D model.

This will be described on the basis of the flowcharts shown in FIG. 49 and 50.

The attribute information preliminarily inputted is grouped selectively or based on the result of a search to form a group, and the group is associated with an arbitrary view, thereby achieving the result and effect similar to those as described above. Correction such as addition, deletion, etc. is made to the group of attribute information whereby the attribute information associated with the view can be manipulated.

Namely, the 3D model is prepared (step S491), the attribute information is inputted (step S492), and the visual axis direction, center position, and magnification of each view are set for the 3D model (step S493). The attribute information inputted at step S492 is grouped and the attribute information group is associated with each set view (step S494).

Figure 50:
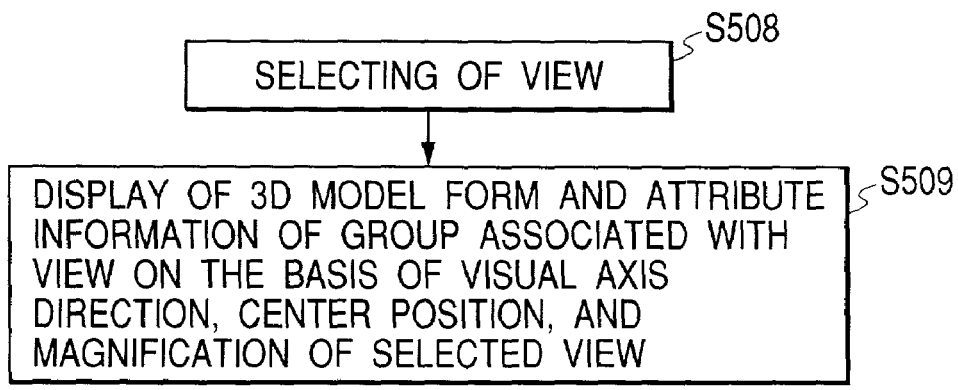
FIG. 50 is a flowchart of processing carried out when the 3D model provided with the attribute information is displayed.

For implementing the display, as shown in FIG. 50, a view to be displayed is selected (step S508) and the attribute information set for the selected view is displayed (step S509).

5.2 Setting of Plural Views

The following will describe a case where a plurality of views are set for an identical visual axis direction.

Figure 51:
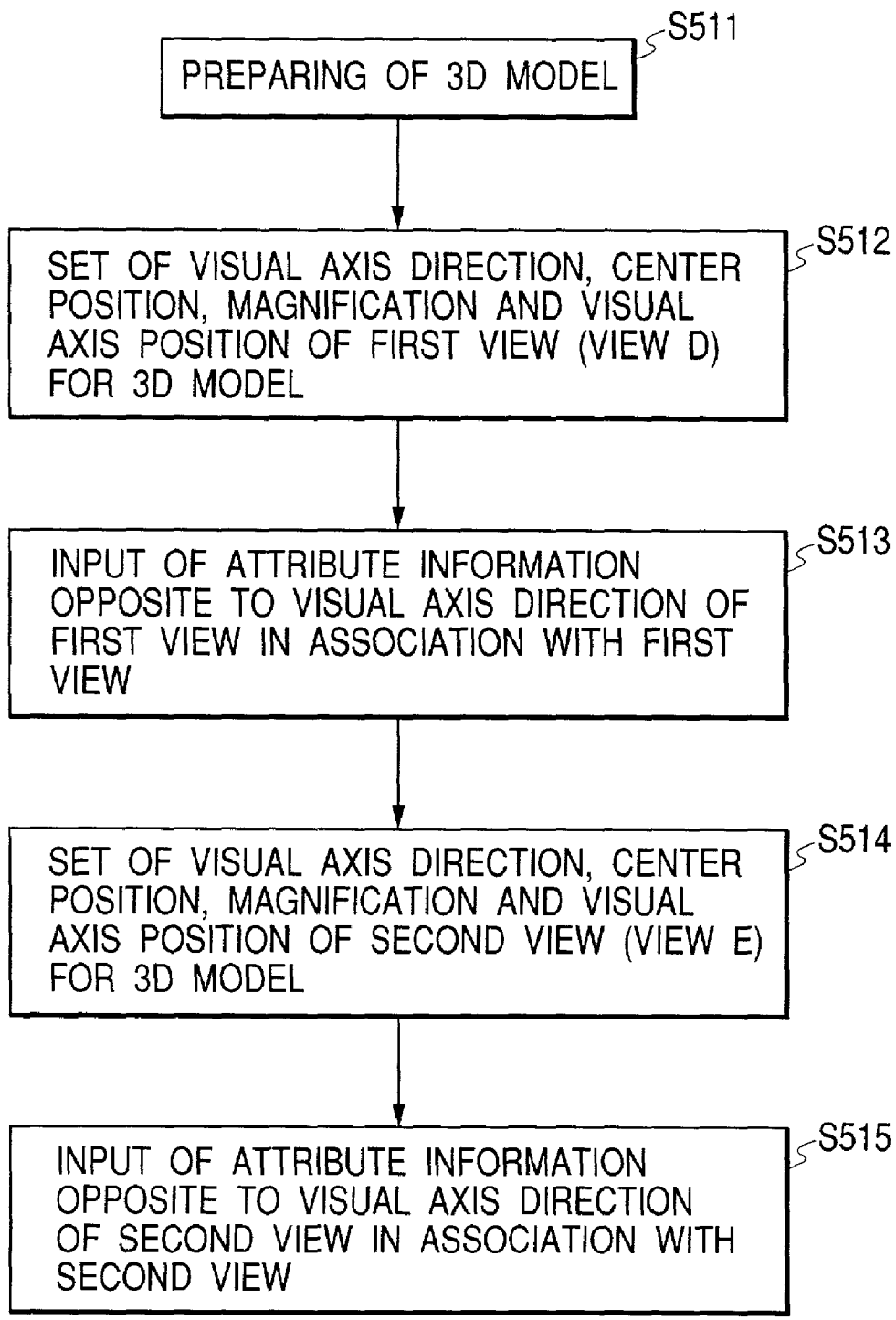
FIG. 51 is a flowchart showing a processing operation carried out when a plurality of views are set for the 3D model.
Figure 52:
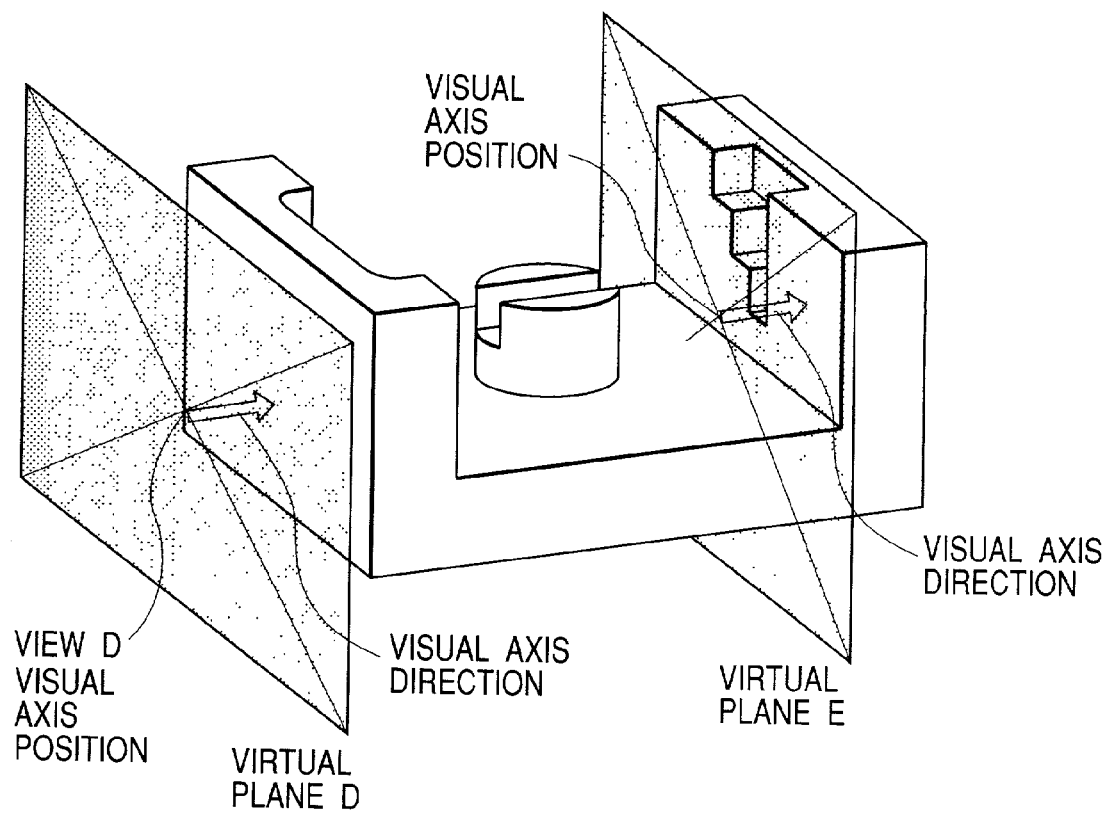
FIG. 52 is a drawing of a state in which a plurality of views are set for the 3D model.

FIG. 51 is a flowchart showing a processing operation carried out when a plurality of views are set for an identical visual axis direction, and FIG. 52 a drawing showing a 3D model where a plurality of views are set for an identical visual axis direction.

Described below is a case where a plurality of views are set in the projection direction of the front view in the 3D model 1 shown in FIG. 40.

The 3D model is prepared as described previously (step S511), and at step S512 a view D being a first view is set. The visual axis direction is the projection direction of the front view, the magnification is, for example, 2×, and the center position is approximately the center of the front view. Then the visual axis position is set. Here the visual axis position specifies the position from which the 3D model 1 is viewed in the visual axis direction, i.e., displayed. The view D is set, for example, at the position 30 mm apart from the contour of the front view of the 3D model 1. It is located on the virtual plane D in FIG. 52. It is, however, noted herein as to the projection drawings (front view, plan view, left and right side views, bottom view, and back view) by the so-called third angle projection method that the display contents are independent of where the visual axis position is located, as long as it is located outside the 3D model 1.

At step S513 thereafter, the attribute information as shown in FIG. 43A is inputted in association with the view D, and from the view D, the attribute information can be viewed on a two-dimensional and extremely easily discernible basis, as in FIG. 43B.

At step S514 thereafter, a view E being a second view is set. The visual axis direction is set along the same direction directed to the front view, as that of the view D, the magnification is also set similarly, for example, to 2×, and the center position is also set approximately at the center of the front view similarly. Then the visual axis position is set near a corner of a stepped groove in the 3D model 1.

Then the visual axis position is set at the center of the hole position of the 3D model 1. The visual axis position is located on the virtual plane E in FIG. 52. At this time, the 3D model 1 viewed from the view E is a sectional shape of the 3D model 1 cut by the virtual plane E, as shown in FIG. 53B. The attribute information is inputted in association with the view E.

Figure 53A:
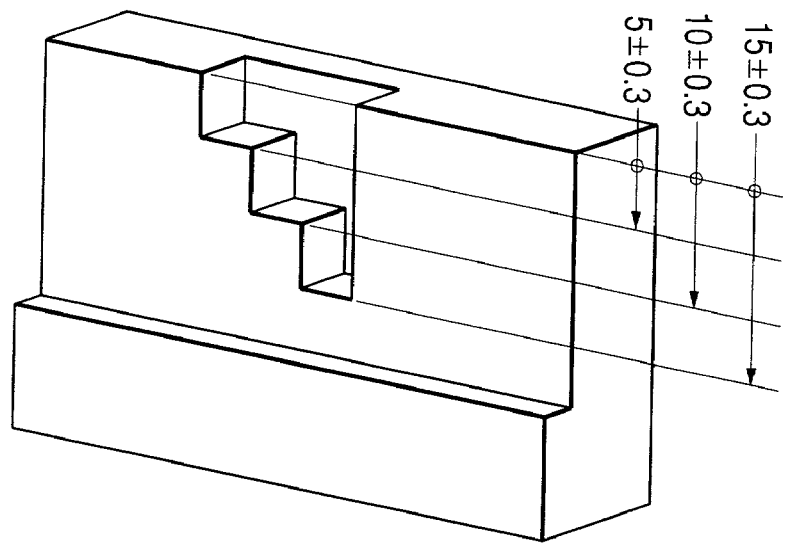
FIGS. 53A and 53B are drawings showing the 3D model viewed from a view E of FIG. 52.
Figure 53B:
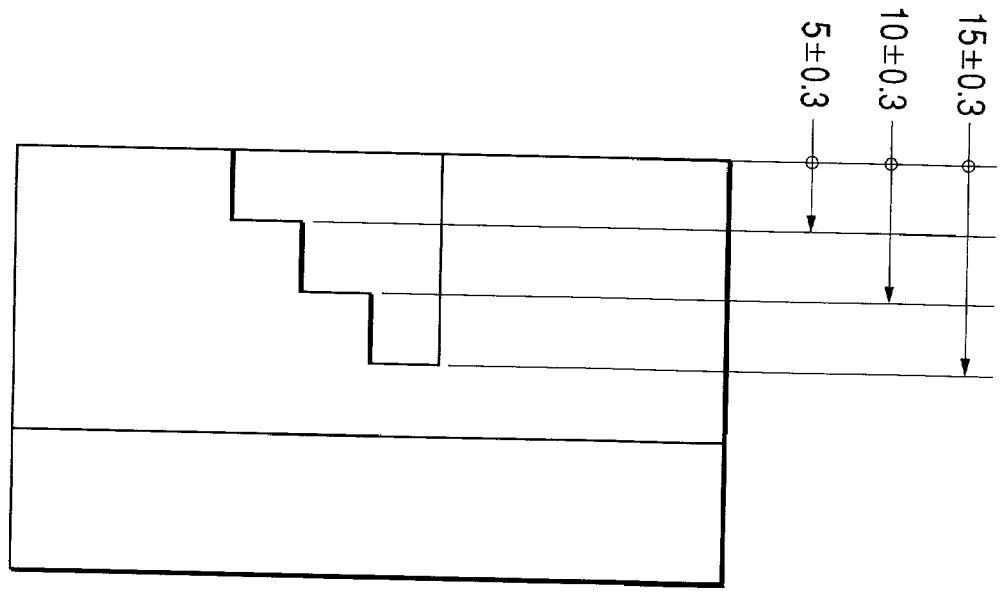

If the 3D model 1 is subjected to movement, rotation, or the like upon selection of the view E, the three-dimensional display can be provided as shown in FIG. 53A.

Let us discuss herein the operability to check the attribute information by switching the display from the display state of the entire model as shown in FIG. 40 to display of a cross section.

It is sometimes hard to determine where the virtual plane associated with the attribute information is located on the model or in which way the direction of the visual axis is directed.

Figure 54:
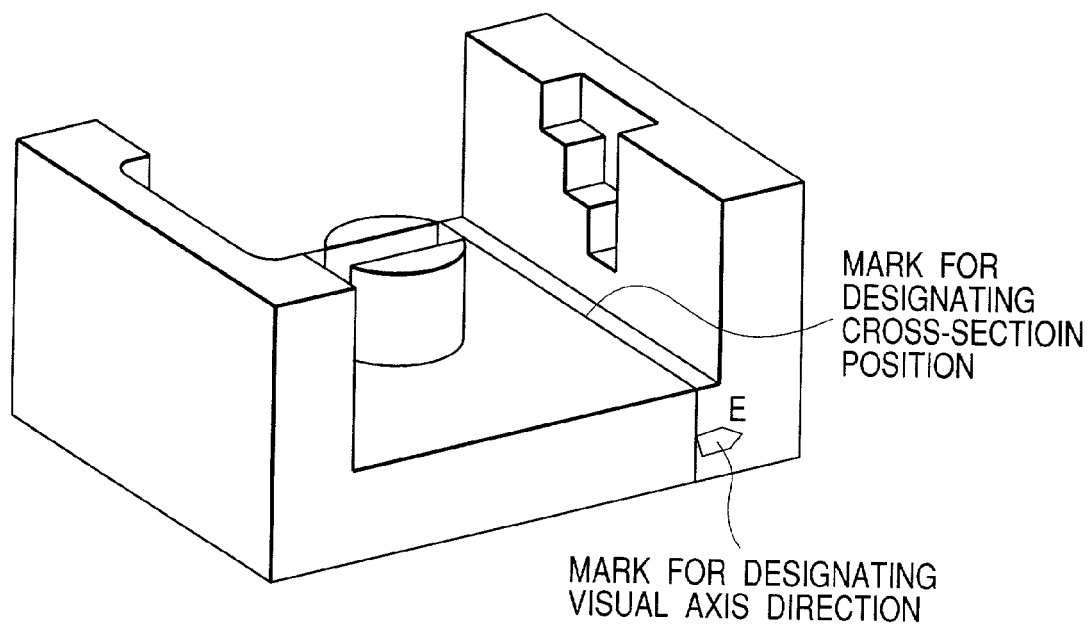
FIG. 54 is a drawing showing a view on the 3D model.

FIG. 54 shows an example illustrating the position of the virtual plane and the visual axis direction.

When the entire 3D model is displayed, a line is displayed at the intersecting position between the 3D model and the virtual plane, i.e., at the position of cross section. This line is of a type different from lines indicating edges of the 3D model. For example, it is a chain line, a thin line, a different color line, or the like.

If a mark for designating the visual axis direction defined on the virtual plane and/or a name of the virtual plane are displayed near the line, they can further help recognition.

A partial detail drawing will be described below with reference to FIGS. 55A, 55B and 56.

Figure 55A:
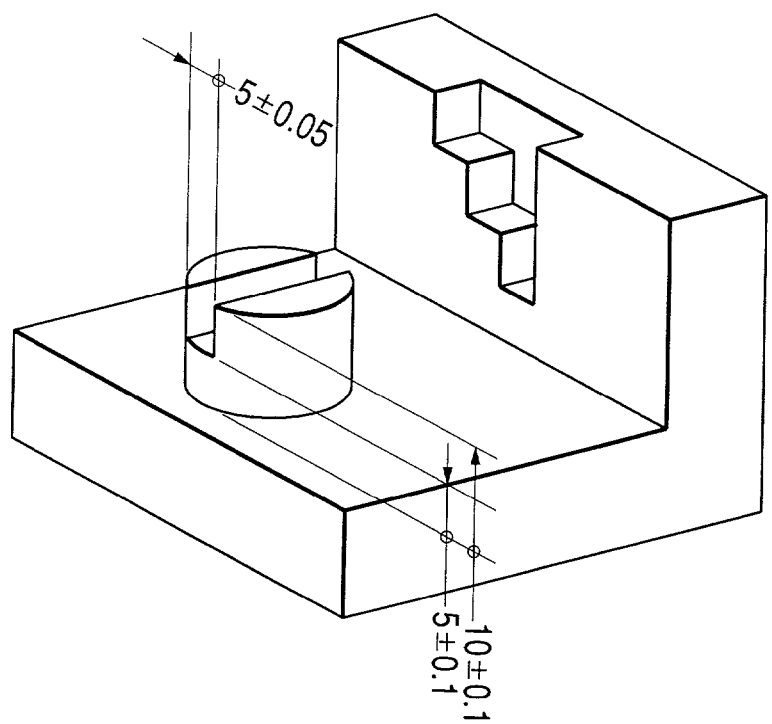
FIGS. 55A and 55B are drawings showing partial detail views.

The following will describe how to check the attribute information from the cross section of FIG. 55A.

Figure 55B:
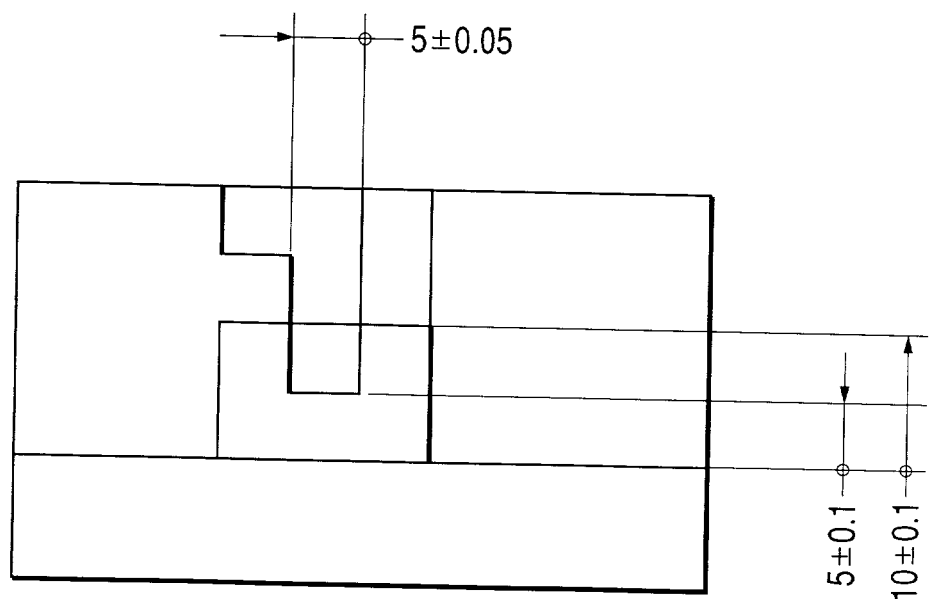

When the attribute information is checked as in the case of the partial detail drawing of the two-dimensional drawing, there are cases where the visibility is deteriorated because of inclusion of other edges, as shown in FIG. 55B.

Figure 56:
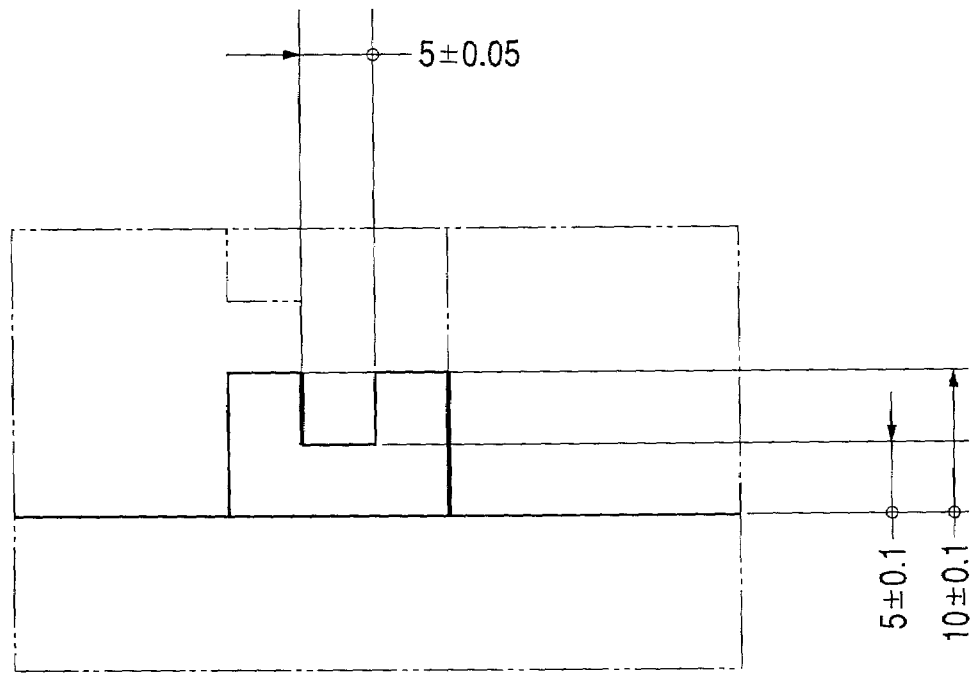
FIG. 56 is a drawing showing an example of change in display of the shape unrelated to the attribute information.

Therefore, the visibility can be improved by changing the shape display method for the shapes unrelated to the displayed attribute information, as shown in FIG. 56. In FIG. 56, the edges of unrelated shapes are represented by chain double-dashed lines.

How to change the display method can also be selected from display in different color, semi-transparent display, etc., without having to be limited to the chain double-dashed lines.

Figure 57A:
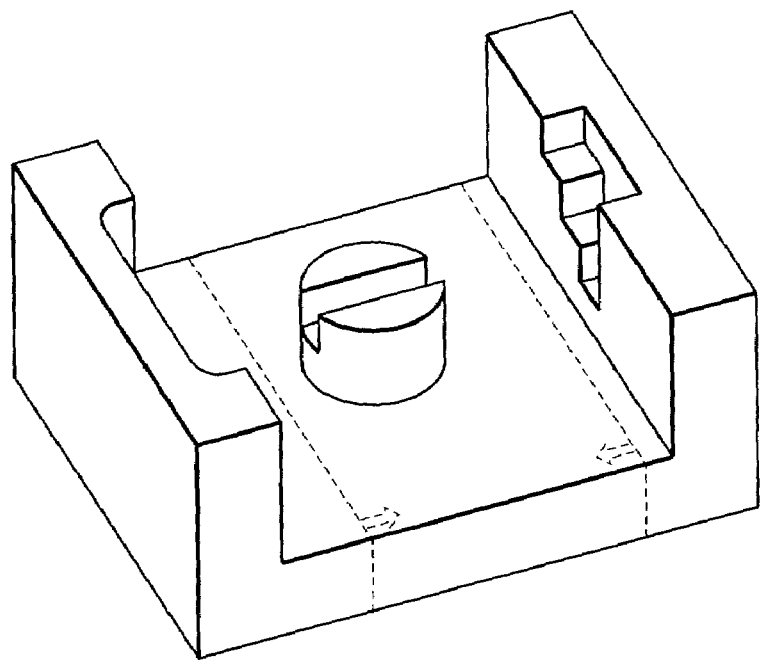
FIGS. 57A and 57B are drawings of an example where only a shape in an arbitrary range is displayed.
Figure 57B:
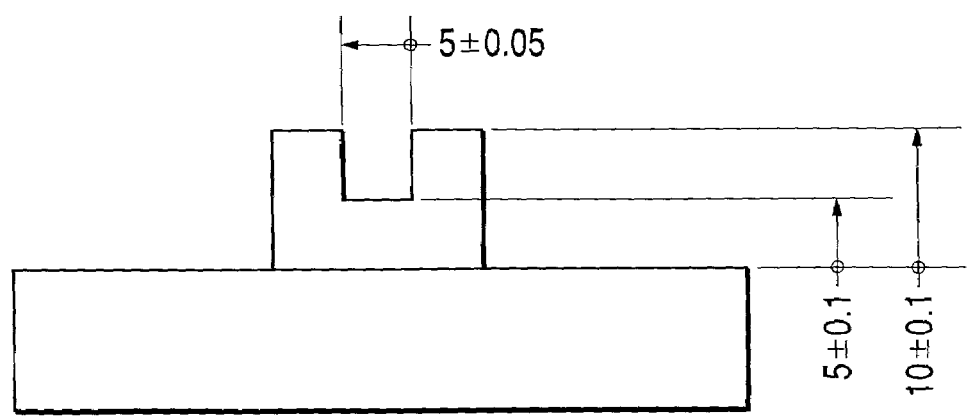

FIGS. 57A and 57B show examples in which a region between two planes is displayed. FIG. 57A is a drawing showing lines indicating the intersecting positions between the two-planes and the 3D model, and FIG. 57B a drawing showing the 3D model and attributes in only the region between the two planes.

When only the range desired to display is displayed, the operator can work efficiently without unnecessary information and thus with improved visibility.

According to the present embodiment, the operator is allowed to input and display the attribute information while viewing the so-called sectional shape, so that the operator can identify specifying portions of the attribute information readily and instantly.

Figure 58:
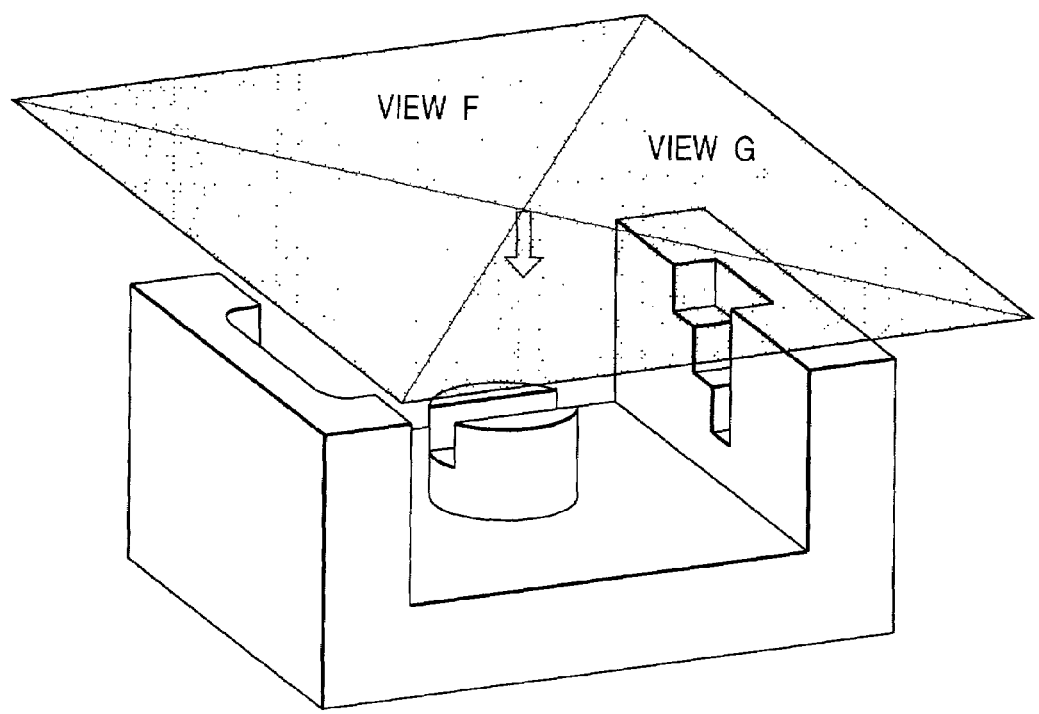
FIG. 58 is a drawing of a state in which the 3D model and a plurality of views are set.
Figure 59:
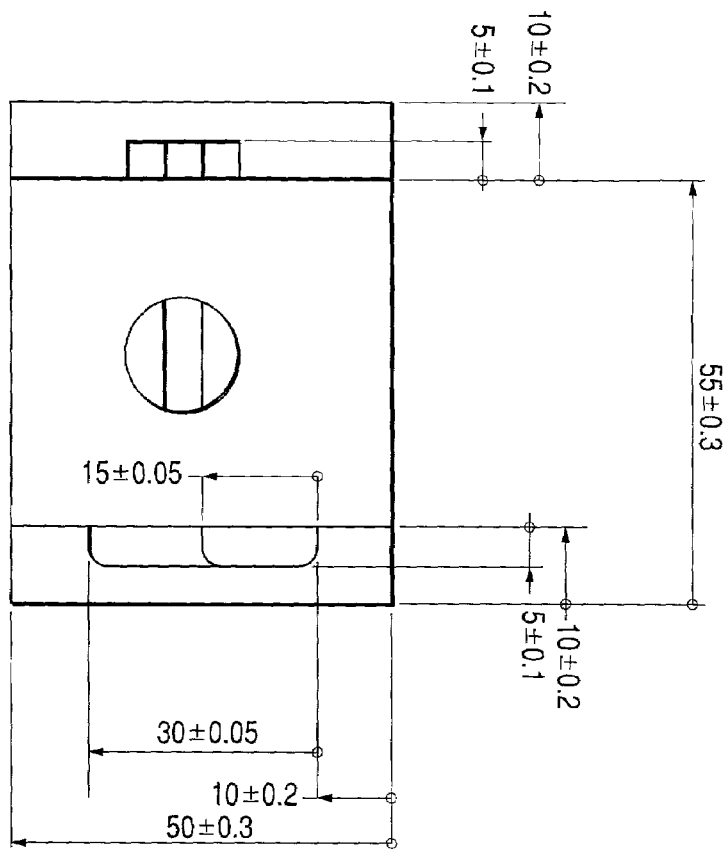
FIG. 59 is a drawing showing the 3D model viewed from a view F shown in FIG. 58.
Figure 60:
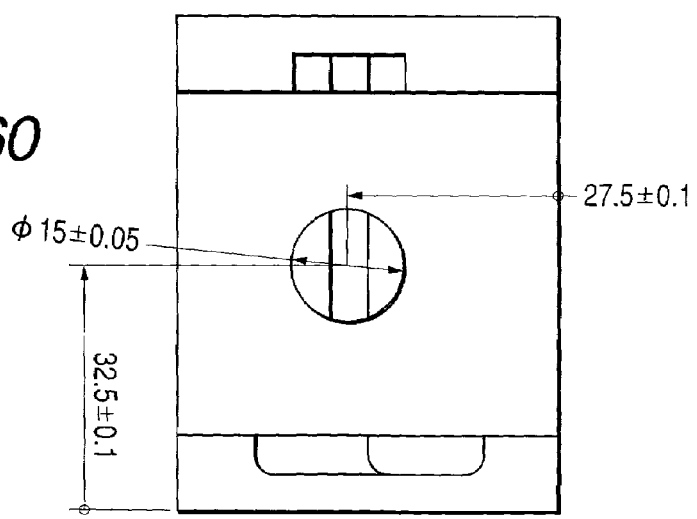
FIG. 60 is a drawing showing the 3D model viewed from a view G shown in FIG. 58.

It is also possible to employ a configuration with a plurality of views from which the shape of the 3D model 1 appears identical. FIG. 58 shows a view F and a view G having the same visual axis direction, magnification, center position, and visual axis position. In this example the views F, G are directed to the plan view of the 3D model 1. When the attribute information is, for example, grouped and associated with each of the views, better discernible attribute information can be substantiated. For example, FIG. 59 is a drawing in which the attribute information concerning the contour dimensions is grouped on the plan view of the 3D model 1. FIG. 60 is a drawing in which the attribute information concerning the hole position and hole shape is grouped on the plan view. The attribute information groups are associated each with the view F and the view G, respectively. When the associated attribute information is grouped and allocated to the views in this way, the related attribute information becomes better discernible.

5.3 Magnification of View

When the magnification of a view is set at a desired magnification, a complicated shape or a detailed shape becomes easier to view.

In the present embodiment, it is effective to the entire 3D-CAD, regardless of the hardware composing the 3D-CAD apparatus or the constituting method of the 3D geometric model, and further to the 2D-CAD.

6. Position of Attribute Information

In order to express a 3D model and attribute information added to the 3D model on an extremely discernible basis as a two-dimensional drawing on the display screen, the operator selects a plurality of attribute information pieces for each part of the 3D model to be expressed, according to necessity or groups them to associate the group with an attribute arrangement plane. In the representing method of two-dimensional drawings, the attribute information can be located in a region in the visual axis direction of the related attribute arrangement plane. However, in the case of the so-called "3D drawing" being a drawing with the attribute information added to the 3D model, there is a need for some device to make full use of the merits of the 3D model.

One of the merits of the 3D model is that, since a model can be stereoscopically represented in a form close to a real object on the display screen, the operator preparing the model or the operators in subsequent steps using the model (process designer, mold designer and manufacturer, measuring engineers, etc.) do not have to perform the conversion work from two dimensions necessary for handling of two-dimensional drawings to three dimensions (which has been performed heretofore mainly in the operator's head). This conversion work is greatly dependent upon skills of operators, and, in turn, there can occur incorrect production or loss of conversion time due to wrong conversion in this conversion work.

In order to avoid deterioration of the stereoscopic representation being the merit of the 3D model in the 3D drawing, there is a need for some device in the display of the attribute information (the position of the attribute information) in the stereoscopic display.

Such device points will be described below with FIGS. 28A to 28D.

Figure 28A:
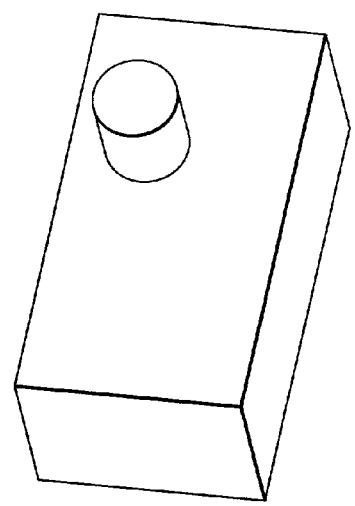
FIGS. 28A, 28B, 28C and 28D are drawings showing an example of the 3D model.
Figure 28B:
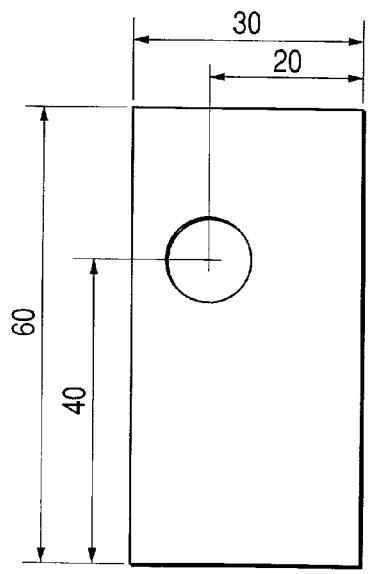
Figure 28C:
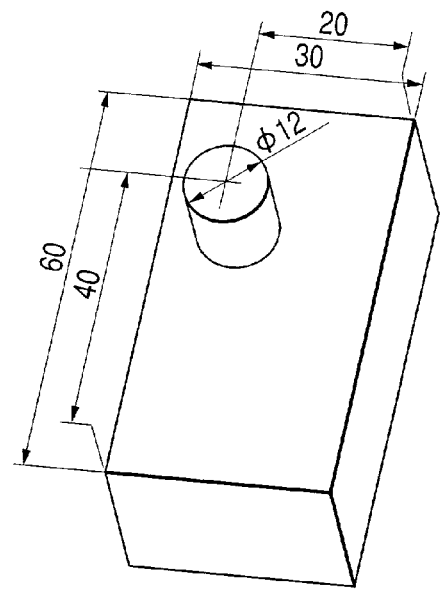
Figure 28D:
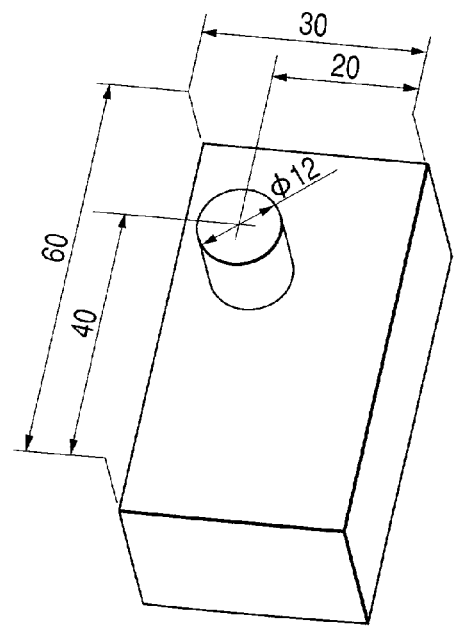
Figure 29A:
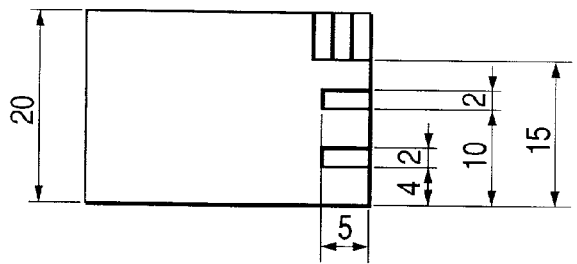
FIGS. 29A, 29B, 29C, 29D and 29E are drawings for explaining a two-dimensionally expressed state of the 3D model and attribute information.
Figure 29B:
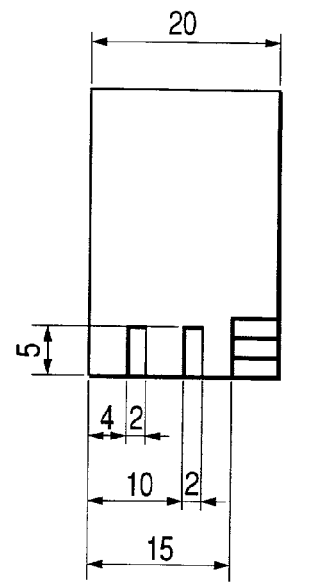
Figure 29C:
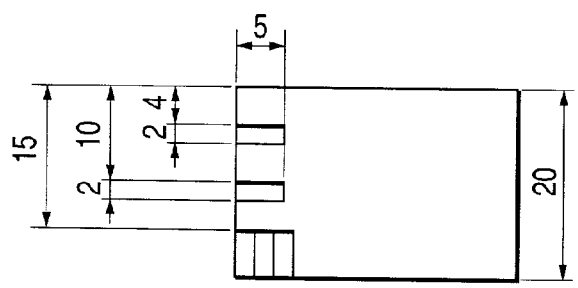
Figure 29D:
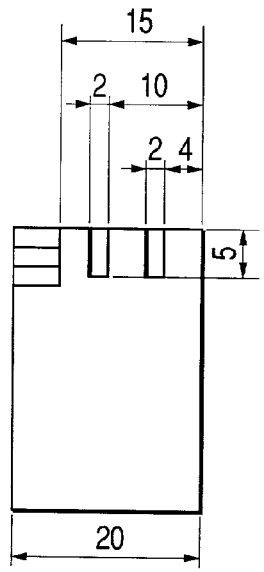
Figure 29E:
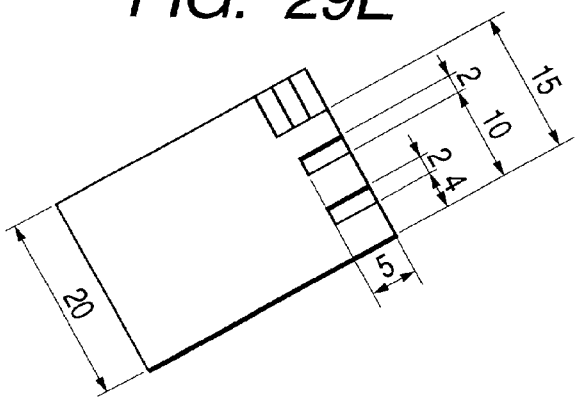

FIG. 28A is a perspective view of a 3D model 2 used in the description, FIG. 28B a plan view of the 3D model 2, FIG. 28C a perspective view to illustrate a state in which the attribute information is added to the 3D model 2 without any device, and FIG. 28D a perspective view with some device for the arrangement of the attribute information.

First carried out for the 3D model 2 is preparation of the attribute arrangement plane 218 and input of attribute information for preparing a two-dimensional plan view. A display state from the view point of this attribute arrangement plane 218 is presented in FIG. 28B.

Concerning the input of attribute information, if the arrangement planes of plural attribute information pieces are arranged in a staggered configuration as shown in FIG. 28C, it becomes hard to discriminate the contents of the attribute information pieces as overlapping with each other. Since even the small number of attribute information pieces are hard to view as in FIG. 28C, it is needless to mention that in a more complicated shape, the attribute information is no longer useful information and it can be readily speculated that the view in an oblique state cannot serve well as a drawing.

However, if the attribute information pieces are arranged within the same plane as in FIG. 28D, the attribute information pieces can be prevented from overlapping with each other and it becomes easy to discriminate the attribute information pieces in much the same manner as in the case of the representation of two-dimensional drawings (FIG. 28B).

This realizes the 2D-like drawing representation in the drawing form with the attribute information added to the 3D model (three-dimensional drawing) and facilitates the discrimination of attribute information pieces in the stereoscopic representation of the 3D model, which is the merit of the 3D model, thus enabling use as a stereoscopic drawing (3D drawing).

It is desirable to place the arrangement plane of attribute information on the same plane as the attribute arrangement plane.

Although in this example the 3D model was of the simple shape, it is necessary to set a plurality of attribute arrangement planes in the same visual axis direction in order to handle an actual 3D model having a more complicated shape.

A conceivable case is that a plurality of attribute arrangement planes and attribute information pieces associated therewith are simultaneously displayed and a desired attribute arrangement plane or attribute information piece is then selected.

If the arrangement plane of attribute information is set apart from the position of the attribute arrangement plane the relation would be uncertain between the attribute information and the attribute arrangement plane and there can possibly occur a case of incorrect selection. In order to avoid it, the attribute information is preferably placed on the same plane as the attribute arrangement plane in order to facilitate visual recognition of the relation.

Further, on the occasion of preparing the attribute arrangement planes in the identical visual axis direction, as was described referring to FIG. 20, it is preferable to arrange the plural attribute arrangement planes of the identical visual axis direction apart from each other. In the simultaneous display of the plural attribute arrangement planes and the attribute information associated therewith, if the attribute arrangement planes are prepared on the same plane, the arrangement planes of the attribute information pieces will be also placed on the same plane and thus the attribute information pieces become hard to discriminate from each other in an overlapping state, not only in the visual axis direction but also in an oblique direction relative to the visual axis direction. In the first place, there are a lot of attribute information pieces on the view in the same direction and thus a plurality of attribute arrangement planes are used. Therefore, the attribute information pieces inevitably overlap each other in the simultaneous display of the attribute information pieces.

Although the indiscernibility from the visual axis direction is beyond a remedy, it is effective to arrange the attribute arrangement planes of the identical visual axis direction apart from each other, as means for making the attribute information pieces better discernible in the oblique state.

7. Magnification

When the magnification of the attribute arrangement plane is set at a desired magnification, a complicated shape or a detailed shape becomes more discernible.

Figure 23A:
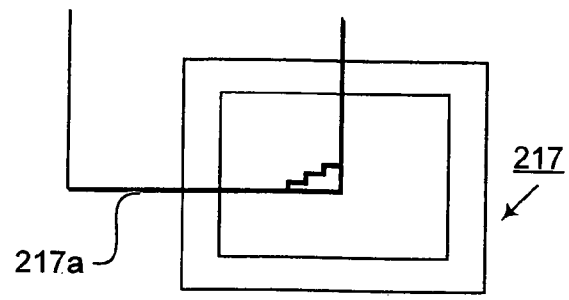
FIGS. 23A, 23B and 23C are drawings showing a case in which an attribute arrangement plane is allocated to a portion of the 3D model.
Figure 23B:
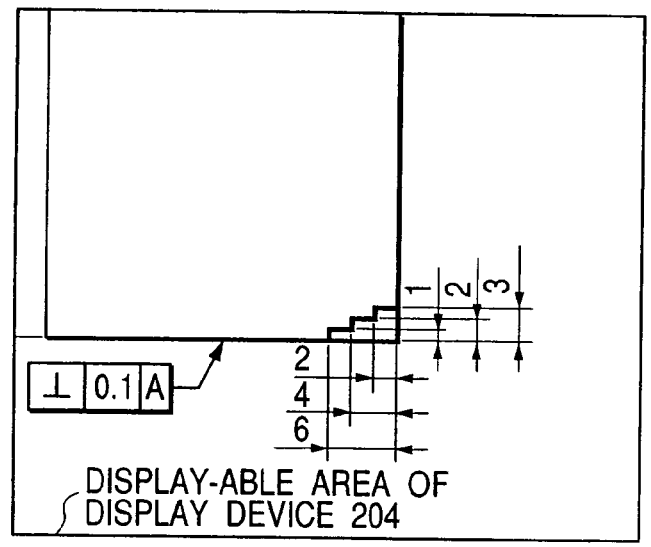
Figure 23C:
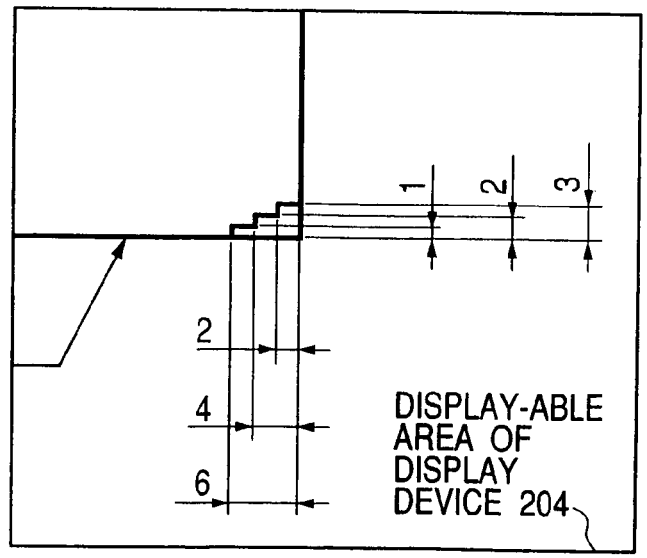
Figure 24:
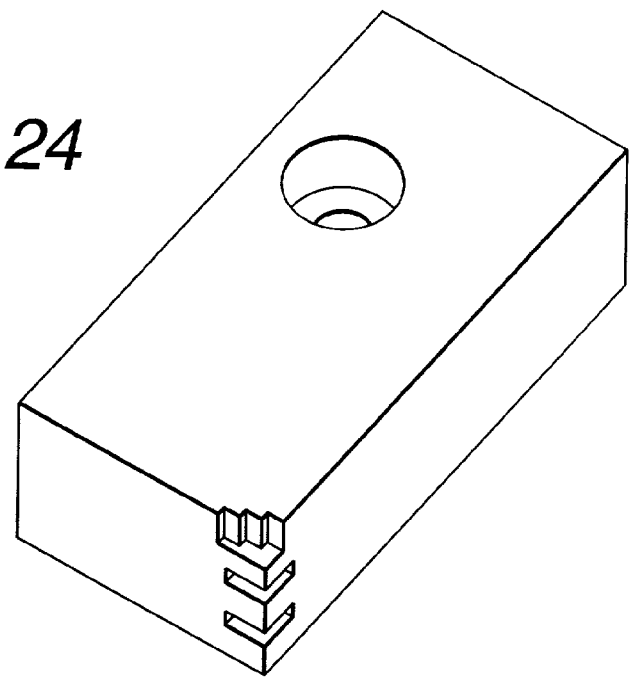
FIG. 24 is a drawing showing an example of the 3D model.

FIGS. 23A to 23C is drawings to show an enlarged display state of part of the 3D model 1. For example, when the attribute arrangement plane 217 is set for the 3D model 1 so that the visual axis direction is directed to the plan view, the view point position is located near a corner, and the magnification is, for example, 5×, as shown in FIG. 23A, the stepped shape and attribute information can be displayed in an extremely readily discernible manner (FIG. 23B). In this case, all the attribute information pieces associated with the attribute arrangement plane 217 are also placed in the frame 217a. The attribute arrangement plane 217 is equivalent to a so-called local projection drawing. All the associated attribute information can be recognized by viewing only the interior of the frame 217a and there is no need for checking presence/absence of attribute information to the 3D model outside the frame 217a at all, which permits implementation of efficient works.

In the present embodiment, it is effective to the entire 3D-CAD, regardless of the hardware constituting the 3D-CAD apparatus or the constituting method of the 3D geometric model, and further to the 2D-CAD.

8. Magnification and Size of Attribute Information

The size (the height of letters and symbols) of the attribute information associated with the attribute arrangement plane is adapted to change according to the magnification of the attribute arrangement plane (FIG. 23B).

The size (mm) of the attribute information is defined as a size in the virtual three-dimensional space in which the 3D model exists (which is not the size in the display state on the display device 204).

For example, let us suppose the size of the attribute information is 3 mm (at the magnification of 1) on the attribute arrangement plane 211. FIG. 23C shows a display example in which the letter height is 3 mm similarly (at the magnification of 5) on the attribute arrangement plane 217.

Since the attribute information associated with the attribute arrangement plane 217 is displayed at the display magnification of 5×, the size of the attribute information becomes 15 mm.

In FIGS. 23B and 23C the rectangular box indicates a permissible display range on the display device 204.

If the attribute information pieces are arranged without overlap, there is a possibility of incorrect reading, because the positions of the 3D model and attribute information become apart from each other and the relation would be uncertain between the shape and the attribute information associated therewith. If there are a lot of attribute information pieces to be displayed, all the attribute information pieces might not be displayed on the display device 204 and there will arise a need for cumbersome operation of changing the display range in order to check the attribute information present outside the permissible display range.

In the case of reduced display (at the magnification of less than 1), without any change in the size of letters, the display size of the attribute information will be too small in a reduced drawing display state on the display device 204 to discriminate the contents of the attribute information.

It is thus desirable to change the size of the attribute information according to the magnification in consideration of the display state of the attribute information.

Therefore, the magnification and the size of the attribute information are preferably set approximately in the inversely proportional relation. As an example, where the magnification of the foregoing attribute arrangement plane 211 is 1 and the size of the attribute information is 3, the size of the attribute information associated with the attribute arrangement plane 217 is set to 0.6 mm.

The attribute information is associated with the attribute arrangement plane as described above, but a 3D model of complicated shape is provided with a lot of attribute information pieces as a matter of course, so that a lot of attribute arrangement planes to be associated therewith are also set. In this case, frames of the attribute arrangement planes displayed on the display device or name labels displayed on the frames overlap each other and there can occur circumstances where it is difficult to visually recognize the existence thereof readily.

In the present invention, therefore, where there exist a lot of attribute arrangement planes as described above, the setting of frames is changed so as to avoid the overlap of the frames or name labels. An example of an executing method of the setting change will be described below.

9. Method of Changing Setting of Frames of Attribute Arrangement Planes

The following will exemplify a method of changing the setting of frames of attribute arrangement planes.

Figure 34:
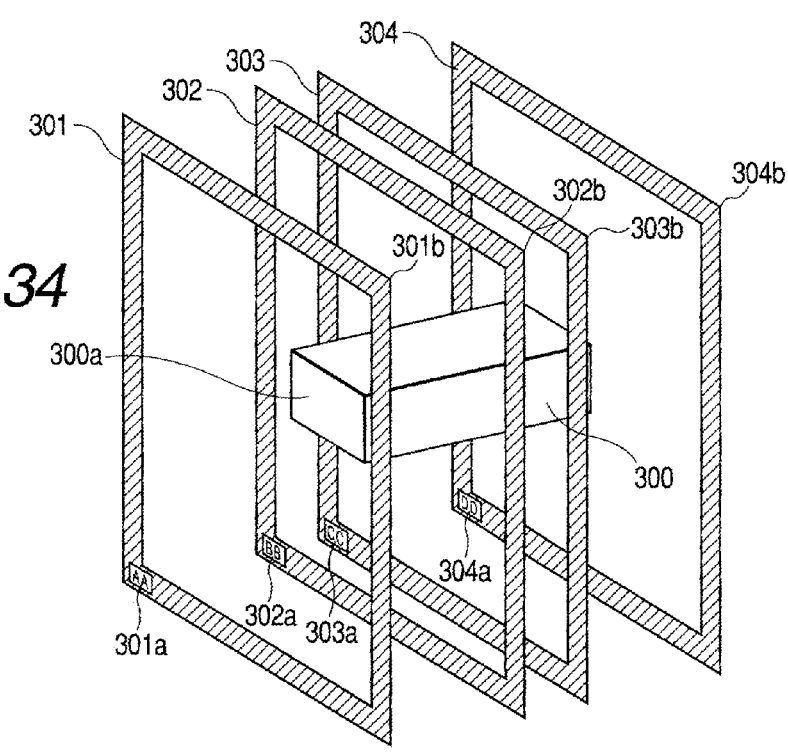
FIG. 34 is an explanatory diagram showing a state in which a plurality of attribute arrangement planes are set for a 3D model.
Figure 35:
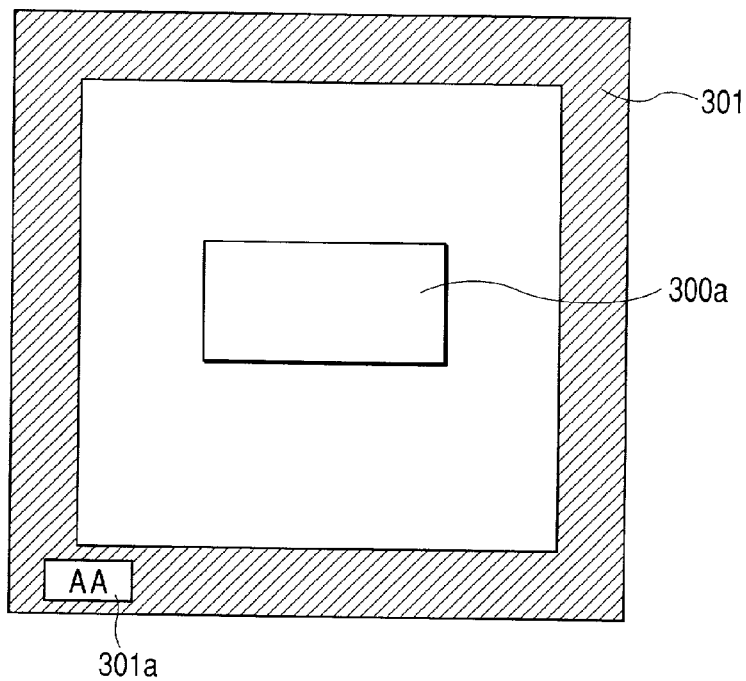
FIG. 35 is an explanatory diagram showing a state in which the 3D model is rotated from the state of FIG. 34.
Figure 36:
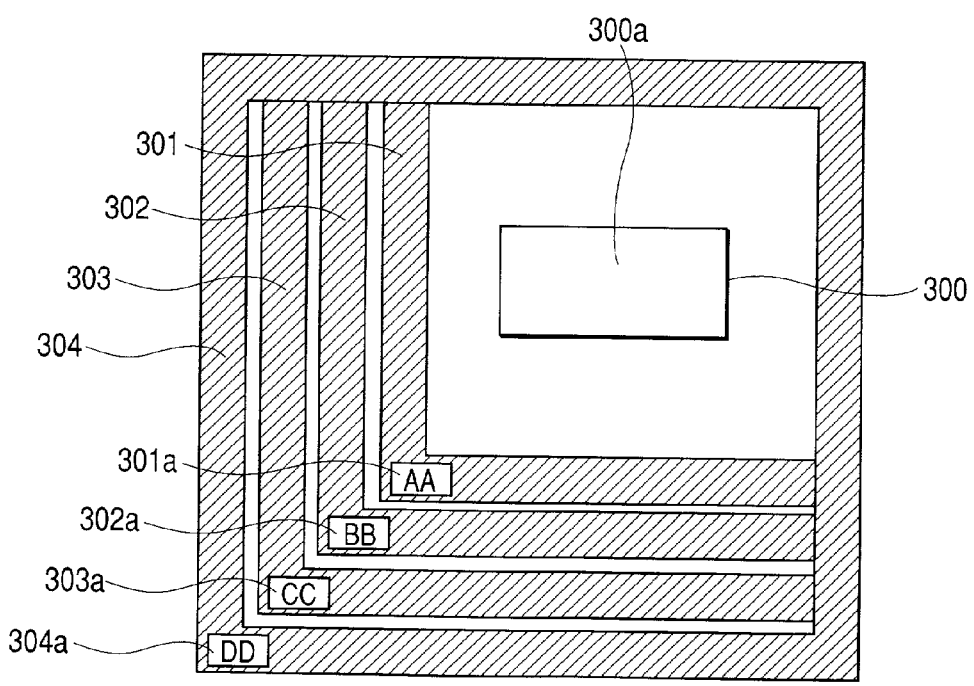
FIG. 36 is an explanatory diagram showing a state in which the frame setting is changed from the state of FIG. 35.
Figure 37:
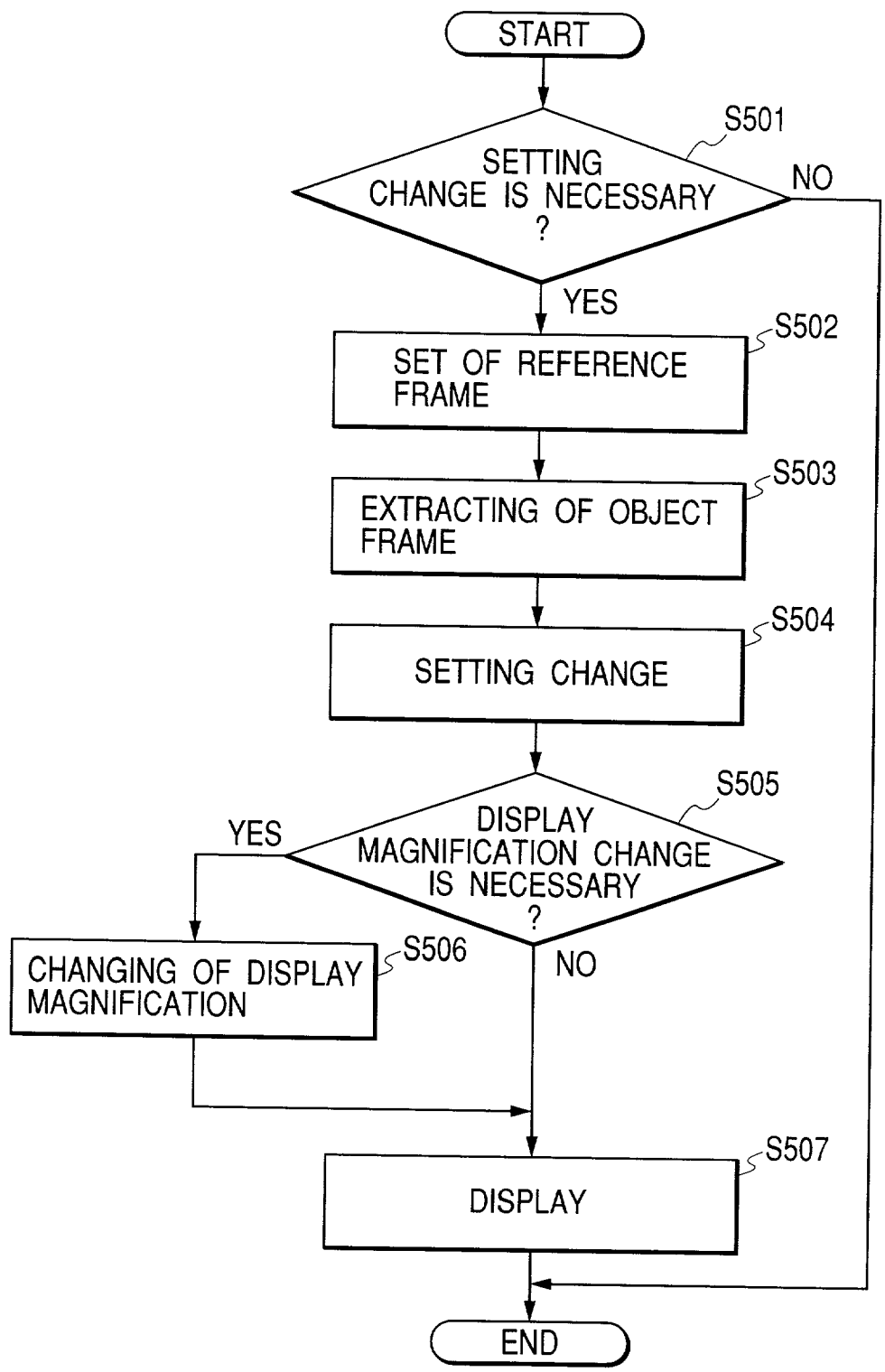
FIG. 37 is a flowchart showing the procedure of the frame setting change.
Figure 38:
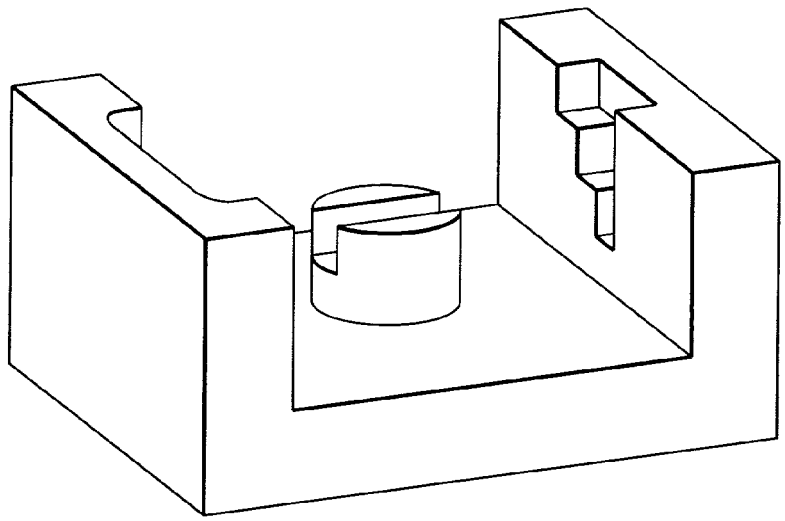
FIG. 38 is a drawing showing an example of the 3D model.

FIG. 34 is an explanatory drawing to show a state in which a plurality of attribute arrangement planes (four planes in this example) are set for a 3D model. FIG. 35 is an explanatory drawing to show a view in a direction normal to a surface 300*a* of the 3D model as rotated from the state of FIG. 34. FIG. 36 is an explanatory drawing to show a state in which the setting of frames is changed from the state of FIG. 35. In these drawings, the attribute information associated with the attribute arrangement planes is omitted, and the 3D model is a rectangular parallelepiped of simple shape. FIG. 37 is a flowchart showing the procedure of changing the setting of frames.

In the drawings, numeral 300 designates the 3D model, and numerals 301, 302, 303, and 304 the frames set for the respective attribute arrangement planes. The frame 301 is a frame of an attribute arrangement plane the visual axis direction of which is a direction Z1 perpendicular to the surface 300*a* of the 3D model 300. The frames 302, 303 are frames of attribute arrangement planes each of which is set in parallel with the frame 301 and in the same visual axis direction. Each frame 302, 303 of the attribute arrangement planes is a frame of an attribute arrangement plane for representing a crossing position across the 3D model 300, i.e., a sectional shape of the 3D model 300. The frame 304 is a frame of an attribute arrangement plane set in parallel with the frame 301 and in the reverse visual axis direction to that of the frame 301. Symbols 301*a*, 302*a*, 303*a*, and 304*a* are name labels representing names of the respective attribute arrangement planes.

When the 3D model 300 is rotated from the state shown in FIG. 34 so as to oppose the surface 300*a* to the operator's visual axis, the frames 301, 302, 303, 304 overlap each other as shown in FIG. 35, so that the operator cannot recognize the name labels 302*a*, 303*a*, 304*a* except for the name label 301*a* of the frame 301 placed at the foremost position. Even if the frames were displayed in a semi-transparent state, it would be hard to recognize the arrangement order of the frames. If the display positions of the name labels were located at an identical location, characters would overlap each other, so as to make it difficult to read the characters.

Therefore, the present embodiment is configured to change the frame regions in the case where this state is supposed.

The changing operation will be described below according to the flowchart (FIG. 37).

At the first step S501, it is determined whether the change of the setting of frames is necessary. This determination can be made by a method of preliminarily setting a condition for necessity for the setting change, such as an overlap degree of name labels or the like, and automatically determining the necessity for the change with reference to the condition, or the setting change may be executed when the operator judges it necessary. The above determination operation is preferably executed in a stationary state of the 3D model, rather than being executed during rotation, movement, or enlargement or reduction (zooming-in or out) of the 3D model. The reason is that the foregoing rotation or the like is executed at will by the operator and if unintended setting change of frames is effected during the rotation or the like the unpredictable change of the display state will cause wrong operation or wrong interpretation.

When it is determined at step S501 that the setting change is unnecessary, the processing is ended.

When it is determined at step S501 that the setting change is necessary, the flow goes to step S502 to select a frame as a reference for the setting change. The frame of the reference is desirably a frame located at the foremost position on the display of the display device, but it also becomes feasible to select any frame if the selection reference is set variable.

At step S503, every frame as an object of the setting change is extracted. As an example of the extraction, there is a method of extracting as an extraction object a frame of every attribute arrangement plane set in parallel with the attribute arrangement plane of the reference, but it is also possible to select every frame set in a certain angular range, as an extraction object or to allow the operator to select the object freely. The order of step S502 and step S503 may be reversed.

At step S504, the setting of frames is changed so as to prevent the name labels of the frames from overlapping each other. An example of the setting change is a method of fixing the region of the frame being the reference located at the foremost position on the display screen, fixing vertexes 302*b*, 303*b*, 304*b* of the respective frames 302, 303, 304 corresponding to the vertex 301*b* diagonal to the vertex closest to the arrangement position of the name label out of the four vertexes of the frame, and enlarging the regions of the frames 302, 303, 304 into similar shapes to the reference frame. At this time, the frames are enlarged to respective positions where the name labels do not overlap each other, in order from this side on the display screen, whereby the operator can visually recognize the depthwise arrangement order of the frames on the display screen. If a different display color is used for every display label set in the reverse direction to the visual axis direction of the attribute arrangement plane of the reference, the visual axis directions can also be visually recognized. The setting change method at step S504 is not limited to this example, but another method may be, for example, a method of enlarging each entire frame into a rectangular frame one size larger.

At step S505, it is determined whether change of display magnification is necessary, by checking whether all the frames having been displayed on the display device before the change can be included in the display screen. When all the frames are within the display screen after the enlargement of the frames, the flow goes to step S507 to display them on the display device and end the processing. When all the frames are not within the display screen, the flow goes to step S506 to change the display magnification (reduce the magnification in this case) and then goes to step S507 to display the frames on the display device. At this time, the change of display magnification may be set so as to be automatically executed, or it is also possible to give only notification when the frames are not within the display screen, and allow the operator to determine whether the change is to be executed. It is also possible to allow the operator to preliminarily set freely whether the change of display magnification is to be executed.

After completion of the processing of the setting change, the display is given in the state shown in FIG. 36.

10. Selection of Plural Attribute Arrangement Planes

The above-stated embodiment was configured to select only one attribute arrangement plane as a selection object in order to display the attribute information associated with the attribute arrangement plane, but selection of plural attribute arrangement planes should be allowed in view of the object of the present invention, which will be described below.

While in the case of selecting a single attribute arrangement plane there is only one display method on the display device because of the single view point position and visual axis direction, there are plural display methods in the selection case of plural planes and there is thus a need for some device, however. For example, in the case of selection of plural planes, a conceivable method is to display all the attribute information pieces associated with the selected attribute arrangement planes and allow selection of which setting of attribute arrangement plane is to be employed for the view point position and the visual axis direction.

The display of attribute information is provided with some device to make the group readily discriminable, e.g., by changing the color for every group of related attribute arrangement planes.

11. Setting of Horizontal or Vertical Direction of Attribute Arrangement Plane

The present invention was described above as to the setting of only the view point position, visual axis direction, and magnification for the attribute arrangement plane, but there was no description about the setting of the horizontal or vertical direction of the attribute arrangement plane.

For the two-dimensional drawings, there are rules provided as to the arrangement of drawings (plan view, front view, side views) from the respective visual axis directions, as shown in FIG. 25. This is the device for facilitating understanding of the relation among the positions from the visual axis directions, because an actual stereoscopic shape is expressed on the two-dimensional planes.

On the other hand, in the 3D drawing form as a drawing with the attribute information added to the 3D model, it is possible to provide the two-dimensional expressions (FIG. 9, FIG. 10B, and FIG. 11B) as views in the directions perpendicular to the contour surfaces of the 3D model as a matter of course and also provide stereoscopic expressions as views from oblique directions (FIG. 10A, and FIG. 11A) of the 3D model as rotated from the two-dimensional states.

In the 3D drawing form, therefore, there is no need for especially determining the horizontal direction or vertical direction of the attribute arrangement plane (on the assumption that the horizontal direction or vertical direction agrees with that of the display screen) on the occasion of display of the plan view, front view, and side views. As long as the 3D model and the attribute information added thereto can be correctly expressed, it can be the that any one of shown in FIGS. 29A to 29E is a correct expression. Further, the 3D model can be stereoscopically expressed by rotating the 3D model a little, and the operator can readily appreciate which part was being viewed in the entire 3D model or readily recognize the locations of plan view and side views from other visual axis directions. Therefore, there will arise no specific problem even if the display is given without any attention to the positional relation among the visual axis directions as to the horizontal direction or vertical direction of the attribute arrangement plane.

However, all the operators handling the 3D drawings in the 3D drawing form with the attribute information added to the 3D model can not be always under circumstances where they are allowed to display the 3D model while freely rotating it. It is because there are workplaces and others where without any correction for the 3D drawings the two-dimensional images displayed on the respective attribute arrangement planes are stored and viewed in the two-dimensional image information electronic data format and this is enough to perform their jobs. There are also workplaces and others where no other drawing than the conventional paper drawings is acceptable.

Considering these circumstances, rules like those for the two-dimensional drawings have to be applied to the displays from the respective visual axis directions.

It is thus necessary to set the horizontal direction or vertical direction in the display on the display device 204 upon the preparation of the attribute arrangement plane.

Figure 30:
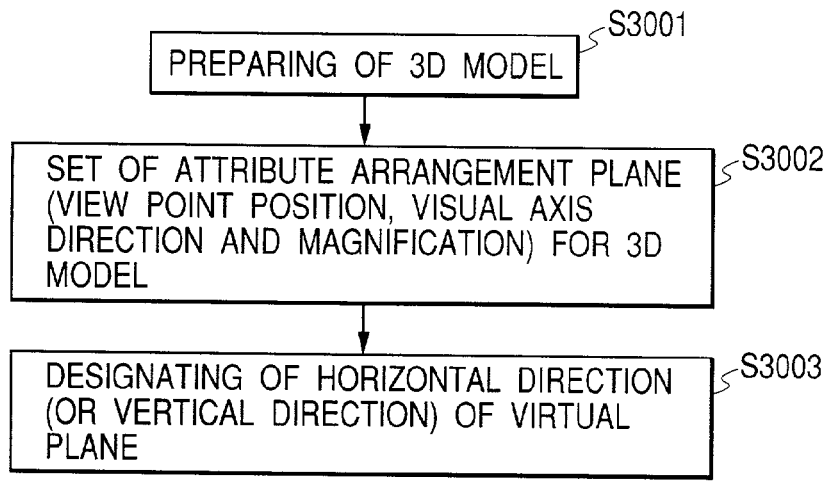
FIG. 30 is a flowchart showing a processing operation of setting of a display direction of an attribute arrangement plane.

FIG. 30 shows a flowchart of the processing.

First, the 3D model is prepared (step S3001).

At the next step, the position of the view point, the visual axis direction, and the magnification are set for the 3D model to generate an attribute arrangement plane (step S3002).

Then the horizontal direction (or the vertical direction) of this attribute arrangement plane is designated (step S3003). For designating the horizontal direction (or the vertical direction), a potential way is to select directions (X, Y, and Z) of three axes present on the (virtual) 3D space, or another potential way is to select a direction of an edge or the vertical direction of a surface of the 3D model.

By designating the horizontal direction (or the vertical direction) of the attribute arrangement plane, the display positions of the 3D model and the attribute information displayed by selection of the attribute arrangement plane are uniquely determined.

For preparation of another attribute arrangement plane, the horizontal direction (or the vertical direction) can be designated while maintaining the relation with the visual axis direction of the attribute arrangement plane having already been prepared.

12. Display Method of Attribute Information

In the above embodiment the order of selectively displaying the attribute information inputted into the 3D model was described in the order of first selecting the attribute arrangement plane and then properly displaying the attribute information associated with the attribute arrangement plane, but, without having to be limited to this method, it is also effective to employ a technique of first selecting the attribute information and then displaying the 3D model and the attribute information on the basis of the position of the view point, the visual axis direction, and the magnification of the attribute arrangement plane associated with the attribute information.

Figure 31:
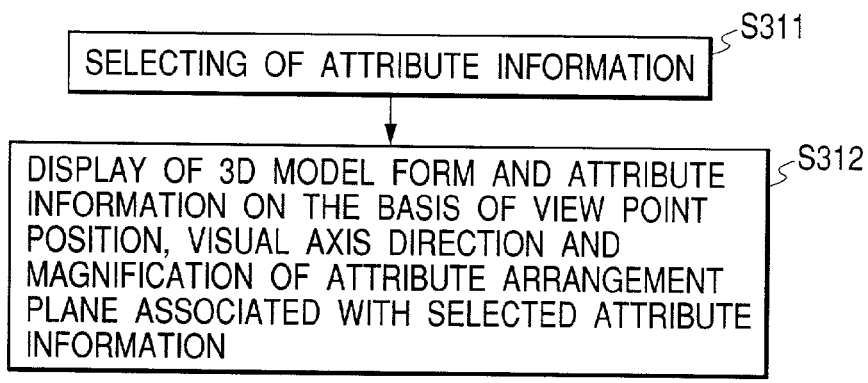
FIG. 31 is a flowchart of processing carried out for display of the 3D model, using the attribute information as a key.

FIG. 31 (selection of attribute information to display) is a flowchart showing the sequential processing operation.

In the display state of the 3D model and the attribute information as shown in FIG. 8, the hole diameter φ12±0.2 is selected (step 311).

The 3D drawing and the attribute information associated with the attribute arrangement plane 211 are displayed on the basis of the view point position, visual axis direction, and magnification set for the attribute arrangement plane 211 associated with the attribute information (step 312). In this case, the front view is displayed in an opposed state as shown in FIG. 9.

This results in two-dimensionally displaying the relation between the selected attribute information and the 3D model, thus facilitating recognition thereof.

12.1 Surface Selection Method

The above embodiment was described about the method of first selecting the attribute arrangement plane or the attribute information and then properly displaying the attribute information associated with the attribute arrangement plane on the basis of the setting of the selected attribute arrangement plane or the attribute arrangement plane associated with the attribute information, as the order of selectively displaying the attribute information inputted into the 3D model. However, the present invention is not limited to this method. Another effective technique is a method of selecting the geometric information (Geometry) of the 3D model, displaying the attribute information associated with the geometric information, and further displaying the 3D model and the attribute information on the basis of the view point position, visual axis direction, and magnification of the attribute arrangement plane associated with the attribute information.

Figure 32:
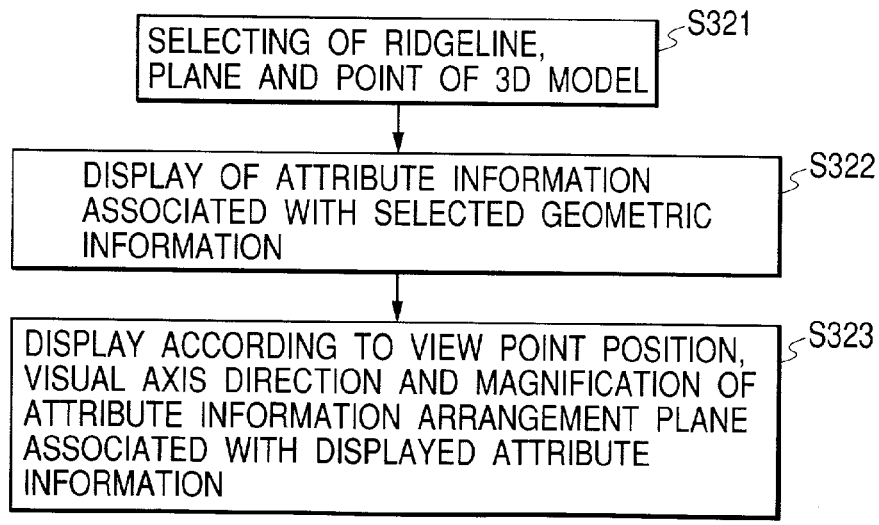
FIG. 32 is a flowchart of processing carried out for display of the 3D model, using geometric information as a key.

FIG. 32 (selection of attribute information to display) is a flowchart showing this sequential processing operation.

The geometric information (an edge, a surface, or a vertex) of the 3D model is selected (step 321).

The attribute information associated with the selected geometric information is displayed (step 322).

If there exist a plurality of attribute information pieces associated with the selected geometric information, all of them may be displayed. It is also permissible to display all the attribute information pieces belonging to attribute arrangement planes associated with the attribute information.

Then the 3D model and the attribute information pieces are displayed based on the position of the view point, the visual axis direction, and the magnification (and the horizontal direction of the attribute arrangement plane) of the attribute arrangement plane associated with the displayed attribute information. On this occasion, if there are a plurality of candidates of attribute arrangement planes, the operator is allowed to select an object to be displayed.

Since this configuration permits the search and display for the associated attribute information, using the geometry of the 3D model as a key, it is easy to handle.

Geometry information selection→display of associated attribute information (single)→display at display position of associated attribute arrangement plane Geometry information selection→display of associated attribute information (single)→display at display position of associated attribute arrangement plane. Display of all the attribute information pieces associated with the attribute arrangement plane Geometry information selection→display of associated attribute information (plural)→display at display position of associated attribute arrangement plane (single attribute arrangement plane)

Geometry information selection→display of associated attribute information (plural)→display at display position of associated attribute arrangement plane (single attribute arrangement plane). Display of all the attribute information pieces associated with attribute arrangement plane Geometry information selection→display of associated attribute information (plural)→display at display positions of associated attribute arrangement planes (plural attribute arrangement planes)

Geometry information selection→display of associated attribute information (plural)→display at display positions of associated attribute arrangement planes (plural attribute arrangement planes). Display of all the attribute information pieces associated with the attribute arrangement planes 13. Display and Utilization Now, let us describe examples of display and utilization of the 3D model provided with the attribute information prepared as described above.

The 3D model provided with the attribute information prepared by the information processing apparatus shown in FIG. 2 can be displayed and utilized in each of the processes shown in FIG. 1, using the apparatus itself used for the preparation or using other similar information processing apparatus by transmitting the data of the 3D model prepared, through the external connection device.

First, the operator himself or herself, who prepared the 3D model and who is a design engineer or a designer of the product/unit or part, is allowed to display the 3D model prepared by himself or herself, in the opposed state as shown in FIG. 9, FIG. 10B, or FIG. 11B and is allowed to add new attribute information to the 3D model as if to prepare a two-dimensional drawing. For example, if the shape is complicated, the 3D display and the 2D display of the 3D model may be presented alternately or on the same screen as occasion may demand, whereby the operator can efficiently and accurately input the desired attribute information.

The operator in charge of checking and approving the 3D model thus prepared, displays the drawings of the prepared 3D model as shown in FIG. 9, FIG. 10B, and FIG. 11B on the same plane or selectively to check the model, and adds the attribute information of marks, symbols, or colors, etc. indicating completion of check, OK, NG, pending, need for examination, and so on. It is needless to mention that the check is conducted with comparison among plural products/units/parts and with reference thereto according to necessity.

Other design engineers or designers except for the creator of the prepared 3D model can also utilize the drawings on the occasion of designing other products/units/parts with reference to the prepared 3D model. The reference to the 3D model facilitates understanding of the creator's purposes or design techniques.

For fabricating or manufacturing the 3D model, the operator can utilize the drawings in order to add necessary information therefor to the 3D model or the attribute information. In this case, the operator is an engineer for setting the fabrication processes of the product/unit/part. The operator adds information, for example, instructions for types of machining processes, tools to be used, etc., or corner curvature and chamfering at edges, pointed portions, corners, etc. necessary for machining of the 3D model. In another case, the operator inputs instructions for measuring methods of dimensions, dimensional tolerances, etc., adds measurement points on the 3D model, and inputs information about care to be given in measurement, and so on. These are efficiently and accurately carried out while viewing the display of the drawings arranged and prepared in the discernible manner like FIG. 9, FIG. 10B, and FIG. 11B and checking the 3D shape as occasion may demand.

For fabricating or manufacturing the 3D model, the operator can utilize the drawings to obtain necessary information for desired preparation from the 3D model or the attribute information. In this case, the operator is a design engineer for designing a mold, jigs, various devices, etc. necessary for fabrication or manufacturing. The operator checks and extracts the necessary attribute information on the display of the drawings arranged and prepared in the discernible manner like FIG. 9, FIG. 10B, and FIG. 11B while understanding and capturing the shape of the 3D model in the three-dimensional state. On the basis of those attribute information, the operator designs the mold, jigs, various devices, and so on. For example, where the operator is a design engineer of the mold, the operator designs the mold while studying the configuration, structure, etc. of the mold from the 3D model and the attribute information. The operator also adds information about corner curvature and chamfering at edges, pointed portions, corners, etc. necessary for the fabrication of the mold as occasion may demand. When the mold is a mold for injection molding of resin, the operator adds, for example, drafts and others necessary for molding, to the 3D model.

The operators for fabricating or manufacturing the product/unit/part can also utilize the 3D model. In this case, the operators are machining engineers and assembling engineers of the product/unit/part. The operators machine or assemble the product/unit/part while viewing the display of the drawings arranged and prepared in the discernible manner like FIG. 9, FIG. 10B, and FIG. 11B and readily understanding and capturing the shape to be machined or the shape to be assembled on the display of the 3D model in the three-dimensional state. Then the operators check shapes of machined portions or assembled portions or the like as occasion may demand. It is also possible to add additional attribute information about completion of machining, difficulties in machining, results of machining, or the like to the 3D model or to the already given attribute information, and feed the information back to the design engineer and others.

The 3D model and the attribute information can also be utilized by other operators for inspecting, measuring, or evaluating the product/unit/part fabricated or manufactured. In this case, the operators are engineers for inspecting, measuring, or evaluating the product/unit/part. The operators efficiently and accurately obtain the information about measuring methods, measuring points, and care necessary for measurement concerning the dimensions, dimensional tolerances, etc. and execute inspection, measurement, or evaluation while viewing the display of the drawings arranged and prepared in the discernible manner like FIG. 9, FIG. 10B, and FIG. 11B and checking the three-dimensional shape as occasion may demand. Then the operators may add the results of inspection, measurement, or evaluation as attribute information to the 3D model as occasion may demand. For example, the operator adds the measurement results corresponding to the dimensions. The operator also adds marks or symbols or the like to the attribute information or the 3D model at defective portions outside the dimensional tolerances, with flaws, and so on. As in the case of the aforementioned check results, it is also possible to provide marks, symbols, or colors, or the like indicating completion of inspection, measurement, or evaluation.

The 3D model and the attribute information can also be utilized by other operators in various sections and posts related to the fabrication or manufacturing of the product/unit/part. In this case, the operators are, for example, a person in charge of analyzing the fabrication or manufacturing cost, a person in charge of ordering the product/unit/part itself, various related parts, etc., a person in charge of preparing a manual for the product/unit/part, packing materials, etc., and so on. In this case, the operators also efficiently carry out the various tasks while viewing the display of the drawings arranged and prepared in the discernible manner like FIG. 9, FIG. 10B, and FIG. 11B and readily understanding and capturing the shape of the product/unit/part on the display of the 3D model in the three-dimensional state.

14. Input of Inspection Instructions

The following will describe the inspection instructions.

For inspecting the complete mold, part, etc., the 3D model is preliminarily provided with the dimensions and others and is displayed as described above.

In this process, the attribute information is inputted so that positions to be inspected can be clearly displayed on the set attribute arrangement planes.

Namely, the operator inputs an inspection order, inspection positions, inspection items, etc. for surfaces, lines, edges, etc. constituting the 3D model. Then the inspection is carried out in the specified order to reduce inspection man-hours.

The inspection items and positions are first inputted, thereby inputting the whole. Then the order of inspection is determined by a predetermined method to assign ordinal numbers to the respective items. In execution of actual inspection, when an ordinal number is designated, an attribute arrangement plane is selected and a surface or the like at a position to be inspected is displayed in a form different from others (in different color) on the displayed attribute arrangement plane, clearly showing the inspected position.

The result of the inspection is inputted for every inspection item designated and the necessity for remolding is judged.

As described above, the embodiments of the present invention permit the discernible screen to be presented by the simple operation, based on the set attribute arrangement planes and attribute information. The relation between the visual axis direction and attribute information can also be captured at a glance. Further, since the dimension values and others are preliminarily inputted, it is feasible to reduce the wrong reading due to operator's operation errors.

Since the operator can view only the information associated with the visual axis direction, the operator can readily gain necessary information.

Since volumes of attribute information in the same visual axis direction are allocated to a plurality of attribute arrangement planes, the discernible screen can be presented and the operator can readily gain necessary information.

When the attribute arrangement plane is set inside the 3D model, i.e., in cross sectional shape, the attribute information can be displayed in the discernible manner.

Since the size of the attribute information is changed according to the display magnification of the attribute arrangement plane, it can be properly expressed in the discernible manner.

Since the attribute information is placed on the attribute arrangement plane, the attribute information can be read even in the stereoscopic representation in an oblique state of the 3D model.

Since the operator can search for the attribute arrangement plane and view only the information associated with the attribute arrangement plane, using the attribute information as a key, the operator can readily gain the necessary information.

Since the operator can search for the attribute information and attribute arrangement plane and view only the information associated with the attribute arrangement plane, using the geometric information as a key, the operator can readily gain the necessary information.

15. Other Display Methods 15.1 Other Display Method 1

The above embodiment was described about the frame setting means for setting the frame so as to surround the arrangement range of the attribute information associated with the attribute arrangement plane, but the object of the embodiment can also be accomplished by first frame setting means for setting a first frame so as to surround the arrangement range of the attribute information associated with the attribute arrangement plane and second frame setting means for setting a second frame indicating existence of the attribute arrangement plane, which will be described below.

Figure 61:
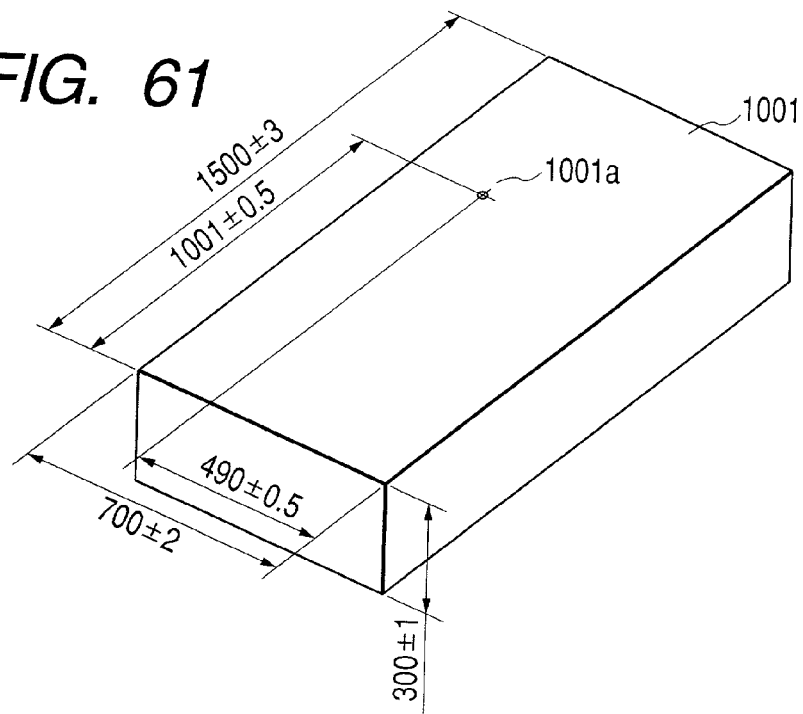
FIG. 61 is a drawing showing a 3D model and attribute information.

FIG. 61 shows a simple 3D model 1001 for the sake of explanation. The 3D model 1001 is of rectangular parallelepiped shape and has a very small hole 1001a relative to the contour in a surface. As apparent from FIG. 61, it is extremely hard to discriminate the shape of the hole 1001a in a view state of the entire contour. This situation like FIG. 61 is not special, but occurs very frequently in the case of parts of relatively large shape such as so-called packages, cases, or chassis, or the like of industrial products. Namely, such parts as described often have a small geometric part relative to the entire contour, e.g., a functional geometric portion at an interior side portion, a mount portion to another part, or the like.

In such cases, it is necessary to inform the operator of the existence of the geometric part provided with the attribute information of dimensions and others, and thus a second frame is displayed to indicate the existence of the attribute arrangement plane associated with the added attribute information. This second frame is preferably of rectangular shape as a typical example, but, without having to be limited to this, it may be of any shape that can indicate the existence of the attribute arrangement plane, such as a polygon, a circle, an ellipse, an elongated circle, or the like. Setting of the second frame is carried out by a well-known method for specifying and inputting so-called regions or various forms, e.g., a method of specifying two diagonal points of a rectangle, a method of specifying a center point of a rectangle and inputting the width and height thereof, a method of inputting a center and a radius of a circle, and so on. It is needless to mention that the setting and display of the second frame is carried out by the CPU device, internal storage device, input device, and display device.

Figure 62:
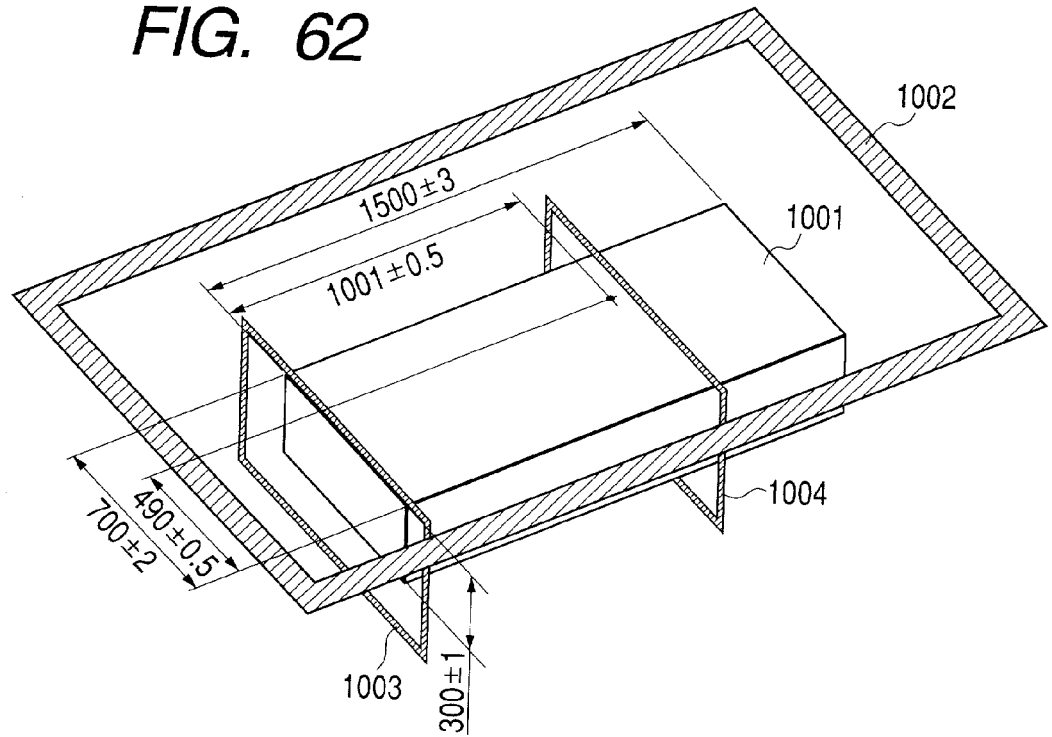
FIG. 62 is a drawing showing the 3D model, attribute information, and second frames.

A typical situation of the second frame is presented in FIG. 62. Displayed are a second frame 1002 indicating existence of an attribute arrangement plane equivalent to a plan view of the 3D model 1001, a second frame 1003 indicating existence of an attribute arrangement plane equivalent to a front view, and a second frame 1004 indicating existence of an attribute arrangement plane equivalent to a sectional view of the hole part 1001a.

Necessary attribute information is associated with each attribute arrangement plane. The four dimensions shown in FIG. 62 are associated with the attribute arrangement plane equivalent to the sectional view of the hole part 1001a, which has the frame 1004. In this case, as shown in FIG. 62, the size of the attribute information is set so that it becomes an appropriate and discernible size on the display at an appropriate and discernible display magnification of the hole part 1001a on the monitor screen. Conversely, when these attribute information pieces are displayed as shown in FIG. 61, they appear utterly indiscernible. When the 3D model is of complex shape, it is hard to discriminate the attribute information of a fine geometric portion, even existence thereof. However, the operator can capture the existence quicker by the second frame and thus can perform various works efficiently.

Figure 63:
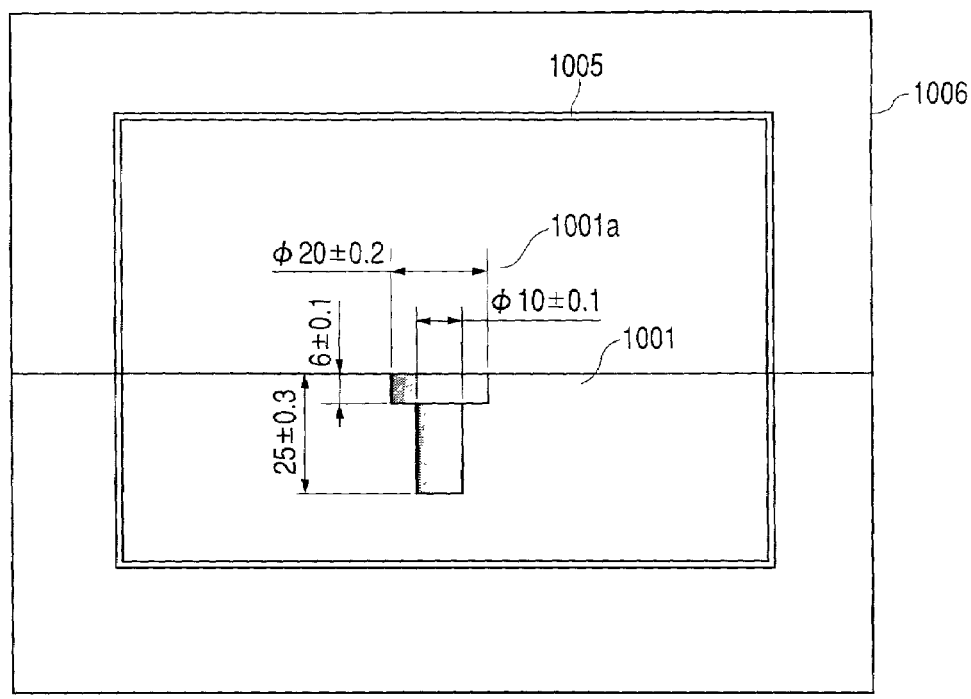
FIG. 63 is a drawing for explaining a cross section of a hole portion.

Further, the present embodiment is also configured to allow setting of the first frame indicating the arrangement range of the attribute information associated with the attribute arrangement plane. In FIG. 63, a first frame 1005 is set for an attribute arrangement plane so as to include the shape of the hole part 1001a and the four dimensions. The shape of this first frame 1005, or the setting and display thereof is also similar to those of the second frame.

Since all the attribute information pieces associated with the attribute arrangement plane are placed inside the first frame 1005, the operator is required only to view the attribute information and the shape inside the first frame 1005. This is effective in viewing the small geometric part as shown in FIG. 62, at a higher display magnification. If the first frame 1005 indicating the arrangement range of attribute information is absent, the operator has to check presence/absence of attribute information throughout the entire 3D model equivalent to the sectional view cut by the virtual plane having the second frame 1004. While only the hole part 1001a in the sectional view is desired to view, the observer has to view the entire cross section, which will considerably degrade the efficiency of work. If the second frame 1004 indicating the existence of the attribute arrangement plane associated with the attribute information is absent, the operator has to find out the first frame 1005 smaller than the second frame 1004, which will degrade the efficiency of work. Further, in the case of the 3D model of complex shape, the operator might fail to find out the first frame 1005 or fail to notice the existence thereof, which will cause terrible trouble in various works.

According to the present embodiment, the operator can readily know the existence of the attribute arrangement plane by the second frame and extremely easily view the necessary information in the necessary range by the first frame, thereby achieving extremely efficient works.

Figure 64:
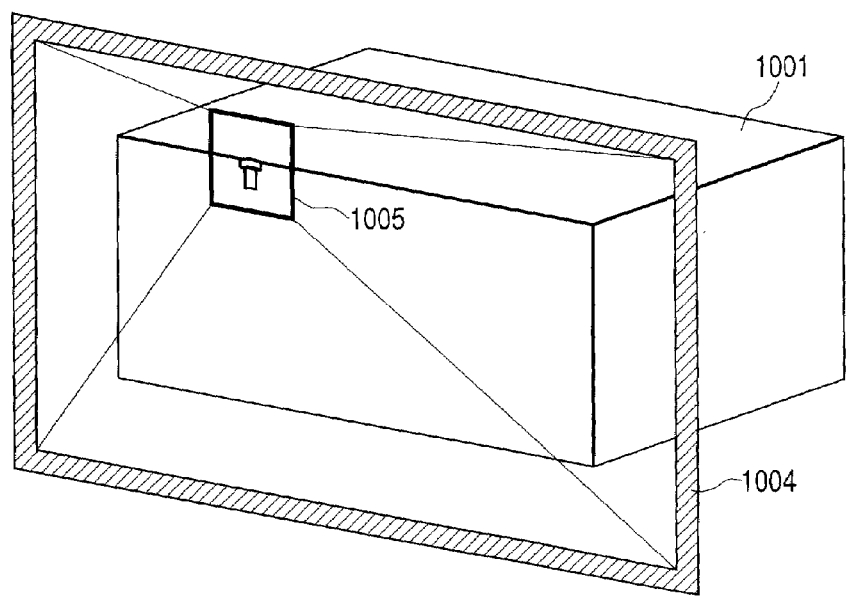
FIG. 64 is a drawing showing a relation between a first frame and a second frame.

It is also possible to employ such a treatment as to clearly show the position of the first frame against the second frame in the present embodiment, for example, as shown in FIG. 64.

In FIG. 64, lines connect the four vertexes of the second frame 1004 with the four vertexes of the corresponding first frame 1005 whereby the position of the first frame 1005 can be clearly shown against the second frame 1004. By clearly showing the position of the first frame 1005, it becomes feasible to select the first frame 1005 more easily and perform more efficient works.

In the above configuration, where the second frames 1002, 1003 surround the entire contour to represent the contour dimensions and others like the frames 211a, 212a, 213a in FIGS. 9, 10A, 10B, 11A and 11B of the aforementioned embodiment, the first frames corresponding to the second frames 1002, 1003 may be omitted and the frames 1002, 1003 are made to serve as the first frame and second frame.

Figure 65:
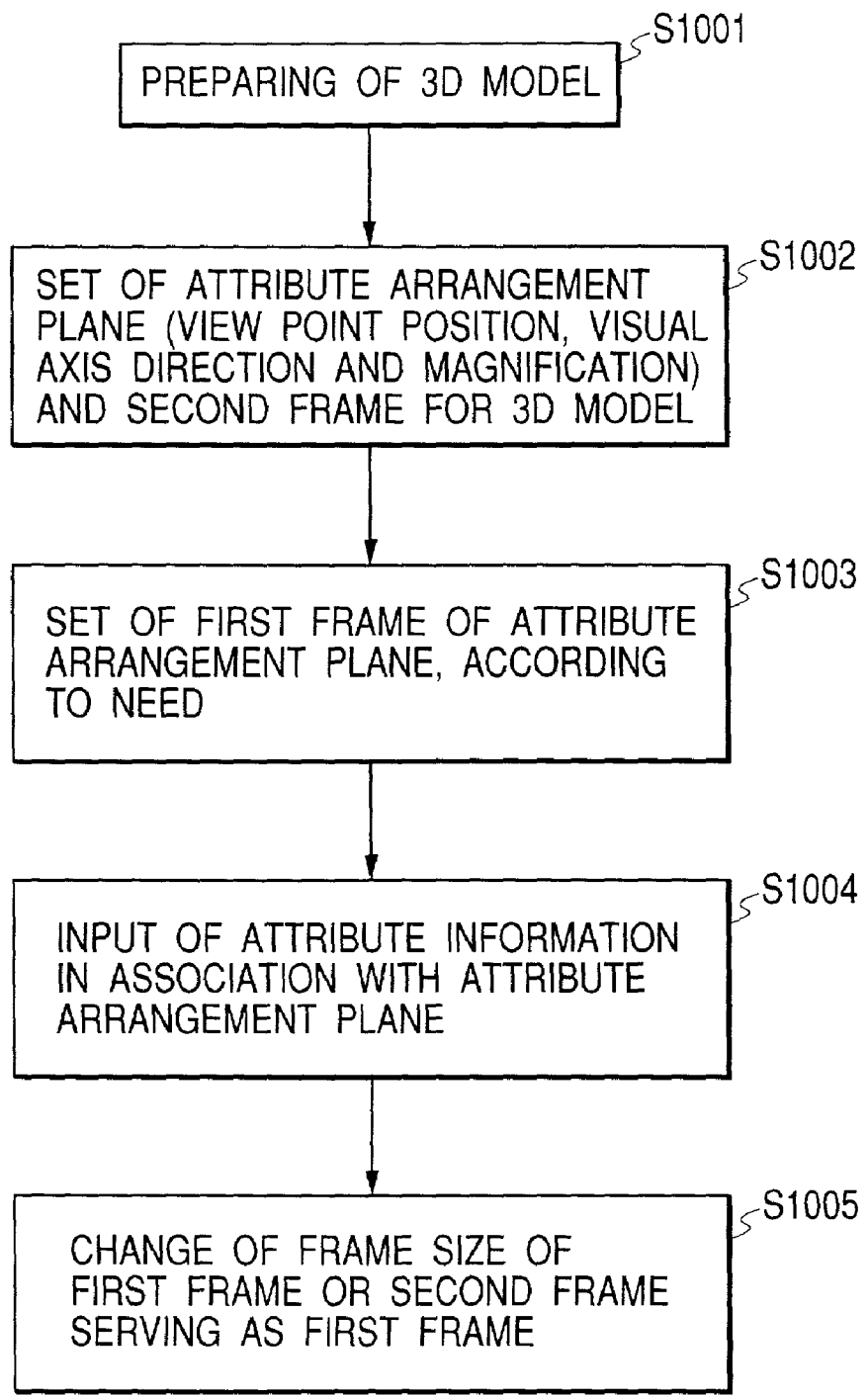
FIG. 65 is a flowchart showing a processing operation carried out when first and second frames of attribute arrangement planes are set for the 3D model.

A flowchart for the above contents is presented in FIG. 65. The 3D model is prepared at S1001, and at S1002 thereafter, every attribute arrangement plane is set and a second frame indicating the existence of each attribute arrangement plane is set. At S1003 thereafter, every first frame indicating the arrangement range of attribute information is set according to necessity. When a first frame is unnecessary, the second frame also serves as the first frame. At S1004 thereafter, the attribute information is inputted in association with the attribute arrangement plane, and at S1005, when some attribute information is placed outside a range of a first frame or a range of a first and second frame, the size of the first frame or the first and second frame is changed.

In the present embodiment, the attribute information added to the 3D model can be displayed and viewed simply, discernibly, and efficiently by the first frame setting means for setting the first frame so as to surround the arrangement range of the attribute information associated with the attribute arrangement plane and the second frame setting means for setting the second frame indicating the existence of the attribute arrangement plane.

15.2 Other Display Method 2

Another embodiment will be described as to the setting of the first frame set so as to surround the arrangement range of the attribute information associated with the attribute arrangement plane and the second frame indicating the existence of the attribute arrangement plane.

As described in the second embodiment above, the present invention is not limited to only the case where the second frame also serves as the first frame or where the first frame is set in part of the second frame, but the present invention can also be applied to any configuration as to the relative dimensions (size) or positional relation of the first frame and the second frame as long as it can accomplish the object of setting the first frame so as to surround the arrangement range of the attribute information associated with the attribute arrangement plane and permitting the second frame to indicate the existence of the attribute arrangement plane.

Figure 66:
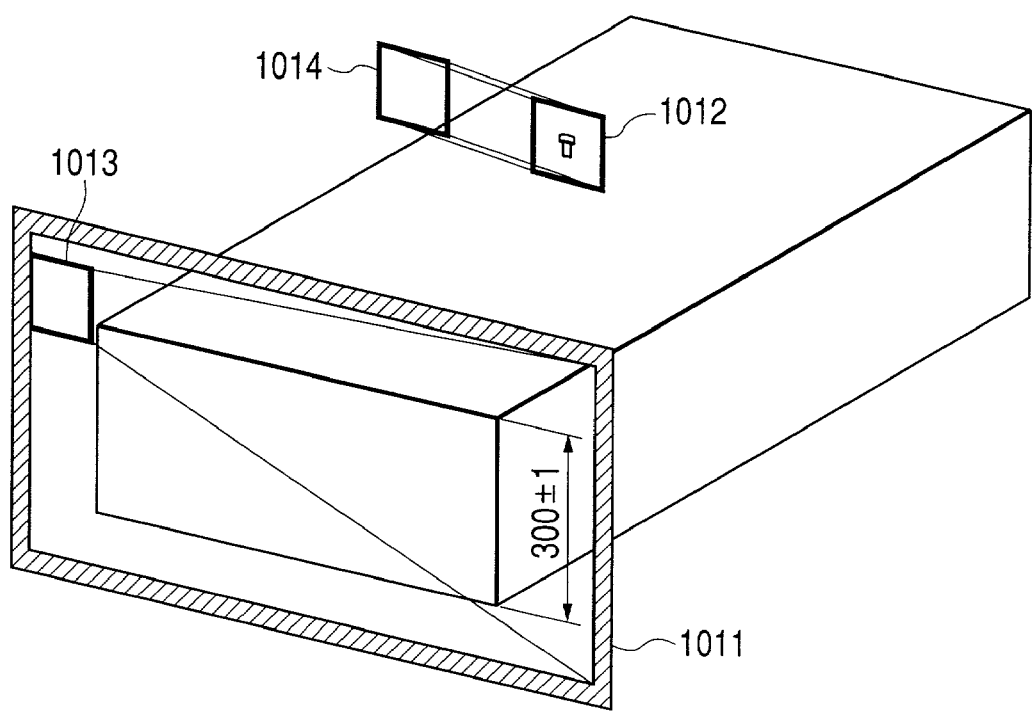
FIG. 66 is a drawing for explaining another embodiment concerning the first frame and the second frame.

For example, as shown in FIG. 66, second frames 1013, 1014 of an identical visual axis direction for respective attribute arrangement planes may be arranged in size smaller than the shape of the 3D model and in identical shape in the same visual axis direction. In this case, the first frame 1011 becomes larger than the second frame 1013, or the positions of the first frame 1012 and the second frame 1014 become different on the attribute arrangement plane. In this case, for providing the two-dimensional display as described in the aforementioned first embodiment, the display center is located at the center of the first frame 1011 or 1012.

The association between the first frame and the second frame is not limited to the connection of the corresponding vertexes by lines in the second embodiment, but there are no specific restrictions on methods of the association as long as the operator can understand the association between the first frame and the second frame. For example, the first frame and the second frame may be configured in different shapes or different line types, and the first frame and the second frame of identical color are associated with each other.

It is preferable to be able to set display or nondisplay of the first frame and the second frame independently of each other. For example, the operator displays only the second frames to search for a desired frame and then displays the first frame of the desired frame upon finding thereof. Then the two-dimensional drawing is presented based on the first frame to view the attribute information. At this time, the second frames are unnecessary and thus may be set in a nondisplay state.

16. Effects

According to the present invention, as described above, in the case where there are provided a lot of virtual planes associated with attribute information, it becomes feasible to avoid the overlap of the virtual planes with each other and suppress the deterioration of visibility, thereby permitting efficient works.

According to the present invention, it also becomes feasible to substantiate the easy, discernible, and efficient addition, display, and viewing of the attribute information of dimensions and others to the data prepared by the CAD apparatus or the like. The invention also allows the efficient utilization of the added attributes.

What is claimed is:

1. An information processing apparatus for displaying characters of dimension of a 3D object with a first frame and a second frame comprising:
   Plane setting means for setting a plane intersecting a 3D space, wherein the plane is indicated by the first frame surrounding the 3D object, and characters of dimensions of the 3D object are placed on the plane, wherein the characters of dimensions of the 3D object are associated with the first frame;
   Frame setting means for setting the second frame on the set plane so as to indicate the existence of the characters of the dimensions of a small part of the 3D object, wherein characters of the dimensions of a small part of the 3D object associated with the second frame are smaller than the characters associated with the first frame; and
   Display means for displaying the 3D object with the set plane, the first frame, the set second frame, and the characters of the dimension of a small part on the set plane in the same 3D space.

2. An information processing method of an information processing apparatus for displaying characters of a dimensions of a 3D object with a first frame and a second frame com, comprising steps of:
   Setting a plane intersecting a 3D space, wherein the plane is indicated by the first frame surrounding the 3D object, and characters of dimensions of the 3D object are placed on the plane, wherein the characters of dimensions of the 3D object are associated with the first frame;
   Setting the second frame on the set plane so as to indicate the existence of the characters of the dimensions of a small part of the 3D object, wherein characters of the dimensions of a small part associated with the second frame are smaller than the characters associated with the first frame; and
   Displaying the 3D object with the set plane, the first frame, the set second frame, and the characters of the dimension of a small part on the set plane in the same 3D space.

3. A computer executable program product with a computer program tangibly embodied on a computer readable storage device, comprising:
   Plane setting means for setting a plane that intersects a 3D space, wherein the plane is indicated by the first frame surrounding the 3D object, and characters of dimensions of the 3D object are placed on the plane, wherein the characters of dimensions of the 3D object are associated with the first frame;
   Frame setting means for setting the second frame on the set plane so as to indicate the existence of the characters of the dimensions of a small part of the 3D object, wherein characters of the dimensions of a small part of the 3D object associated with the second frame are smaller than the characters associated with the first frame; and
   Display means for displaying the 3D object with the set plane, the first frame, the set second frame, and the characters of the dimension of a small part on the set plane in the same 3D space.

* * * * *

UNITED STATES PATENT AND TRADEMARK OFFICE
CERTIFICATE OF CORRECTION

| | | |
|---|---|---|
| PATENT NO. | : 7,119,805 B2 | Page 1 of 1 |
| APPLICATION NO. | : 10/077315 | |
| DATED | : October 10, 2006 | |
| INVENTOR(S) | : Batori et al. | |

It is certified that error appears in the above-identified patent and that said Letters Patent is hereby corrected as shown below:

In column 14, Lines 19-23:

Change: "model 1.) As described previously, it is possible to set and display a name label indicating a name of an attribute arrangement plane, for a frame of each attribute arrangement plane. An example of a setting, changing, and displaying method of the name label will be described below."

To: --model 1.)

As described previously, it is possible to set and display a name label indicating a name of an attribute arrangement plane, for a frame of each attribute arrangement plane. An example of a setting, changing, and displaying method of the name label will be described below.--

Signed and Sealed this

Twentieth Day of March, 2007

JON W. DUDAS
*Director of the United States Patent and Trademark Office*